(12) United States Patent
Handa

(10) Patent No.: US 9,031,805 B2
(45) Date of Patent: May 12, 2015

(54) GEOMAGNETIC FIELD MEASUREMENT DEVICE, OFFSET DETERMINATION METHOD, AND COMPUTER READABLE RECORDING MEDIUM THEREFOR

(75) Inventor: Ibuki Handa, Hamamatsu (JP)

(73) Assignee: Yamaha Corporation, Hamamatsu-Shi, Shizuoka-Ken (JP)

(*) Notice: Subject to any disclaimer, the term of this patent is extended or adjusted under 35 U.S.C. 154(b) by 529 days.

(21) Appl. No.: 13/422,152

(22) Filed: Mar. 16, 2012

(65) Prior Publication Data

US 2012/0245877 A1    Sep. 27, 2012

(30) Foreign Application Priority Data

Mar. 22, 2011 (JP) ................................ 2011-062689
Jun. 15, 2011 (JP) ................................ 2011-133265

(51) Int. Cl.
| | | |
|---|---|---|
| G01C 17/38 | (2006.01) | |
| G01R 33/02 | (2006.01) | |
| G01R 33/022 | (2006.01) | |
| G01R 33/028 | (2006.01) | |

(52) U.S. Cl.
CPC ............ *G01C 17/38* (2013.01); *G01R 33/0206* (2013.01); *G01R 33/022* (2013.01); *G01R 33/028* (2013.01)

(58) Field of Classification Search
CPC ........................................................ G01C 17/38
USPC .......................................................... 702/95
See application file for complete search history.

(56) References Cited

U.S. PATENT DOCUMENTS

| | | | |
|---|---|---|---|
| 7,275,008 B2 | 9/2007 | Plyvanainen | |
| 7,418,359 B2 | 8/2008 | Handa | |
| 7,451,549 B1* | 11/2008 | Sodhi et al. | ...................... 33/356 |
| 7,555,398 B2* | 6/2009 | Fowler | ........................... 702/104 |
| 2006/0031014 A1 | 2/2006 | Sato et al. | |
| 2007/0213950 A1 | 9/2007 | Handa | |

(Continued)

FOREIGN PATENT DOCUMENTS

| | | |
|---|---|---|
| CN | 101038329 A | 9/2007 |
| CN | 101292131 A | 10/2008 |

(Continued)

OTHER PUBLICATIONS

Extended European Search Report issued for EP 12 00 2040 dated Feb. 24, 2014.

(Continued)

*Primary Examiner* — Bryan Bui
(74) *Attorney, Agent, or Firm* — Dickstein Shapiro LLP

(57) ABSTRACT

A geomagnetic field measurement device has a three-dimensional magnetic sensor and a storage device that stores plural pieces of magnetic data sequentially output from the three-dimensional magnetic sensor. The geomagnetic field measurement device calculates, based on the pieces of magnetic data, a distortion estimation value indicating a degree of difference in shape between a three-dimensional figure defined so that the plural sets of coordinates indicated respectively by the plural pieces of magnetic data are distributed adjacent to a surface thereof and a spherical surface, and determines whether there is distortion in the shape of the three-dimensional figure based on the distortion estimation value, to update an offset for correcting each of the plural pieces of the magnetic data in a case in which it is determined that there is no distortion.

26 Claims, 17 Drawing Sheets

(56) References Cited

U.S. PATENT DOCUMENTS

2007/0276625 A1 11/2007 Hikida et al.
2008/0071492 A1 3/2008 Skvortsov et al.
2010/0324862 A1 12/2010 Sato et al.
2012/0072114 A1 3/2012 Sato et al.

FOREIGN PATENT DOCUMENTS

| | | |
|---|---|---|
| CN | 101738181 A | 6/2010 |
| CN | 101023323 B | 12/2010 |
| EP | 1832889 A2 | 9/2007 |
| EP | 1 903 305 A2 | 3/2008 |
| JP | 2007-107921 A | 4/2007 |
| JP | 2007-240270 A | 9/2007 |
| WO | WO-2007/026238 A1 | 3/2007 |
| WO | WO-2010/141177 A1 | 12/2010 |

OTHER PUBLICATIONS

Chinese Office Action and Search Report issued for corresponding Chinese Application No. 201210077860.6, issue date Mar. 3, 2014 (English translation attached).
Chinese Second Office Action of Nov. 15, 2014 and Search Report issued for corresponding Chinese Application No. 201210077860.6. (English Translation attached).

\* cited by examiner

FIG. 16

|  | 1. ERROR $\delta x$ | 2. DISTORTION ESTIMATION VALUE $g_D(E)$ | 3. ESTIMATION VALUE $f_0$ |
|---|---|---|---|
| CASE A | 0.00 % | $4.36 \times 10^{-14}$ | $7.25 \times 10^{-14}$ |
| CASE B | 2.79 % | $6.07 \times 10^{-2}$ | $3.14 \times 10^{-3}$ |
| CASE C | 7.78 % | $2.42 \times 10^{-1}$ | $3.01 \times 10^{-3}$ |

GEOMAGNETIC FIELD MEASUREMENT DEVICE, OFFSET DETERMINATION METHOD, AND COMPUTER READABLE RECORDING MEDIUM THEREFOR

BACKGROUND OF THE INVENTION

1. Technical Field of the Invention

The present invention relates to a geomagnetic field measurement device, an offset determination method therefor, and a computer-readable recording medium having recorded thereon a computer program for executing the method.

2. Description of Related Art

A three-dimensional magnetic sensor mounted in a portable device such as a mobile phone or a moving body such as an automobile has been recently developed for measuring a geomagnetic field. In general, a three-dimensional magnetic sensor has three magnetic sensor modules for decomposing a vector of a magnetic field into components in three directions to measure scalar quantities thereof, and outputs three-dimensional vector data having, as three components, scalar quantities output respectively by the three magnetic sensor modules.

A device such as a mobile phone in which a three-dimensional magnetic sensor is mounted often contains parts such as various magnetic metals and electric circuits, which generate magnetic fields. In this case, vector data output by the three-dimensional magnetic sensor will be a value that includes a vector representing a magnetic field such as an internal magnetic field, i.e., a magnetic field generated by parts mounted in the device in addition to a vector representing a geomagnetic field. Therefore, to accurately obtain the value of a geomagnetic field, a correction process is required to remove the vector representing the internal magnetic field from the vector data output from the three-dimensional magnetic sensor.

In the correction process, a value of disturbance to be removed from data output from a three-dimensional magnetic sensor is called an offset, and this offset is used to obtain an accurate value of a geomagnetic field to be measured.

The internal magnetic field is a magnetic field that has a nearly constant direction relative to a device and has a nearly constant magnitude. Such an internal magnetic field, when viewed from a three-dimensional magnetic sensor mounted in a device, is expressed as a vector having a nearly constant direction and a nearly constant magnitude no matter how the orientation of the device is changed.

On the other hand, the geomagnetic field is a magnetic field that has a horizontal component pointing to the magnetic north pole and a vertical component in a magnetic dip (elevation angle) direction, and is a uniform magnetic field that has a nearly constant direction relative to the ground and a nearly constant magnitude. Therefore, in a case in which the orientation of a device is changed relative to the ground, the direction of a geomagnetic field viewed from the device also changes. That is, when viewed from a three-dimensional magnetic sensor mounted in a device, a geomagnetic field is expressed as a vector that changes direction along with changes in the orientation of the device but that has a nearly constant magnitude.

Using such properties of a geomagnetic field and an internal magnetic field, it is possible to divide output data from a three-dimensional magnetic sensor into a component representing the internal magnetic field that has nearly constant direction and magnitude when viewed from the magnetic sensor and a component representing the geomagnetic field of which the magnitude is nearly constant but of which the direction changes along with changes in the orientation of the three-dimensional magnetic sensor. Then, an accurate value of the geomagnetic field can be obtained by removing from the output data a vector as an offset having a component representing this internal magnetic field.

Japanese Patent Application Laid-Open Publication 2007-240270 describes a method of calculating an accurate offset by using plural pieces of magnetic data output from a three-dimensional magnetic sensor.

In a case in which there is an object such as a speaker or a personal computer that generates a magnetic field near a device such as a mobile phone in which a three-dimensional magnetic sensor is mounted, the three-dimensional magnetic sensor measures not only the above-described geomagnetic field and internal magnetic field, but also an external magnetic field generated by the object outside the device. Generally, an external magnetic field is a non-uniform magnetic field that changes its direction and magnitude depending on a relative positional relationship between an object, outside a device, that generates the external magnetic field, and a three-dimensional magnetic sensor mounted in the device, etc.

However, conventionally, it was not possible to determine whether such a non-uniform external magnetic field exists or what degree of effect is caused by the existence of such a non-uniform external magnetic field. Therefore, in the conventional method, there was a disadvantage that, even if a vector of an internal magnetic field calculated in an environment in which a non-uniform external magnetic field exists has a large error, a value of the vector is determined as a correct value that is calculated in an environment with no external magnetic field, resulting in the value of the vector including the large error sometimes being employed as an offset.

Similarly, there was a disadvantage that an offset sometimes includes a large error in a case in which a two-dimensional magnetic sensor outputs two-dimensional vector data having, as the two components, scalar quantities output by each of two magnetic sensor modules provided therein, which two magnetic sensor modules decompose a vector of a magnetic field into two components of two mutually orthogonal directions to measure scalar quantities.

SUMMARY OF THE INVENTION

Considering the situations described above, an object of the present invention is to determine whether the calculated offset value is an accurate value in which an error is not included by estimating the degree of effects from an external magnetic field, and to determine whether to employ the value of the calculated offset.

In a first aspect, the present invention provides a geomagnetic field measurement device having: a three-dimensional magnetic sensor that measures respective magnetic components of three directions; a storage device that stores, as pieces of vector data expressed in a three-axis coordinate system, plural pieces of magnetic data sequentially output from the three-dimensional magnetic sensor; a distortion determination section that calculates, based on the plural pieces of magnetic data stored in the storage device, a distortion estimation value indicating a degree of difference in shape between a three-dimensional figure and a first spherical surface, and that determines whether there is distortion in a shape of the three-dimensional figure based on the distortion estimation value, the three-dimensional figure being defined so that plural sets of coordinates indicated by the plural pieces of magnetic data are distributed adjacent to a surface of the three-dimensional figure; and an offset update section that updates an offset for correcting each of the plural pieces of magnetic data in a case in which it is determined by the distortion determination section that there is no distortion.

A three-dimensional magnetic sensor sometimes measures not only a geomagnetic field to be measured, but also a magnetic field (internal magnetic field) that has a nearly constant direction relative to the three-dimensional magnetic sensor and has a nearly constant magnitude. For example, in a case in which a three-dimensional magnetic sensor is built in a device containing parts that generate a magnetic field, the magnetic field generated by the parts corresponds to an internal magnetic field.

A geomagnetic field is a magnetic field having a horizontal component pointing to the magnetic north pole and a vertical component in a magnetic dip (elevation angle) direction. Therefore, in a case in which the orientation of a three-dimensional magnetic sensor changes, the three-dimensional magnetic sensor measures a geomagnetic field as a magnetic field for which a magnitude is almost unchanging but for which only a direction changes.

In a case in which a three-dimensional magnetic sensor measures a geomagnetic field and an internal magnetic field, plural sets of coordinates indicated by plural pieces of magnetic data output from the three-dimensional magnetic sensor are distributed adjacent to a spherical surface (a spherical surface representing a geomagnetic field) having, as the center point, a set of coordinates representing the direction and the magnitude of an internal magnetic field and also having the magnitude of a geomagnetic field as a radius.

Therefore, to calculate the direction of an accurate geomagnetic field, it is necessary to perform a correction of subtracting an offset from a set of coordinates indicated by a piece of magnetic data output from the three-dimensional magnetic sensor by employing, as an offset, a vector indicating a center point (coordinates of the center point) of a spherical surface representing a geomagnetic field.

In a case in which an object that generates a magnetic field is close to a three-dimensional magnetic sensor, the three-dimensional magnetic sensor sometimes measures a magnetic field (external magnetic field) generated by the object. In a case in which an external magnetic field is a non-uniform magnetic field for which a direction and a magnitude change depending on a relative positional relationship between the object and the three-dimensional magnetic sensor, plural sets of coordinates indicated by plural pieces of magnetic data output by the three-dimensional magnetic sensor are not distributed adjacent to a spherical surface but are distributed adjacent to a surface of a three-dimensional figure having a distorted shape different from the spherical surface. Because sets of coordinates indicated by such plural pieces of magnetic data are not distributed adjacent to a spherical surface representing a geomagnetic field, it is not possible to calculate a center point (offset) of a spherical surface representing a geomagnetic field based on these pieces of magnetic data.

According to the present invention, the distortion estimation value is calculated. This distortion estimation value indicates a degree of difference in shape between the three-dimensional figure defined so as to have the plural sets of coordinates of the plural pieces of magnetic data, output by the three-dimensional magnetic sensor, adjacent thereto and the first spherical surface.

In a case in which it is determined that there is no distortion by the distortion determination section, and in which the shape of the three-dimensional figure can be considered to be the same as the first spherical surface, a center point of a spherical surface having the plural sets of coordinates indicated by the plural pieces of magnetic data adjacent thereto can be considered as having the same coordinates as a center point of a spherical surface representing a geomagnetic field. Therefore, the coordinates of this center point (or a vector indicating the center point) of the spherical surface representing the geomagnetic field can be employed as an offset.

On the other hand, in a case in which it is determined that there is distortion by the distortion determination section and in which the three-dimensional figure has a distorted shape different from the first spherical surface, the shape of distribution of the plural sets of coordinates indicated by the plural pieces of magnetic data distributed adjacent to a surface of the three-dimensional figure will be a distorted shape different from a spherical surface. In this case, coordinates of a center point of a spherical surface calculated assuming that the spherical surface has the plural sets of coordinates indicated by the plural pieces of magnetic data adjacent thereto cannot be employed as an offset. This is because a center point of a spherical surface defined assuming that the spherical surface has the plural sets of coordinates indicated by the plural pieces of magnetic data adjacent thereto will have, in principle, different coordinates from a center point of a spherical surface representing a geomagnetic field. Therefore, in a case in which it is determined by the distortion determination section that there is distortion, employing, as an offset, the coordinates of the center point of the spherical surface calculated assuming that the spherical surface has the plural sets of coordinates indicated by the plural pieces of magnetic data adjacent thereto needs to be avoided.

In the present invention, it is determined, based on the distortion estimation value, whether the shape of the three-dimensional figure has a distortion, thereby determining whether it is possible to calculate, based on the plural pieces of magnetic data, coordinates of a center point that can be considered as a center point of a spherical surface representing a geomagnetic field. An offset is updated only in a case in which the shape of the three-dimensional figure does not have a distortion, and in which coordinates of a center point of the spherical surface representing the geomagnetic field can be calculated. As a result, an accurate offset can be calculated, and then an accurate geomagnetic field can be calculated.

The present invention additionally provides an offset determination method for use in the geomagnetic filed measurement device according to the first aspect of the present invention and also provides a computer-readable recording medium having stored thereon a computer program, and when the program is loaded into a computer, causing a computer to execute processes corresponding to the steps of the offset determination method. A computer readable recording medium can be any tangible medium, or non-transitory medium, on which a program is recorded such as magnetic tape and CD-ROM or may be a signal (analog or digital, electromagnetic or optical) in which the program is embodied for transmission via a data carrier. According to the offset determination method and the computer-readable recording medium having recorded thereon a computer program for executing the method, the same effects as those described above for the geomagnetic field measurement device are attainable.

In a preferred embodiment of the first aspect of the present invention, the geomagnetic field measurement device of the first aspect may further include: a center point calculation section that calculates, based on the plural pieces of magnetic data, coordinates of a center point of a second spherical surface defined assuming that the plural sets of coordinates indicated by the plural pieces of magnetic data are distributed adjacent to the second spherical surface.

In the present invention, the center point calculation section calculates the coordinates of the center point of the second spherical surface based on the plural pieces of magnetic data, the second spherical surface being defined assuming that the plural sets of coordinates indicated by the plural pieces of magnetic data are distributed adjacent thereto. For example, the center point calculation section may define the second spherical surface so that errors (i.e., distances) between the plural sets of coordinates indicated by the plural pieces of magnetic data and the second spherical surface will be the minimum overall.

In a case in which it is determined that there is no distortion by the distortion determination section, and in which the shape of the distribution of the plural sets of coordinates indicated by the plural pieces of magnetic data can be considered as a spherical surface, coordinates of a center point of the spherical surface having these plural sets of coordinates adjacent thereto can be employed as an offset, as described above.

In this case, because the plural sets of coordinates indicated by the plural pieces of magnetic data can be considered as being distributed also adjacent to the second spherical surface, coordinates of a center point of the second spherical surface can be employed as an offset.

Thus, because the geomagnetic field measurement device according to the first aspect of the present invention calculates coordinates of a center point that is a candidate for an offset and determines whether there is distortion, then to decide whether to employ a vector indicating the center point as an offset, a direction of a geomagnetic field can be accurately calculated.

Preferably, the offset update section may update the offset from an old offset to a set of coordinates indicating the center point of the second spherical surface in a case in which it is determined by the distortion determination section that there is no distortion.

In a case in which it is determined that there is distortion by the distortion determination section and in which the shape of a distribution of the plural sets of coordinates indicated by the plural pieces of magnetic data has a distorted shape different from a spherical surface, the plural sets of coordinates indicated by the plural pieces of magnetic data cannot be considered to be distributed adjacent to the second spherical surface. In this case, it is highly likely that the center point of the second spherical surface greatly differs from the center point of a spherical surface representing a geomagnetic field, and therefore, it is not possible to employ as an offset the coordinates of the center point of the second spherical surface.

In the present invention, it is determined by the distortion determination section whether the shape of the three-dimensional figure having the plural sets of coordinates indicated by the plural pieces of magnetic data adjacent thereto has distortion, and an offset is updated in which it is determined that there is no distortion. Therefore, only in a case in which the coordinates of the center point of the second spherical surface can be considered as an offset will the coordinates of the center point be employed as an offset. Thus, the geomagnetic field measurement device according to the present invention enables the calculation of a direction of an accurate geomagnetic field.

In another preferred embodiment of the first aspect of the present invention, the three-dimensional magnetic sensor may be built in a device containing parts that generate a magnetic field, and the offset may be a set of coordinates indicated by three-dimensional vector data representing a component of the magnetic field generated by the parts, the three-dimensional vector data being included in each of the plural pieces of magnetic data.

In a case in which the three-dimensional magnetic sensor is built in a device containing parts that generate a magnetic field, the three-dimensional magnetic sensor sometimes measures an internal magnetic field generated by the parts. In this case, the three-dimensional magnetic sensor measures a magnetic field for which an internal magnetic field and a geomagnetic field are summed.

The geomagnetic field measurement device according to the present invention calculates coordinates indicating an internal magnetic field as an offset and performs a correction using this offset. Therefore, the direction of an accurate geomagnetic field can be calculated.

Preferably, the geomagnetic field measurement device may additionally include a section that prompts a user to change an orientation of the device without changing a position of the device in a case in which it is determined by the distortion determination section that there is distortion.

As described above, in a case in which the three-dimensional magnetic sensor measures a non-uniform external magnetic field generated by an object outside the device, the plural sets of coordinates indicated by the plural pieces of magnetic data output from the three-dimensional magnetic sensor will be distributed adjacent to a surface of a three-dimensional figure having a distorted shape differing from a spherical surface. In this case, a vector indicating the center point of the second spherical surface calculated by the center point calculation section cannot be employed as an offset.

However, a non-uniform external magnetic field is simply a magnetic field with a nearly constant magnitude in a case in which a relative positional relationship does not change between a device in which a three-dimensional magnetic sensor is provided and an external object that generates an external magnetic field. In other words, when changing only the orientation of the three-dimensional magnetic sensor without changing the position thereof, an external magnetic field will be measured by the three-dimensional magnetic sensor as a magnetic field for which the magnitude is nearly constant and only the direction changes. In this case, plural sets of coordinates indicated by plural pieces of magnetic data output from the three-dimensional magnetic sensor will be distributed adjacent to a spherical surface. Accordingly, coordinates or a vector indicating a center point of the spherical surface can be considered to be the same as coordinates or a vector indicating an internal magnetic field of the parts contained in the device.

On the other hand, a second spherical surface is defined assuming that plural sets of coordinates indicated by plural pieces of magnetic data are distributed adjacent to the second spherical surface. Therefore, in a case in which a shape of the distribution of plural sets of coordinates indicated by plural pieces of magnetic data can be considered as a spherical surface, the plural sets of coordinates indicated by the plural pieces of magnetic data are distributed adjacent to the second spherical surface. Accordingly, coordinates of a center point of the second spherical surface can be considered to be the same as the coordinates of an internal magnetic field, and therefore, coordinates or a vector indicating the center point of the second spherical surface can be employed as an offset.

Thus, because the geomagnetic field measurement device according to the present invention is provided with a section that prompts a user to change the orientation of a device without changing the position thereof, an appropriate offset can be calculated even when measuring magnetic data in a place in which a non-uniform external magnetic field exists.

In a second aspect, the present invention provides a geomagnetic field measurement device having: a three-dimensional magnetic sensor that measures respective magnetic components of three directions; a storage device that stores, as pieces of vector data expressed in a three-axis coordinate system, plural pieces of magnetic data sequentially output from the three-dimensional magnetic sensor; a distortion determination section that calculates, based on the plural pieces of magnetic data stored in the storage device, a distortion estimation value indicating a degree of difference in a shape between a three-dimensional figure and a first spherical surface, and that determines whether there is distortion in a shape of the three-dimensional figure based on the distortion estimation value, the three-dimensional figure being defined so that plural sets of coordinates indicated by the plural pieces of magnetic data are distributed adjacent to a surface of the three-dimensional figure; and an offset update section that updates an offset for correcting each of the plural pieces of magnetic data in a case in which it is determined by the distortion determination section that there is no distortion, and the distortion determination section calculates the distortion estimation value using a three-dimensional error, the three-dimensional error corresponding to a vector having, as elements, errors between the plural sets of coordinates indicated by the plural pieces of magnetic data and the surface of the three-dimensional figure.

According to the second aspect of the present invention, the effects as the first aspect can be attained. Furthermore, the three-dimensional error shows errors between coordinates of the surface of a three-dimensional figure and the plural sets of coordinates of the plural pieces of magnetic data. Therefore, information on the three-dimensional error includes information indicating the shape of the three-dimensional figure. Therefore, by calculating the distortion estimation value by using the three-dimensional error including the information on the shape of the three-dimensional figure, it is possible to accurately express the degree of difference in shape between the three-dimensional figure and the spherical surface.

Preferably, the three-dimensional error may be a sum of a component representing distortion and a first spherical surface error; the three-dimensional error, the component representing distortion, and the first spherical surface error each may be a vector consisting of elements corresponding respectively to the plural pieces of magnetic data; each element of the component representing distortion may be a value obtained by substituting each element of a first vector into a function expressed with a three variable quadratic form, with the function having a distortion estimation matrix as a coefficient matrix, and the first vector corresponding to a three-dimensional vector having a set of coordinates indicated by a reference point as a starting point and a set of coordinates indicated by a piece of magnetic data corresponding to each element as an end point; and each element of the first spherical surface error may be a value representing an error between a set of coordinates indicated by each of the plural pieces of magnetic data and the first spherical surface.

The three-dimensional error is given by the sum of the component representing distortion and the first spherical surface error.

In a case in which the shape of the three-dimensional figure is defined so as to have the plural sets of coordinates indicated by the plural pieces of magnetic data adjacent thereto, the three-dimensional error is minimized. In this case, the component representing distortion and the first spherical surface error are also minimized.

Each element of the first spherical surface error simply represents an error between each set of coordinates indicated respectively by the plural pieces of magnetic data and the first spherical surface. Therefore, when the first spherical surface error is minimized, each element of the first spherical surface error is minimized overall. Accordingly, the first spherical surface error expresses plural errors, overall, between the plural sets of coordinates indicated by the plural pieces of magnetic data and the first spherical surface as white noise that is symmetrical and has no direction dependency.

The component representing distortion has, as each element, a value obtained by subtracting an error between each set of coordinates indicated respectively by the plural pieces of magnetic data and the first spherical surface from an error between each set of coordinates indicated respectively by the plural pieces of magnetic data and the surface of the three-dimensional figure. Each element of the component representing distortion is expressed using an identical function in a quadratic form. Therefore, even if the component representing distortion is minimized, each element of the component representing distortion will be a value expressed by the function in a quadratic form. Therefore, the plural elements of the component representing distortion represent, as a whole, a curved surface (distortion) defined based on the quadratic function.

Thus, according to the present invention, errors between the plural sets of coordinates indicated by the plural pieces of magnetic data and the surface of the three-dimensional figure is expressed as the sum of the first spherical surface error and the component representing distortion. Therefore, the plural errors between the plural sets of coordinates indicated by the plural pieces of magnetic data and the surface of the three-dimensional figure are divided into plural errors of white noise and plural errors representing distortion.

Furthermore, each element of the component representing distortion is a value obtained by subtracting an error between a set of coordinates indicated by each of the plural pieces of magnetic data and the first spherical surface from an error between a set of coordinates indicated by each of the plural pieces of magnetic data and the surface of the three-dimensional figure. Therefore, the curved surface (distortion) expressed by the component representing distortion represents the difference in shape between the three-dimensional figure and the first spherical surface.

Accordingly, in a case in which the distortion estimation value is determined based on the three-dimensional error (specifically, the component representing distortion of the three-dimensional error), the distortion estimation value will be a value expressing the degree of difference between the shape of the three-dimensional figure and the shape of the first spherical surface (i.e., whether the three-dimensional figure is distorted).

Thus, in the geomagnetic field measurement device according to the present invention, plural errors between the plural sets of coordinates indicated respectively by the plural pieces of magnetic data and the surface of the three-dimensional figure are divided into white noise and distortion, thereby determining whether there is distortion resulting from an external magnetic field, and ultimately preventing employing an inaccurate value as an offset.

In the second aspect of the present invention, the distortion estimation value may be an absolute value of a maximum eigenvalue of the distortion estimation matrix when an objective function expressed based on the three-dimensional error is minimized.

According to the present invention, an absolute value of a maximum eigenvalue of a distortion estimation matrix in minimizing an objective function expressed based on the three-dimensional error is used as the distortion estimation value.

The objective function is expressed based on the three-dimensional error. The three-dimensional error is an error between the plural sets of coordinates indicated by the plural pieces of magnetic data and the surface of the three-dimensional figure. Therefore, in a case in which the objective function is minimized and in which the three-dimensional error (the norm of a three-dimensional error) is a small value, the error between the plural sets of coordinates indicated by the plural pieces of magnetic data and the surface of the three-dimensional figure is small. In this case, the shape of the three-dimensional figure is determined based on the plural pieces of magnetic data so as to have a shape that as accurately as possible represents a distribution shape of the plural sets of coordinates indicated by the plural pieces of magnetic data.

As described above, the three-dimensional error includes the component representing distortion. The component representing distortion represents the difference in shape between the three-dimensional figure and the first spherical surface. Therefore, in minimizing the objective function, the component representing distortion is defined so as to represent the difference in shape between the three-dimensional figure and the first spherical surface as accurately as possible. For example, from among plural elements of the component representing distortion, the magnitude of an element is determined to have a large value in a case in which an error between a set of coordinates indicated by a piece of magnetic data corresponding to this element and the first spherical surface is large, and conversely, to have a small value in a case in which the error between a set of coordinates indicated by a piece of magnetic data corresponding to this element and the first spherical surface is small.

Each element of the component representing distortion is expressed in a three variable quadratic function having a distortion estimation matrix as a coefficient matrix. Therefore, in minimizing the objective function, each component of the distortion estimation matrix is determined so that the component representing distortion represents the difference in shape between the three-dimensional figure and the first spherical surface as accurately as possible.

Each element of the component representing distortion is given as an inner product of a vector representing coordinates of a piece of magnetic data when viewed from a reference point and a vector obtained by converting the vector representing coordinates of a piece of magnetic data with the distortion estimation matrix.

The distortion estimation matrix, which is a coefficient matrix of a three-variable quadratic function, is a 3-by-3 symmetric matrix, and has three eigenvalues and three mutually orthogonal eigenvectors.

Therefore, among plural elements composing the component representing distortion, the magnitude of an element will have a large value in a case in which a vector representing a set of coordinates indicated by a piece of magnetic data corresponding to this element from the reference point as a starting point is parallel to an eigenvector corresponding to an eigenvalue for which the magnitude of an absolute value is the greatest out of the three eigenvalues of the distortion estimation matrix. Therefore, each component of the distortion estimation matrix is determined so that the direction of an eigenvector corresponding to an eigenvalue for which an absolute value becomes the greatest out of the three eigenvalues of the distortion estimation matrix and the direction of a vector, from the reference point, pointing to an area in which a large number of pieces of magnetic data indicating distant positions from the first spherical surface will become closer to each other.

Then, from among the three eigenvalues of the distortion estimation matrix, an eigenvalue for which the magnitude of the absolute value is the greatest is determined so as to represent, as accurately as possible, an error between a set of coordinates of a piece of magnetic data in an area which is pointed by an eigenvector corresponding to the eigenvalue and the first spherical surface.

In the present invention, the distortion estimation value indicating the degree of difference in shape between the three-dimensional figure and the first spherical surface is determined based on a value of an eigenvalue for which an absolute value is the greatest out of the three eigenvalues of the distortion estimation matrix. Therefore, according to the geomagnetic field measurement device of the present invention, it is possible to estimate, based on the distortion estimation value, the degree of difference in shape between the three-dimensional figure and the first spherical surface. Thus, the geomagnetic field measurement device according to the present invention determines whether there is distortion resulting from an external magnetic field, thereby preventing the employing of an inaccurate value as an offset.

In a preferred embodiment of the second aspect of the present invention, the geomagnetic field measurement device may additionally include a center point calculation section that calculates, based on the plural pieces of magnetic data, coordinates of a center point of a second spherical surface defined assuming that the plural sets of coordinates indicated by the plural pieces of magnetic data are distributed adjacent to the second spherical surface.

In the present invention, the center point calculation section calculates coordinates of the center point of the second spherical surface based on the plural pieces of magnetic data, the second spherical surface being defined assuming that the plural sets of coordinates indicated by the plural pieces of magnetic data are distributed adjacent thereto. For example, the center point calculation section may define the second spherical surface so that errors (i.e., distances) between the plural sets of coordinates indicated by the plural pieces of magnetic data and the second spherical surface will be the minimum overall.

As described above, in a case in which it is determined that there is no distortion by the distortion determination section and in which the shape of the distribution of the plural sets of coordinates indicated by the plural pieces of magnetic data can be considered as a spherical surface, the plural sets of coordinates indicated by the plural pieces of magnetic data can also be considered as being distributed adjacent to the second spherical surface, and a set of coordinates of the center point of the second spherical surface can be employed as an offset.

Thus, according to the geomagnetic field measurement device according to the present invention, a direction of an accurate geomagnetic field can be calculated.

Preferably, the center point calculation section may calculate the center point of the second spherical surface so as to minimize a second spherical surface error, the second spherical surface error corresponding to a vector having, as elements, errors between the plural sets of coordinates indicated by the plural pieces of magnetic data and the second spherical surface.

When the second spherical surface error is minimized, the second spherical surface is determined so as to represent, as accurately as possible, the shape of the distribution of the plural sets of coordinates indicated by the plural pieces of magnetic data. Therefore, in a case in which there is no distortion resulting from an external magnetic field and in which the shape of the distribution can be considered as a spherical surface, the second spherical surface is determined so as to have the plural sets of coordinates adjacent thereto. In this case, a center point of the second spherical surface and a center point of a spherical surface representing a geomagnetic field can be considered as having identical coordinates.

Therefore, according to the geomagnetic field measurement device of the present invention, in a case in which there is no distortion resulting from an external magnetic field, the coordinates of the center point of the second spherical surface is employed as an offset, thereby calculating a direction of an accurate geomagnetic field.

In the second aspect of the present invention, the distortion determination section may employ, as the reference point, the center point of the second spherical surface.

According to the present invention, the center point of the second spherical surface is employed as the reference point. Thus, an eigenvalue (maxiumum eigenvalue) for which an absolute value is the greatest out of the three eigenvalues of the distortion estimation matrix will accurately represent an error between coordinates of a piece of magnetic data that is in an area indicated by an eigenvector corresponding to the maximum eigenvalue and the first spherical surface, and therefore, the degree of difference in shape between the three-dimensional figure and the first spherical surface can be accurately represented.

The geomagnetic field measurement device according to a second aspect of the present invention may additionally include a distribution indicator calculation section that calculates a distribution indicator indicating a degree of a three-dimensional extent of a distribution of the plural sets of coordinates indicated by the plural pieces of magnetic data stored in the storage device.

In a case in which plural sets of coordinates indicated by plural pieces of magnetic data have no three-dimensional extent and are distributed two-dimensionally (or one-dimensionally), it is not possible to identify the coordinates of the center point of the second spherical surface.

The geomagnetic field measurement device according to the present invention calculates a distribution indicator indicating a degree of a three-dimensional extent for the distribution of the plural sets of coordinates indicated by the plural pieces of magnetic data. Therefore, in a case in which the distribution of the plural sets of coordinates indicated by the plural pieces of magnetic data is two-dimensional, it is possible to prevent calculating the center point of the second spherical surface, ultimately preventing employing an inaccurate value as an offset.

Preferably, the center point calculation section may calculate the center point of the second spherical surface in a case in which the distribution indicator is equal to or greater than a predetermined magnitude.

The geomagnetic field measurement device according to the present invention calculates the center point of the second spherical surface in a case in which the distribution indicator indicating the degree of a three-dimensional extent for the distribution of the plural sets of coordinates indicated by the plural pieces of magnetic data is greater than a predetermined magnitude. Therefore, in a case in which the distribution of the plural sets of coordinates indicated by the plural pieces of magnetic data is two-dimensional, it is possible to prevent calculating the center point of the second spherical surface, to employ only an accurate value as an offset.

In the second aspect of the present invention, the objective function may represent a magnitude of the three-dimensional error, and may have, as variables, each component of the distortion estimation matrix and each component of coordinates indicated by a center point of the first spherical surface.

According to the present invention, the objective function is minimized, thereby minimizing the three-dimensional error. In this case, the shape of the three-dimensional figure is determined so as to accurately represent the distribution shape of the plural sets of coordinates indicated by the plural pieces of magnetic data. Accordingly, the geomagnetic field measurement device according to the present invention can accurately determine whether there is distortion caused by an external magnetic field, and it is therefore possible to prevent employing an inaccurate value as an offset.

Additionally, in the second aspect of the present invention, the distribution indicator may be a minimum eigenvalue of a covariance matrix representing a variance of the plural pieces of magnetic data.

Because a piece of magnetic data indicates three-axis coordinates, a covariance matrix representing a variance of plural pieces of magnetic data is a 3-by-3 matrix. Three eigenvectors and three eigenvalues are derived from this covariance matrix. One of the three eigenvectors represents a direction in which plural pieces of magnetic data are distributed to the greatest extent. An eigenvalue corresponding to this eigenvector is the maximum eigenvalue. Conversely, an eigenvalue corresponding to an eigenvector in a direction in which plural pieces of magnetic data are distributed to the smallest extent is the minimum eigenvalue.

In a case in which plural pieces of magnetic data are distributed two-dimensionally in an ideal manner, the minimum eigenvalue will be a value close to zero. Conversely, in a case in which plural pieces of magnetic data are distributed three-dimensionally, the minimum eigenvalue will take a large value in accordance with the degree of the three-dimensional extent of the distribution of plural pieces of magnetic data. Therefore, by using the minimum eigenvalue of a covariance matrix as the distribution indicator, it is possible to know the degree of the three-dimensional extent of the distribution of the plural pieces of magnetic data.

Preferably, the covariance matrix may be expressed by the following A; the center point calculation section may calculate, as the center point of the second spherical surface, x that minimizes a value of the following center point calculation function $f_S(x)$, x being a three-dimensional vector having three variables as elements; and when the distortion estimation matrix is E, when a center point of the second spherical surface is $x_0$, and when the objective function is expressed with the following $f_{SD}(E, x)$ having each element of x and each component of E as variables, the distortion determination section may calculate, as the distortion estimation value, an absolute value of the maximum eigenvalue of E when $f_{SD}(E, x)$ is minimized, $$A = X^T X$$

$$f_S(x) = \|X(x - q_C) - j\|_2$$

$$f_{SD}(E, x) = \|X(x - q_C) + k(E) - j\|_2$$

where X is the following N-by-3 matrix, where N is a natural number equal to or greater than 5, $q_C$ is the following three-dimensional vector, where the coordinates indicated by the magnetic data is denoted by the following $q_i$, j is an N-dimensional vector, where R is the following scalar, the distortion estimation matrix E is the following 3-by-3 symmetric matrix, and k(e) is the following N-dimensional vector $$X = \begin{bmatrix} (q_1 - q_C)^T \\ \vdots \\ (q_N - q_C)^T \end{bmatrix} \quad q_C = \frac{1}{N}\sum_{i=1}^{N} q_i$$

$$q_i = [x_i \ y_i \ z_i]^T \quad (i=1,\ldots,N)$$

$$j = \frac{1}{2}\begin{bmatrix} (q_1-q_C)^T(q_1-q_C) - R \\ \vdots \\ (q_N-q_C)^T(q_N-q_C) - R \end{bmatrix}$$

$$R = \frac{1}{N}\sum_{i=1}^{N}(q_i-q_C)^T(q_i-q_C)$$

$$E = \begin{bmatrix} e_{11} & e_{12} & e_{13} \\ e_{12} & e_{22} & e_{23} \\ e_{13} & e_{23} & e_{33} \end{bmatrix} \quad k(E) = \begin{bmatrix} (q_1-x_0)^T E(q_1-x_0) \\ \vdots \\ (q_N-x_0)^T E(q_N-x_0) \end{bmatrix}.$$

According to the present invention, with a simple calculation, it is possible to calculate coordinates of the center point of the second spherical surface, which is a candidate for an offset, and to determine whether to employ this center point as an offset.

In a third aspect, the present invention provides a geomagnetic field measurement device having: a three-dimensional magnetic sensor that measures respective magnetic components of three directions; a storage device that stores, as pieces of vector data expressed in a three-axis coordinate system, plural pieces of magnetic data sequentially output from the three-dimensional magnetic sensor; a distortion determination section that calculates, based on the plural pieces of magnetic data stored in the storage device, a distortion estimation value indicating a degree of difference in shape between a three-dimensional figure and a first spherical surface, and that determines whether there is distortion in a shape of the three-dimensional figure based on the distortion estimation value, the three-dimensional figure being defined so that plural sets of coordinates indicated by the plural pieces of magnetic data are distributed adjacent to a surface of the three-dimensional figure; an offset update section that updates an offset for correcting each of the plural pieces of magnetic data in a case in which it is determined by the distortion determination section that there is no distortion; and a distribution indicator calculation section that calculates a distribution indicator indicating a degree of a three-dimensional extent of a distribution of the plural sets of coordinates indicated by the plural pieces of magnetic data stored in the storage device.

In a case in which plural sets of coordinates indicated by plural pieces of magnetic data have no three-dimensional extent and are distributed two-dimensionally (or one-dimensionally), it is not possible to know the three-dimensional shape of a three-dimensional figure defined so as to have plural sets of coordinates indicated by the plural pieces of magnetic data adjacent thereto.

According to the third aspect of the present invention, the same effects as the first aspect can be attained. Furthermore, the geomagnetic field measurement device according to the third aspect of the present invention calculates the distribution indicator indicating the degree of the three-dimensional extent for the distribution of the plural sets of coordinates indicated by the plural pieces of magnetic data. Therefore, in a case in which the distribution of the plural sets of coordinates indicated by the plural pieces of magnetic data is two-dimensional and in which it is not possible to know the shape of the three-dimensional figure, it is possible to prevent estimating the degree of difference in shape between the three-dimensional figure and the spherical surface.

In a preferred embodiment of the third aspect of the present invention, the distortion determination section may calculate the distortion estimation value based on the plural pieces of magnetic data and the distribution indicator.

As described above, in a case in which there are large effects from a non-uniform external magnetic field, the coordinates of plural pieces of magnetic data are distributed adjacent to a surface of a three-dimensional figure that has a distorted shape different from a spherical surface. By estimating the degree of difference in shape between the three-dimensional figure and the spherical surface, it is possible to prevent employing, as an offset, an inaccurate center point including an error due to the effects from a non-uniform external magnetic field.

However, in a case in which sets of coordinates indicated by plural pieces of magnetic data are distributed on a plane, two-dimensionally, it is not possible to know the three-dimensional shape of the three-dimensional figure. Thus, it is not possible to estimate the degree of difference in shape between the three-dimensional shape of the three-dimensional figure and the shape of the spherical surface.

In this case, it is necessary to determine the magnitude of the effects from an external magnetic field by estimating the degree of difference in shape between a curve representing a plane section for which the three-dimensional figure is cut by a plane and a circumference representing a plane section for which the spherical surface is cut by a plane.

According to the present invention, the distribution indicator indicating the degree of the three-dimensional extent of the distribution of the sets of coordinates indicated by the plural pieces of magnetic data is calculated, and the distortion estimation value indicating the degree of difference in shape between the three-dimensional figure and the first spherical surface is calculated based on the plural pieces of magnetic data and the distribution indicator. Therefore, for both a case in which the sets of coordinates indicated by the plural pieces of magnetic data are distributed three-dimensionally and a case in which the sets of coordinates are distributed two-dimensionally, the degree of difference in shape between the three-dimensional figure and the first spherical surface is estimated, thereby determining the magnitude of the effects from an external magnetic field.

In another preferred embodiment of the third aspect of the present invention, the geomagnetic field measurement device may additionally include a center point calculation section that calculates, based on the plural pieces of magnetic data and the distribution indicator, coordinates of a center point of a second spherical surface defined assuming that the plural sets of coordinates indicated by the plural pieces of magnetic data are distributed adjacent to the second spherical surface.

According to the present invention, the coordinates of the center point of the second spherical surface are calculated based on the plural pieces of magnetic data and the distribution indicator.

To calculate coordinates of a center point of a spherical surface based on plural pieces of magnetic data, it is preferable that sets of coordinates indicated by the plural pieces of magnetic data be distributed three-dimensionally. However, plural sets of coordinates indicated by plural pieces of magnetic data are sometimes distributed two-dimensionally. That is, there are some cases in which plural sets of coordinates indicated by plural pieces of magnetic data are distributed adjacent to a circumference indicating a plane section for which the spherical surface is cut by a plane.

In this case, it is possible calculate, based on the plural pieces of magnetic data, a straight line that passes through the center of the circumference and that is vertical to the plane, but it is not possible to identify the center point of the spherical surface that should be calculated in a case in which sets of coordinates indicated by the plural pieces of magnetic data are distributed three-dimensionally. In other words, the coordinates of the center point of the second spherical surface will be inaccurate in a direction that is vertical to the plane in which the plural pieces of magnetic data are distributed in a case in which the center point of the second spherical surface is calculated assuming that the sets of coordinates indicated by the plural pieces of magnetic data are distributed three-dimensionally even though the sets of coordinates indicated by the plural pieces of magnetic data are distributed two-dimensionally.

Therefore, in a case in which the sets of coordinates indicated by the plural pieces of magnetic data are distributed two-dimensionally, coordinates of the center point of the second spherical surface need to be calculated by removing inaccurate information from information on the coordinates of the center point of the spherical surface determined based on the plural pieces of magnetic data.

According to the present invention, the center point of the second spherical surface is calculated based on the plural pieces of magnetic data and the distribution indicator. Therefore, the coordinates of the center point of the second spherical surface can be calculated by removing inaccurate information from information on the coordinates of the center point of the spherical surface determined based on the plural pieces of magnetic data. Accordingly, even if the sets of coordinates indicated by the plural pieces of magnetic data are distributed two-dimensionally, it is possible to prevent employing an inaccurate value as an offset.

Preferably, the offset update section may update the offset from an old offset to a set of coordinates indicating the center point of the second spherical surface in a case in which it is determined by the distortion determination section that there is no distortion.

In the present invention, it is determined by the distortion determination section whether the shape of the three-dimensional figure having the plural sets of coordinates indicated by the plural pieces of magnetic data adjacent thereto has distortion, and an offset is updated if it is determined that there is no distortion. Therefore, only in a case in which it is valid to consider the coordinates of the center point of the second spherical surface as an offset will the coordinates of the center point be employed as an offset. Accordingly, the geomagnetic field measurement device according to the present invention enables the calculation of a direction of an accurate geomagnetic field.

In the third aspect of the present invention, the distortion determination section may calculate the distortion estimation value using a three-dimensional error, the three-dimensional error corresponding to a vector having, as elements, errors between the plural sets of coordinates indicated by the plural pieces of magnetic data and the surface of the three-dimensional figure.

The three-dimensional error shows errors between coordinates of the surface of the three-dimensional figure and the plural sets of coordinates of the plural pieces of magnetic data. Therefore, information on the three-dimensional error includes information indicating the shape of the three-dimensional figure. Therefore, by calculating the distortion estimation value by using the three-dimensional error including information on the shape of the three-dimensional figure, it is possible to accurately express the degree of difference in shape between the three-dimensional figure and the spherical surface.

In the third aspect of the present invention, the three-dimensional error may be a sum of a component representing distortion and a first spherical surface error; the three-dimensional error, the component representing distortion, and the first spherical surface error may each be a vector consisting of each element corresponding to each of the plural pieces of magnetic data; each element of the component representing distortion may be a value obtained by substituting each element of a first vector into a function expressed with a three variable quadratic form, with the function having a distortion estimation matrix as a coefficient matrix, the first vector corresponding to a three-dimensional vector having coordinates indicated by a reference point as a starting point and a set of coordinates indicated by a piece of magnetic data corresponding to each element as an end point; and each element of the first spherical surface error may be a value representing an error between a set of coordinates indicated by each of the plural pieces of magnetic data and the first spherical surface.

In the geomagnetic field measurement device according to the present invention, an error between the plural sets of coordinates indicated by the plural pieces of magnetic data and the surface of the three-dimensional figure is expressed as the sum of the first spherical surface error and the component representing distortion. That is, plural errors between the plural sets of coordinates indicated by the plural pieces of magnetic data and the surface of the three-dimensional figure can be divided into plural errors representing white noise overall and plural errors representing distortion overall.

Therefore, the geomagnetic field measurement device according to the present invention determines whether there is distortion caused by an external magnetic field, thereby preventing the employing of an inaccurate value as an offset.

In the third aspect of the present invention, the distortion estimation value may be an absolute value of a maximum eigenvalue of the distortion estimation matrix when an objective function expressed based on the three-dimensional error is minimized.

According to the present invention, an absolute value of the maximum eigenvalue of a distortion estimation matrix that minimizes an objective function expressed based on the three-dimensional error is used as the distortion estimation value. In minimizing the objective function, each component of the distortion estimation matrix is defined so that the component representing distortion expresses, as accurately as possible, the difference in shape between the three-dimensional figure and the first spherical surface. Therefore, according to the geomagnetic field measurement device of the present invention, it is possible to estimate the degree of difference in shape between the three-dimensional figure and the first spherical surface with a distortion estimation value defined based on the distortion estimation matrix. Thus, the geomagnetic field measurement device according to the present invention determines whether there is distortion caused by an external magnetic field, thereby preventing the employing of an inaccurate value as an offset.

In the third aspect of the present invention, the distribution indicator may be a minimum eigenvalue of a covariance matrix representing a variance of the plural pieces of magnetic data.

Out of three eigenvalues of a covariance matrix representing a variance of the plural pieces of magnetic data, the minimum eigenvalue will take a large value depending on the degree of the three-dimensional extent of the distribution of plural pieces of magnetic data. Therefore, using the minimum eigenvalue of the covariance matrix as the distribution indicator, it is possible to know the degree of the three-dimensional extent of the distribution of plural pieces of magnetic data.

In the third aspect of the present invention, the distortion determination section may employ, as the reference point, the center point of the second spherical surface.

According to the geomagnetic field measurement device of the present invention, because the center point of the second spherical surface is used as the reference point, the degree of difference between the shape of the three-dimensional figure and the shape of the first spherical surface can be accurately expressed.

The objective function may have, as variables, each component of the distortion estimation matrix and each component of coordinates indicated by a center point of the first spherical surface; the objective function may be a function representing a magnitude of a distortion estimation vector, the distortion estimation vector being a vector having, as elements, the three-dimensional error, a first error, and a second error, with the first error being a value obtained by multiplying a first coefficient with an inner product of a normalized eigenvector corresponding to the minimum eigenvalue of the covariance matrix and a renewal vector for distortion determination, with the renewal vector for distortion determination being a three-dimensional vector having the old offset as a starting point and the coordinates of the center point of the first spherical surface as an end point, and with the second error being a value obtained by multiplying a second coefficient with a product of the distortion estimation matrix and the eigenvector; and the distortion determination section may calculate, as the distortion estimation value, an absolute value of the maximum eigenvalue of the distortion estimation matrix as of when the objective function is minimized.

As described above, in a case in which sets of coordinates indicated by plural pieces of magnetic data are distributed two-dimensionally on a plane (or adjacent to the plane), it is not possible to know the three-dimensional shape of a three-dimensional figure. In this case, the magnitude of the effects from an external magnetic field needs to be determined by determining the degree of difference in shape between a curve representing a plane section for which the three-dimensional figure is cut by a plane and a circumference representing a plane section for which the spherical surface is cut by a plane.

According to the present invention, the distortion estimation matrix is calculated by minimizing the magnitude of the distortion estimation vector including the second error as an element. When the magnitude of the distortion estimation vector is minimized to be close to zero, the second error is also minimized to be close to zero. The second error is a vector obtained by multiplying a second coefficient with a vector for which an eigenvector corresponding to the smallest eigenvalue (minimum eigenvalue) from the three eigenvalues of the covariance matrix is converted by the distortion estimation matrix. Therefore, in minimizing the second error, at least one of the second coefficient or the magnitude of the vector, for which an eigenvector corresponding to the minimum eigenvalue of the covariance matrix is converted by the distortion estimation matrix, is minimized.

Here, a discussion is given of a case in which the magnitude of a vector, for which an eigenvector corresponding to the minimum eigenvalue of the covariance matrix is converted by the distortion estimation matrix, is minimized to be close to zero.

In calculating the distortion estimation matrix under a condition in which the magnitude of a vector, for which an eigenvector corresponding to the minimum eigenvalue of the covariance matrix is converted by the distortion estimation matrix, is minimized close to zero, an eigenvalue for which an absolute value is the smallest of the three eigenvalues of the distortion estimation matrix will be zero or a value close to zero.

In this case, the distortion determination section considers that, for a direction of an eigenvector corresponding to an eigenvalue for which an absolute value is the smallest of the three eigenvalues of the distortion estimation matrix, there is no difference in shape between the three-dimensional figure and the first spherical surface.

Also, in a case in which an eigenvalue for which an absolute value is the smallest of the three eigenvalues of the distortion estimation matrix is zero or a value close to zero, the eigenvector corresponding to the eigenvalue for which the absolute value is the smallest of the three eigenvalues of the distortion estimation matrix and an eigenvector corresponding to the minimum eigenvalue of the covariance matrix will be parallel. In a case in which plural pieces of magnetic data are two-dimensionally distributed on a plane (or adjacent to the plane), an eigenvector corresponding to the minimum eigenvalue of the covariance matrix is orthogonal to the plane on which the magnetic data pieces are distributed. Therefore, of three eigenvectors of the distortion estimation matrix, an eigenvector corresponding to an eigenvalue for which an absolute value is the smallest is also orthogonal to the plane on which the magnetic data pieces are distributed.

That is, in a case in which the distortion estimation matrix is calculated under a condition in which the magnitude of a vector, for which an eigenvector corresponding to the minimum eigenvalue of the covariance matrix is converted by the distortion estimation matrix, is minimized to be close to zero, the distortion determination section considers that there is no difference in shape between the three-dimensional figure and the first spherical surface, for a direction orthogonal to the plane on which the plural pieces of magnetic data are distributed (i.e., the direction of an eigenvector corresponding to an eigenvalue for which an absolute value is the smallest of the three eigenvalues of the distortion estimation matrix), and does not estimate the difference in shape between the three-dimensional figure and the first spherical surface.

On the other hand, because the three eigenvectors of the distortion estimation matrix are mutually orthogonal, the two eigenvectors other than the eigenvector corresponding to an eigenvalue for which an absolute value is the smallest are parallel to the plane on which the pieces of magnetic data are distributed. The eigenvalues corresponding to the two eigenvectors parallel to the plane on which the magnetic data pieces are distributed can take a value other than zero.

Therefore, in a case in which the distortion estimation matrix is calculated under a condition in which the magnitude of a vector for which an eigenvector corresponding to the minimum eigenvalue of the covariance matrix is converted by the distortion estimation matrix is minimized close to zero, the distortion determination section can estimate the degree of difference in shape between the three-dimensional figure and the first spherical surface for a direction that is parallel to the plane on which the plural pieces of magnetic data are distributed (i.e., a direction that can be expressed as a linear combination of the two eigenvectors corresponding to the two eigenvalues other than an eigenvalue for which an absolute value is the smallest of the three eigenvectors of the distortion estimation matrix).

Thus, in a case in which plural pieces of magnetic data are distributed two-dimensionally on a plane (or adjacent to the plane), the distortion estimation matrix is calculated under a condition in which the magnitude of a vector for which an eigenvector corresponding to the minimum eigenvalue of the covariance matrix is converted by the distortion estimation matrix is minimized. Therefore, according to the geomagnetic field measurement device of the present invention, it is possible to estimate the degree of difference in shape between the three-dimensional figure and the spherical surface for a direction that is parallel to a plane on which plural pieces of magnetic data are distributed, and not to estimate the degree of difference in shape between the three-dimensional figure and the spherical surface for a direction vertical to the plane on which the plural pieces of magnetic data are distributed.

In a case in which the sets of coordinates indicated by the pieces of magnetic data are distributed three-dimensionally, the degree of difference in shape between the three-dimensional figure and the first spherical surface needs to be estimated also for a direction of an eigenvector corresponding to the minimum eigenvalue of the covariance matrix.

That is, in this case, the distortion estimation matrix needs to be defined so that the difference in shape between the three-dimensional figure and the first spherical surface can be estimated also for a direction of the eigenvector corresponding to the minimum eigenvalue of the covariance matrix.

According to the present invention, the second error is a vector obtained by multiplying the second coefficient with a vector for which an eigenvector corresponding to the minimum eigenvalue of the covariance matrix is converted by the distortion estimation matrix. Therefore, by setting the second coefficient to zero or a small value close to zero, the second error can be minimized without minimizing the magnitude of the vector for which the eigenvector corresponding to the minimum eigenvalue of the covariance matrix is converted by the distortion estimation matrix.

In this case, the eigenvalue for which an absolute value is the smallest of the distortion estimation matrix can take a value other than zero. Also, in this case, the direction of an eigenvector corresponding to the eigenvalue for which the absolute value is the smallest of three eigenvalues of the distortion estimation matrix and the direction of an eigenvector corresponding to the minimum eigenvalue of the covariance matrix can differ from each other. Therefore, the distortion estimation matrix can express the degree of difference in shape between the three-dimensional figure and the spherical surface for distortion determination for all the directions of the three-dimensional space.

Thus, the present invention calculates the distortion estimation matrix by minimizing the second error including the second coefficient. Setting the value of the second coefficient depending on the degree of the three-dimensional extent of distribution of the sets of coordinates indicated by the plural pieces of magnetic data, it is possible to loosen a condition that the magnitude of a vector for which an eigenvector corresponding to the minimum eigenvalue of a covariance matrix is converted by the distortion estimation matrix.

That is, with the use of the distortion estimation matrix of the present invention, the distortion determination section can estimate the degree of difference in shape between the three-dimensional figure and the spherical surface in a three-dimensional manner in a case in which the sets of coordinates indicated by the plural pieces of magnetic data are distributed three-dimensionally, and can estimate the degree of difference in shape between the three-dimensional figure and the spherical surface in a case in which the sets of coordinates indicated by the plural pieces of magnetic data are two-dimensionally distributed on a plane (or adjacent to the plane) in a two-dimensional manner (within the plane). Therefore, according to the geomagnetic field measurement device according to the present invention, it is possible to estimate the magnitude of effects from a non-uniform external magnetic field, no matter whether the distribution of the coordinates indicated by the pieces of magnetic data are three-dimensional or two-dimensional, whereby employing an inaccurate offset can be prevented.

Furthermore, in the third aspect of the present invention, the center point calculation section may calculate, as the coordinates of the center point of the second spherical surface, coordinates indicated by a three-dimensional vector that minimizes a value of a center point calculation function, the center point calculation function representing a magnitude of a center point calculation vector having the three-dimensional vector as a variable and having a second spherical surface error and a third error as elements, with the second spherical surface error representing errors between the plural sets of coordinates indicated respectively by the plural pieces of magnetic data and the second spherical surface, with the third error being a value obtained by multiplying the first coefficient with an inner product of the normalized eigenvector corresponding to the minimum eigenvalue of the covariance matrix and a renewal vector for center point calculation, and with the renewal vector for center point calculation being a vector having the old offset as a starting point and having the coordinates indicated by the center point of the second spherical surface as an end point.

In a case in which sets of coordinates indicated by plural pieces of magnetic data are distributed two-dimensionally on a plane (or adjacent to the plane), coordinates of the center point of the spherical surface calculated, assuming that the sets of coordinates indicated by the plural pieces of magnetic data are distributed three-dimensionally, based on the plural pieces of magnetic data are inaccurate for a direction vertical to the plane.

Therefore, in a case in which the sets of coordinates indicated by the plural pieces of magnetic data are distributed two-dimensionally, information (inaccurate information) on a direction vertical to the plane (the direction of an eigenvector corresponding to the minimum eigenvalue of a covariance matrix) needs to be eliminated from information on coordinates of the center point of the spherical surface calculated assuming that the sets of coordinates indicated by the plural pieces of magnetic data are distributed three-dimensionally, to calculate the center point.

According to the present invention, the center point of the second spherical surface is calculated by minimizing the magnitude of a center point calculation vector including a third error as an element.

The third error is a value obtained by multiplying the first coefficient with an inner product of an eigenvector corresponding to the minimum eigenvalue of the covariance matrix and a renewal vector for center point calculation, the renewal vector representing coordinates of the center point of the second spherical surface when viewed from the old offset.

Therefore, in a case in which the third error is minimized to zero, at least one of the inner product of the eigenvector corresponding to the minimum eigenvalue of the covariance matrix and the renewal vector for center point calculation or the first coefficient is minimized close to zero.

In a case in which the inner product of the eigenvector corresponding to the minimum eigenvalue of the covariance matrix and the renewal vector for center point calculation is minimized close to zero, the eigenvector corresponding to the minimum eigenvalue of the covariance matrix and the renewal vector for center point calculation are mutually orthogonal. That is, the renewal vector for center point calculation will be a vector which does not include a component of a direction of the eigenvector corresponding to the minimum eigenvalue of the covariance matrix. The coordinates of the center point of the second spherical surface is expressed as the sum of the old offset and the renewal vector for center point calculation. Therefore, the center point calculation section can calculate coordinates of the center point of the second spherical surface without using inaccurate information (information on the direction of the eigenvector corresponding to the minimum eigenvalue of the covariance matrix). That is, the center point calculation section can calculate coordinates of the center point of the second spherical surface based only on accurate information in a case in which the plural pieces of magnetic data are distributed two-dimensionally.

On the other hand, in a case in which the sets of coordinates indicated by the pieces of magnetic data are distributed three-dimensionally, the third error can be minimized by setting the first coefficient to zero or a small value close to zero without minimizing the inner product of the eigenvector corresponding to the minimum eigenvalue of the covariance matrix and the renewal vector for center point calculation. That is, by setting the first coefficient to zero or a small value close to zero, it is possible to loosen a condition requiring that the eigenvector corresponding to the minimum eigenvalue of the covariance matrix and the renewal vector for center point calculation be orthogonal. Therefore, in a case in which sets of coordinates indicated by the plural pieces of magnetic data have a three-dimensional extent, it is possible to calculate the coordinates of the center point of the second spherical surface by using information on the direction of the eigenvector corresponding to the minimum eigenvalue of the covariance matrix.

Additionally, in the third aspect of the present invention, the objective function may be a function representing a magnitude of the three-dimensional error and having as variables each component of coordinates indicated by the center point of the first spherical surface and each component of the distortion estimation matrix; and, in a case in which the minimum eigenvalue of the covariance matrix is a value less than a predetermined magnitude, the distortion estimation value may be an absolute value of the maximum eigenvalue of the distortion estimation matrix that minimizes the objective function, given that a first constraint and a second constraint are satisfied, the first constraint requiring that a normalized eigenvector corresponding to the minimum eigenvalue of the covariance matrix and a renewal vector for distortion determination are orthogonal, with the renewal vector for distortion determination being a three-dimensional vector having the old offset as a starting point and having the coordinates indicated by the center point of the first spherical surface as an end point, and the second constraint requiring that an inner product of the distortion estimation matrix and the eigenvector is a zero vector.

According to the present invention, in a case in which the minimum eigenvalue of the covariance matrix has a value smaller than a threshold (a predetermined magnitude), and in which the plural sets of coordinates indicated by the plural pieces of magnetic data are considered to be distributed on a plane (or adjacent to the plane) two-dimensionally, the distortion estimation matrix and the coordinates of the center point of the first spherical surface are calculated, strictly satisfying the first constraint requiring that the eigenvector corresponding to the minimum eigenvalue of the covariance matrix and the renewal vector for distortion determination be orthogonal and the second constraint requiring that the magnitude of a vector for which the eigenvector corresponding to the minimum eigenvalue of the covariance matrix is converted by the distortion estimation matrix be zero, to estimate the degree of difference in shape between the three-dimensional figure and the first spherical surface. Therefore, it is possible to estimate the degree of difference in shape between the three-dimensional figure and the spherical surface only for a direction that is perfectly parallel to the plane having the plural sets of coordinates indicated by the plural pieces of magnetic data adjacent thereto by completely removing inaccurate information on the direction of an eigenvector corresponding to the minimum eigenvalue of the covariance matrix.

Therefore, in a case in which the sets of coordinates indicated by the plural pieces of magnetic data are distributed two-dimensionally, the degree of difference in shape between the three-dimensional figure and the spherical surface can be estimated more accurately.

In a fourth aspect, the present invention provides a geomagnetic field measurement device having: a two-dimensional sensor that measures respective magnetic components of two directions; a storage device that stores, as pieces of vector data expressed in a two-axis coordinate system, pieces of magnetic data sequentially output from the two-dimensional sensor; a distortion determination section that calculates, based on the plural pieces of magnetic data stored in the storage device, a distortion estimation value indicating a degree of difference in shape between a curve and a circumference, the curve being defined so that plural sets of coordinates indicated by the plural pieces of magnetic data are distributed adjacent to the curve, and that determines whether there is distortion in a shape of the curve based on the distortion estimation value; and an offset update section that updates an offset for correcting each of the plural pieces of the magnetic data in a case in which it is determined that there is no distortion in the distortion determination section.

According to the present invention, in a case in which the geomagnetic field measurement device has a two-dimensional magnetic sensor, a distortion estimation value indicating the degree of difference in shape between a curve and a circumference is calculated. The curve is determined so as to have plural sets of coordinates indicated by plural pieces of magnetic data output by the two-dimensional magnetic sensor.

Then, it is determined based on the distortion estimation value whether the shape of the curve has a distortion, thereby to calculate an offset based on the plural pieces of magnetic data. Then, an offset is updated only in a case in which the shape of the curve has no distortion and in which, therefore, the offset can be calculated. Thus, according to the geomagnetic field measurement device of the present invention, it is possible to calculate an accurate geomagnetic field using an accurate offset in a case in which a two-dimensional magnetic sensor is used.

BRIEF DESCRIPTION OF THE DRAWINGS

FIG. 16 is a table showing results of the simulation.

DETAILED DESCRIPTION OF PREFERRED EMBODIMENTS

A. Embodiment

In the following, an embodiment of the present invention is described.

1. Overview of Magnetic Field Detected by Three-dimensional Magnetic Sensor

In the present embodiment, we assume, as magnetic fields that are detected by a three-dimensional magnetic sensor, a geomagnetic field, which is intended to be detected, an internal magnetic field emitted from parts or components of a device in which the three-dimensional magnetic sensor is mounted, and an external magnetic field emitted from an object outside the device.

These three types of magnetic fields respectively possess different characteristics in direction, magnitude, and uniformity. On detecting of a magnetic field by a three-dimensional magnetic sensor, the direction and the magnitude of a vector data representing the magnetic field output from the three-dimensional magnetic sensor change as at least one of the position or the orientation of the three-dimensional magnetic sensor changes. How the output data changes differs among the three-types of magnetic fields.

In the following, an overview of these three types of magnetic fields assumed in the present embodiment as well as a vector data output when each type of magnetic field is detected by the three-dimensional magnetic sensor will be described with reference to FIGS. 1 to 4.

Figure 1:
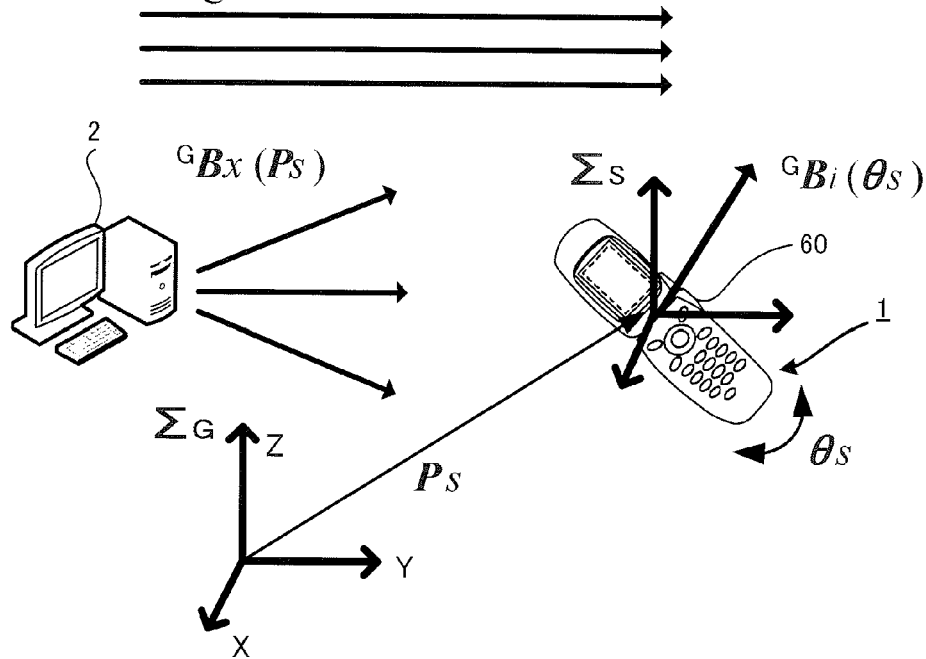
FIG. 1 is a conceptual diagram explaining an overall view of magnetic fields detected by a three-dimensional magnetic sensor according to an embodiment of the present invention.

FIG. 1 is a diagram for describing types and characteristics of magnetic fields existing around a three-dimensional magnetic sensor 60 mounted in a device 1.

Magnetic fields existing around the three-dimensional magnetic sensor 60 include, in addition to a geomagnetic field Bg that is intended to be measured, an internal magnetic field Bi emitted from parts inside the device 1 on which the three-dimensional magnetic sensor 60 is mounted and an external magnetic field Bx emitted from an object 2 being around the device 1.

The geomagnetic field Bg is a vector having a direction towards the magnetic north pole and is a magnetic field having nearly constant direction and magnitude. To be more precise, the direction and magnitude of the geomagnetic field Bg differs depending on the region. However, the geomagnetic field Bg has nearly constant direction and magnitude as long as the device 1 is not moved to a distant place, for example, such as being moved to a different city.

The internal magnetic field Bi is a magnetic field emitted from the parts of the device 1, and the direction of the internal magnetic field Bi has a nearly constant direction when viewed from the device 1. In other words, when viewed from the three-dimensional magnetic sensor 60 mounted in the device 1, the internal magnetic field Bi is detected as a magnetic field having almost unchanged direction and magnitude no matter how the orientation of the device 1 is changed.

For example, when a user, holding the device 1 in a hand, rotates the wrist of the user, the orientation of the device 1 changes. In this case, because the geomagnetic field Bg points toward the magnetic north pole, respective components of the three axes of the geomagnetic field Bg detected by the three-dimensional magnetic sensor 60 change. On the other hand, in the three-dimensional magnetic sensor 60, the relative positional relationship between the three-dimensional magnetic sensor 60 and the parts emitting the internal magnetic field is fixed, and the respective components of the three axes of the internal magnetic field Bi remain almost unchanged no matter how the orientation of the device 1 is changed.

The external magnetic field Bx is a magnetic field emitted by an external object 2, and is a non-uniform magnetic field for which a direction and a magnitude change depending on a distance and a direction from the object 2. That is, when viewed from the three-dimensional magnetic sensor 60 mounted in the device 1, the external magnetic field Bx is detected as a magnetic field that changes in direction and magnitude, depending on a mutual positional relationship between the object 2 and the three-dimensional magnetic sensor 60.

For simplicity, a ground coordinate system $\Sigma(sigma)_G$ and a sensor coordinate system $\Sigma_S$ such as shown in FIG. 1 are assumed. A prefix superscript G assigned to the upper left of each vector shown in FIG. 1 indicates that the corresponding vector is a vector expressed in the ground coordinate system $\Sigma_G$.

The ground coordinate system $\Sigma_G$ is a coordinate system fixed on the ground, and is a coordinate system having a freely selected point on the ground as an origin and having three directions that are mutually orthogonal, for example, the east, the north, and a vertical direction that respectively correspond to the x-axis, y-axis, and z-axis. The position and the orientation of the three-dimensional magnetic sensor 60 when viewed from the ground coordinate system $\Sigma_G$ will be hereinafter referred to respectively as a position Ps and an orientation θ(theta)s.

The sensor coordinate system $\Sigma_S$ is a coordinate system fixed to the three-dimensional magnetic sensor 60, and is a coordinate system in such a way that values output from three respective sensor modules provided with the three-dimensional magnetic sensor 60 are respectively plotted on the x-axis, y-axis, and z-axis. That is, a magnetic data output from the three-dimensional magnetic sensor 60 is expressed as a vector data of the sensor coordinate system $\Sigma_S$.

When viewed from the ground coordinate system $\Sigma_G$, the origin of the sensor coordinate system $\Sigma_S$ is the position Ps and the orientation thereof is the orientation θs.

Figure 2:
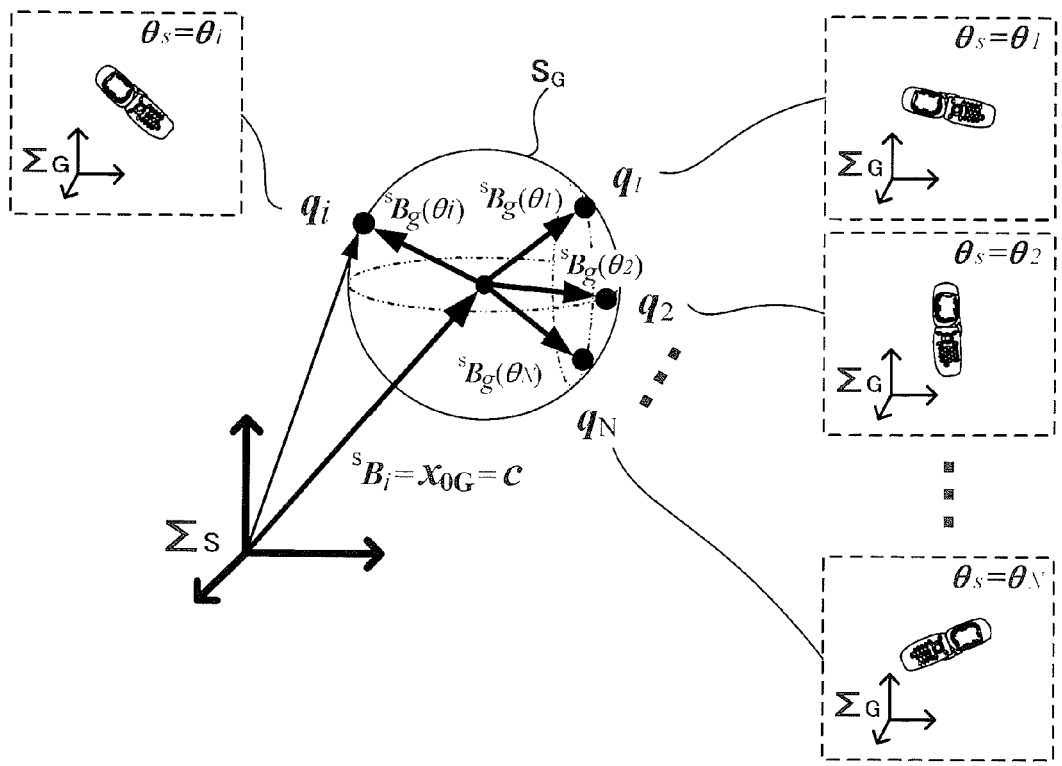
FIG. 2 is a conceptual diagram for explaining a geomagnetic field and an internal magnetic field detected by the three-dimensional magnetic sensor according to an embodiment of the present invention.

FIG. 2 is a diagram illustrating how a geomagnetic field Bg and an internal magnetic field Bi would be expressed when detected by the three-dimensional magnetic sensor 60. Specifically, FIG. 2 is a diagram in which N number of pieces of magnetic data $q_1$ to $q_N$ (N is a natural number equal to or greater than 4, representing a prescribed measurement number that is required for accurately deriving an offset) output from the three-dimensional magnetic sensor 60 are plotted in the sensor coordinate system $\Sigma_S$ when a magnetic field is measured, while shifting from $\theta_1$ to $\theta_N$ the orientation θs of the three-dimensional magnetic sensor 60 viewed from the ground coordinate system $\Sigma_G$.

In FIG. 2, we assume a case in which only a geomagnetic field Bg and an internal magnetic field Bi exist, and in which no external magnetic field Bx exists. A prefix superscript S assigned to the upper left of each vector shown in FIG. 2 indicates that the corresponding vector is a vector expressed in accordance with the sensor coordinate system $\Sigma_S$.

The internal magnetic field Bi is expressed, in the sensor coordinate system $\Sigma_S$, as a vector $^SBi$ having a certain direction and magnitude (a vector starting from the origin and pointing to a center point $x_{0G}$ of the sensor coordinate system $\Sigma_S$), not depending on a position Ps and an orientation θs of the three-dimensional magnetic sensor 60.

On the other hand, the magnitude of the geomagnetic field Bg, in the sensor coordinate system $\Sigma_S$, is unchanged, but the direction thereof changes with the orientation θs of the three-dimensional magnetic sensor 60. Thus, the geomagnetic field Bg is expressed, in the sensor coordinate system $\Sigma_S$, as a vector $^SBg(\theta s)$ having a certain magnitude, with its direction depending on the orientation θs of the three-dimensional magnetic sensor 60. When θs is shifted, coordinates expressed by a vector $^SBg(\theta s)$ will be located on a spherical surface having the center point $x_{0G}$ as a center.

Therefore, plural pieces of magnetic data $q_1$ to $q_N$ sequentially output from the three-dimensional magnetic sensor 60 will be, in the sensor coordinate system $\Sigma_S$, distributed on a spherical surface $S_G$ having the center point $x_{0G}$ as the center point and the magnitude of the geomagnetic field Bg as the radius. In a case in which the magnitude of the internal magnetic field Bi is 0, the center point $x_{0G}$ and the origin of the sensor coordinate system $\Sigma_S$ will coincide with each other. It is to be noted that, to be more precise, because measurement values of the three-dimensional magnetic sensor 60 have measurement errors, the plural pieces of magnetic data $q_1$ to $q_N$ are stochastically distributed adjacent to the spherical surface $S_G$.

A vector $^SBi$ representing an internal magnetic field can be obtained by calculating a set of coordinates of a center point $x_{0G}$ of a spherical surface $S_G$ from such plural pieces of magnetic data $q_1$ to $q_N$, and a vector $^SBg$ representing a geomagnetic field can be calculated by subtracting the vector $^SBi$ representing an internal magnetic field from plural pieces of magnetic data $q_1$ to $q_N$ that are output values of the three-dimensional magnetic sensor 60. Thus, in a case in which the magnetism detected by the three-dimensional magnetic sensor 60 are a geomagnetic field Bg and an internal magnetic field Bi, a center point $x_{0G}$ of a spherical surface $S_G$ can be calculated, and the center point $x_{0G}$ corresponds to an offset c of the three-dimensional magnetic sensor 60.

Figure 3:
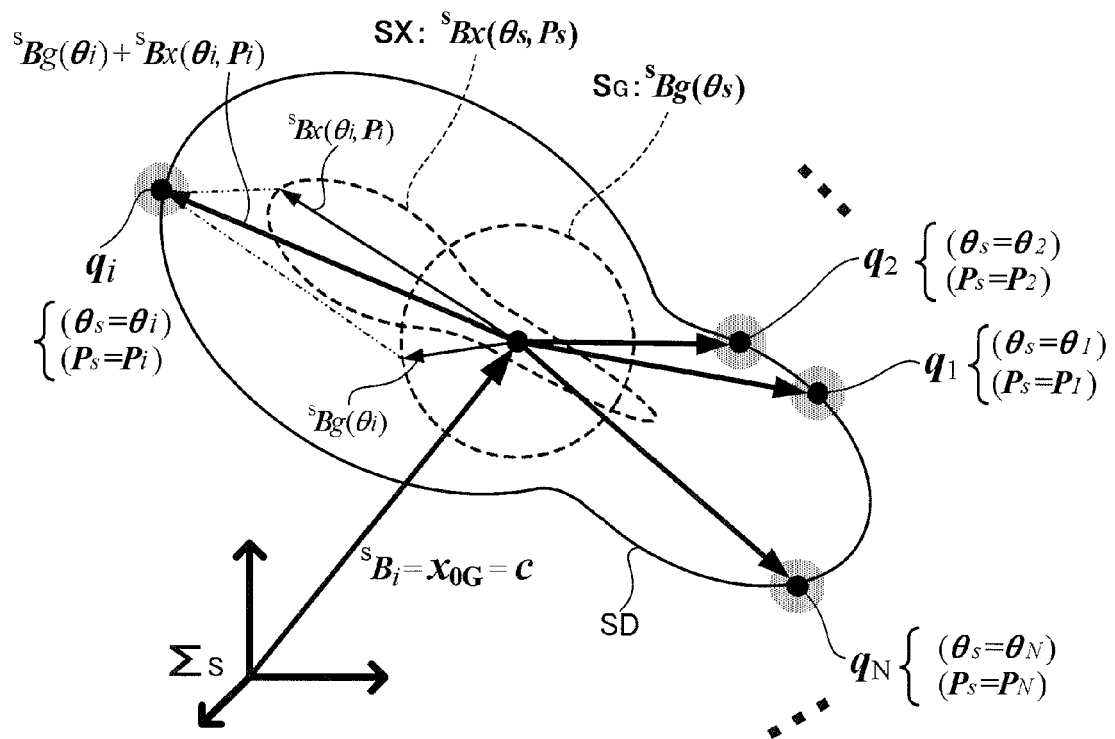
FIG. 3 is a conceptual diagram for explaining a geomagnetic field, an internal magnetic field, and an external magnetic field detected by the three-dimensional magnetic sensor according to an embodiment of the present invention.

FIG. 3 is a diagram showing a case in which plural pieces of magnetic data $q_1$ to $q_N$ sequentially output from the three-dimensional magnetic sensor 60 are plotted in the sensor coordinate system $\Sigma_S$ in a case in which there is an external magnetic field Bx, when a magnetic field is measured while shifting the position Ps of the three-dimensional magnetic sensor 60 from $P_1$ to $P_N$ and also shifting the orientation θs thereof from $\theta_1$ to $\theta_N$.

The external magnetic field Bx is a non-uniform magnetic field, and its direction and magnitude change depending on position in the ground coordinate system $\Sigma_G$. Accordingly, in a case in which the position Ps of the three-dimensional magnetic sensor 60 is changed, the direction and magnitude of the external magnetic field Bx detected by the three-dimensional magnetic sensor 60 change. Such an external magnetic field Bx is, in the sensor coordinate system $\Sigma_S$, expressed as a vector $^SBx(\theta s, Ps)$ for which both direction and magnitude change depending on the orientation θs and the position Ps of the three-dimensional magnetic sensor 60.

Plural pieces of magnetic data $q_1$ to $q_N$, measured while shifting the orientation θs and the position Ps of the three-dimensional magnetic sensor 60, are output as the sum of a vector $^SBi$ of an internal magnetic field, a vector $^SBg(\theta s)$ of a geomagnetic field, and a vector $^SBx(\theta s, Ps)$ of an external magnetic field. Therefore, the plural pieces of magnetic data $q_1$ to $q_N$ will be, in the sensor coordinate system $\Sigma_S$, distributed adjacent to a surface of a three-dimensional figure SD, which is a superposition, with the center point $x_{0G}$ as a reference, of the spherical surface $S_G$ having the center point $x_{0G}$ as the center and a curved surface SX having a distorted shape differing from a spherical surface. The curved surface SX is a curved surface representing the external magnetic field $^SBx(\theta s, Ps)$ in a sensor space (i.e., sensor coordinate system $\Sigma_S$), and represents the summed components of a vector $^SBi$ of an internal magnetic field and a vector $^SBx(\theta s, Ps)$ of an external magnetic field, from among vectors indicated respectively by the plural pieces of magnetic data $q_1$ to $q_N$ output from the three-dimensional magnetic sensor 60.

Because a three-dimensional figure SD has a shape differing from a spherical surface, it is difficult to obtain a vector of a center point $x_{0G}$ indicating a value of an internal magnetic field $^SBi$ from plural pieces of magnetic data $q_1$ to $q_N$ distributed adjacent to a surface of the three-dimensional figure SD.

However, in a case in which an external magnetic field Bx is weak, a three-dimensional figure SD will be a shape that is analogous to a spherical surface.

Figure 4A:
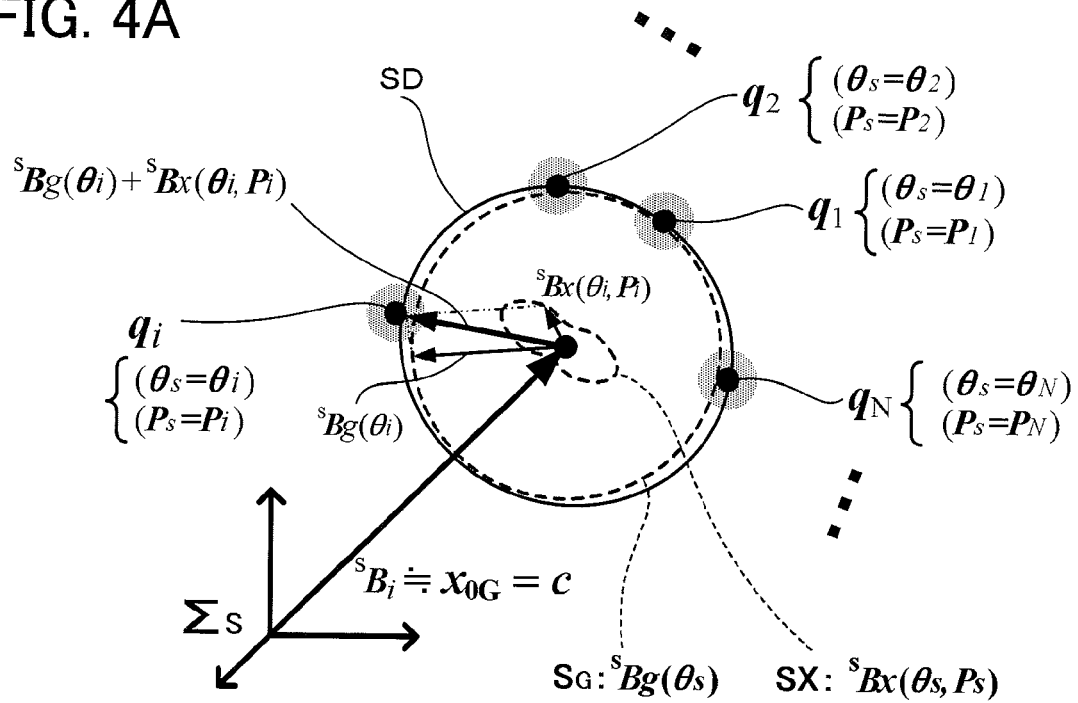
FIGS. 4A and 4B are each a conceptual diagram for explaining a geomagnetic field, an internal magnetic field, and an external magnetic field detected by the three-dimensional magnetic sensor according to an embodiment of the present invention.

FIG. 4A is a diagram in which pieces of magnetic data $q_1$ to $q_N$ sequentially output from the three-dimensional magnetic sensor 60 are plotted in the sensor coordinate system $\Sigma_s$ in a case in which an external magnetic field Bx is weak. In a case in which the external magnetic field Bx is weak, plural pieces of magnetic data $q_1$ to $q_N$ sequentially output from the three-dimensional magnetic sensor 60 will be distributed adjacent to a surface of a three-dimensional figure SD having a shape analogous to a spherical surface, the shape of the three-dimensional figure SD being a superposition of a spherical surface $S_G$ and a curved surface SX, the spherical surface $S_G$ having a center point $x_{0G}$ as the center, the spherical surface $S_G$ being indicated by a vector $^SBg(\theta s)$ representing a geomagnetic field, and the curved surface SX being plotted by a vector $^S\mathrm{Bx}(\theta s, Ps)$ representing the external magnetic field. In this case, a vector that almost coincides with the center point $x_{0G}$ can be obtained from the plural pieces of magnetic data $q_1$ to $q_N$.

Figure 4B:
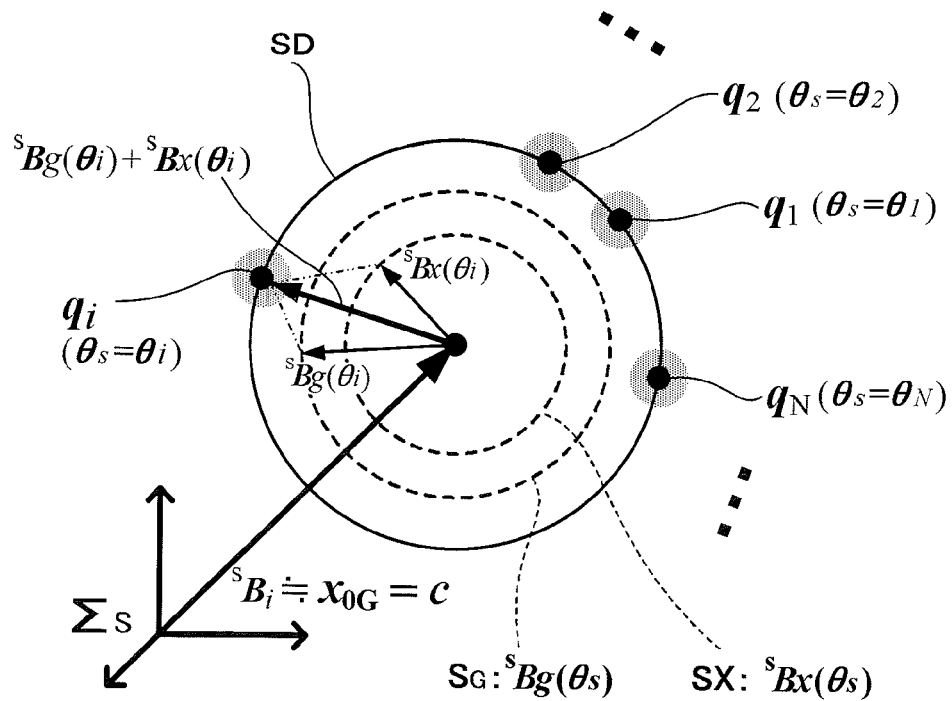

It is to be noted that, even in a case in which a non-uniform external magnetic field Bx exists, the three-dimensional magnetic sensor 60 sometimes detects the non-uniform external magnetic field Bx as if it were a uniform magnetic field, depending on how the position $P_S$ and orientation $\theta_S$ of the three-dimensional magnetic sensor 60 are changed in obtaining plural pieces of magnetic data $q_1$ to $q_N$. Specifically, in obtaining plural pieces of magnetic data $q_1$ to $q_N$, even in a case in which a non-uniform external magnetic field Bx exists, the external magnetic field Bx will be expressed, in the sensor space $\Sigma_S$, as a vector $^S\mathrm{Bx}(\theta s)$ having a certain magnitude, with only the direction of the vector being changed based on the orientation $\theta s$ of the three-dimensional magnetic sensor 60 if a user holding the device 1 in the hand changes only the orientation of the device 1 without moving the position thereof (to be more precise, the position $P_S$ of the three-dimensional magnetic sensor 60) instead of shaking the device 1 in such a way that the position $P_S$ of the three-dimensional magnetic sensor 60 changes. In this case, plural pieces of magnetic data $q_1$ to $q_N$ output from the three-dimensional magnetic sensor 60 will be, in the sensor space $\Sigma_S$, distributed adjacent to the surface of a three-dimensional figure SD having a shape of an approximately spherical surface as shown in FIG. 4B. In a case in which the shape of the three-dimensional figure SD is an approximately spherical surface, the center point thereof will be approximately equal to a center point $x_{0G}$ (i.e., coordinates representing an internal magnetic field $^S\mathrm{Bi}$) of a spherical surface $S_G$. In this case, it is possible to obtain, from the plural pieces of magnetic data $q_1$ to $q_N$, a vector approximately coinciding with the center point $x_{0G}$.

Thus, to calculate an offset c (i.e., a center point $x_{0G}$ of a spherical surface $S_G$ representing a geomagnetic field Bg) based on plural pieces of magnetic data $q_1$ to $q_N$, a three-dimensional figure SD needs to have a shape approximate to a spherical surface. In other words, in a case in which the effects from an external magnetic field Bx is large and in which the shape of a three-dimensional figure SD differs greatly from a spherical surface, an offset c cannot be calculated based on the plural pieces of magnetic data $q_1$ to $q_N$.

Therefore, the magnitude of effects from an external magnetic field Bx, i.e., the degree of similarity of the shape of a three-dimensional figure SD to a spherical surface, is estimated, and only in a case in which the shape of the three-dimensional figure SD is regarded as an approximately spherical surface, the center point of this spherical surface (three-dimensional figure SD) is employed as an offset c. In a case in which the shape of a three-dimensional figure SD has a shape different from the spherical surface, the calculation of an offset c based on the plural pieces of magnetic data $q_1$ to $q_N$, i.e., the calculation of an offset c based on the three-dimensional figure SD, needs to be avoided.

Figure 5:
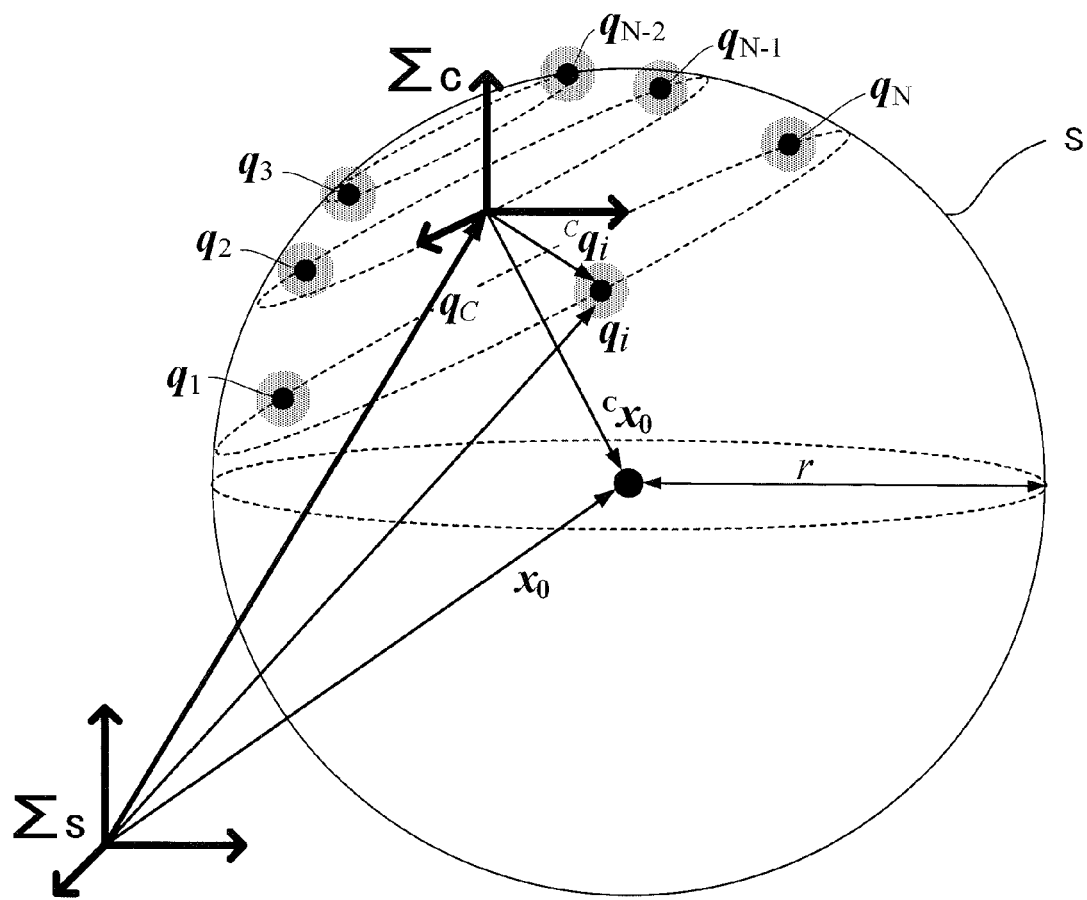
FIG. 5 is a conceptual diagram for explaining a process of obtaining a center point of a spherical surface, such as one including thereon plural sets of coordinates represented by plural magnetic data pieces detected by the three-dimensional magnetic sensor.

2. Calculating Center Point of Spherical Surface in a Case in which it is Assumed that Magnetic Data Pieces are Distributed Adjacent to Spherical Surface In the following, with reference to FIG. 5, a description will be given of a method for calculating a center point $x_0$ of a spherical surface S, assuming a case in which N-number of pieces of magnetic data $q_1$ to $q_N$ output by the three-dimensional magnetic sensor 60 are distributed adjacent to the spherical surface S with a radius r. The spherical surface S is a spherical surface conveniently introduced to calculate the center point of the spherical surface assuming that, on the sensor space $\Sigma_S$, plural pieces of magnetic data $q_1$ to $q_N$ are distributed adjacent to the spherical surface, and is different from the above-described spherical surface $S_G$ representing a geomagnetic field and a three-dimensional figure SD. Although described later in detail, "a spherical surface defined, assuming that plural sets of coordinates indicated by plural pieces of magnetic data $q_1$ to $q_N$ are distributed adjacent thereto" means a spherical surface defined so that the plural sets of coordinates indicated by the plural pieces of magnetic data $q_1$ to $q_N$ are positioned adjacent thereto as much as possible, and, for example, is a spherical surface defined so that plural errors (distances) between the plural sets of coordinates indicated by the plural pieces of magnetic data $q_1$ to $q_N$ and coordinates on the spherical surface are minimized overall.

It is to be noted that, in a case in which a non-uniform external magnetic field Bx is weak, or in a case in which, even if a non-uniform external magnetic field Bx exists, plural pieces of magnetic data $q_1$ to $q_N$ are measured while changing only the orientation of the device 1 without moving the position thereof (to be more precise, the position of the three-dimensional magnetic sensor 60), a three-dimensional figure SD which is a superposition of a spherical surface $S_G$ representing a geomagnetic field Bg and a curved surface SX almost coincides with a spherical surface S. Specifically, in a case in which an external magnetic field Bx is weak, the radius r will represent the magnitude of the geomagnetic field Bg, and the spherical surface S and a center point $x_0$ thereof will be approximately equal respectively to the spherical surface $S_G$ representing the geomagnetic field Bg and a center point $x_{0G}$ thereof (refer to FIG. 14C). In a case in which, even if a non-uniform external magnetic field Bx exists, plural pieces of magnetic data $q_1$ to $q_N$ are measured while changing only the orientation of the device 1 without moving the position thereof, the radius r will represent the magnitude of the sum of a vector representing a geomagnetic field Bg and a vector representing the external magnetic field Bx, and a center point $x_0$ of a spherical surface S will be approximately equal to a center point $x_{0G}$ of a spherical surface $S_G$ representing a geomagnetic field Bg (refer to FIG. 14 B).

Assuming that plural pieces of magnetic data $q_1$ to $q_N$ are on a spherical surface S having a radius r, the distance between a point indicated by each piece of magnetic data $q_i$ and a center point $x_0$ of the spherical surface S is r, and the following Equation (1) to (3) will hold. In the following, vectors, coordinates, and the like are expressed in the sensor space $\Sigma_S$ unless otherwise indicated.

$$\|q_i - x_0\|_2^2 = r^2 \quad (i=1, \ldots, N) \tag{1}$$

$$\text{where } q_i = [x_i\, y_i\, z_i]^T \tag{2}$$

$$x_0 = [x_0\, y_0\, z_0]^T \tag{3}$$

Here, a center of gravity of plural pieces of magnetic data $q_i$ to $q_N$ is denoted as $q_c$. The center of gravity $q_c$ is expressed in accordance with Equation (4). A barycentric coordinate system $\Sigma_C$, having the center of gravity $q_c$ as the origin, is introduced. The following Equation (6) will hold between a magnetic data $q_i$ expressed in the sensor coordinate system $\Sigma_S$ and a magnetic data $^Cq_i$ expressed in the barycentric coordinate system $\Sigma_C$. The following Equation (7) will hold between a center point $x_0$ expressed in the sensor coordinate system $\Sigma_S$ and a center point $^Cx_0$ expressed in the barycentric coordinate system $\Sigma_C$.

$$q_C = \frac{1}{N}\sum_{i=1}^{N} q_i \tag{4}$$

where $q_C = [q_{cx}\ q_{cy}\ q_{cz}]^T$ (5)

$^C q_i = q_i - q_C$ (6)

$^C x_0 = x_0 - q_C$ (7)

Equation (1) for a spherical surface S in the sensor coordinate system $\Sigma_S$ is expressed as Equation (8) in the barycentric coordinate system $\Sigma_C$. Substituting Equations (6) and (7) into Equation (8), we obtain Equation (9).

$\|^C q_i - {^C x_0}\|_2^2 = r^2$ $(i=1,\ldots,N)$ (8)

$\|(q_i - q_c) - (x_0 - q_c)\|_2^2 = r^2$ $(i=1,\ldots,N)$ (9)

Substituting each of plural pieces of magnetic data $q_1$ to $q_N$ into $q_i$ of Equation (9) and dividing the result of substitution by the number of pieces of magnetic data, N, the following Equation (10) is obtained. Then calculating a difference between Equation (10) and Equation (11), which is expanded from Equation (9), to eliminate a term not dependent on a variable $q_i$, Equation (12) is obtained.

$$\frac{1}{N}\sum_{i=1}^{N} (q_i - q_C)^T(q_i - q_C) + (x_0 - q_C)^T(x_0 - q_C) = r^2 \tag{10}$$

$$(q_i - q_C)^T(q_i - q_C) - 2(q_i - q_C)^T(x_0 - q_C) + (x_0 - q_C)^T(x_0 - q_C) = r^2 \tag{11}$$

$(i = 1, \ldots, N)$ $$(q_i - q_C)^T(x_0 - q_C) = \frac{1}{2}\left[(q_i - q_C)^T(q_i - q_C) - \frac{1}{N}\sum_{i=1}^{N}(q_i - q_C)^T(q_i - q_C)\right] \tag{12}$$

$(i = 1, \ldots, N)$

Equation (1) is a formula of a spherical surface and indicates that a variable $q_i$, which is a piece of magnetic data, is on a spherical surface S. This Equation (1) has been transformed into Equation (12) including a magnetic data $q_i$, a center of gravity $q_c$, and a center point $x_0$. N number of equations obtained by substituting the N number of pieces of magnetic data $q_1$ to $q_N$ respectively into the variable $q_i$ of Equation (12) are expressed as Equation (13) using a matrix X.

$X(x_0 - q_C) = j$ (13)

$$\text{where } X = \begin{bmatrix} (q_1 - q_C)^T \\ \vdots \\ (q_N - q_C)^T \end{bmatrix} \tag{14}$$

$$j = \frac{1}{2}\begin{bmatrix} (q_1 - q_C)^T(q_1 - q_C) - R \\ \vdots \\ (q_N - q_C)^T(q_N - q_C) - R \end{bmatrix} \tag{15}$$

$$R = \frac{1}{N}\sum_{i=1}^{N}(q_i - q_C)^T(q_i - q_C) \tag{16}$$

Equation (13) has a solution in a case in which the coordinates of every piece of magnetic data $q_1$ to $q_N$ completely coincide with a spherical surface S having a center point $x_0$ as the center. However, considering errors such as measurement errors of the three-dimensional magnetic sensor 60, there will be no chance of a set of coordinates for every piece of magnetic data $q_1$ to $q_N$ being at a position that perfectly coincides with the spherical surface S. Therefore, Equation (13) does not have a solution. Accordingly, to obtain a practical solution by a statistical method, we introduce an error $\delta(\text{delta})_S$ (second spherical surface error) expressed by Equation (17). The error $\delta_S$ is an N-dimension vector representing the difference between the left-hand and the right-hand sides of Equation (13).

$\delta_S = X(x - q_C) - j$ (17)

where $x = [x\ y\ z]^T$ (18)

A vector x that minimizes the norm of an error $\delta_S$, i.e., a vector x that minimizes $(\delta_S)^T(\delta_S)$, can be considered practically as a center point $x_0$ of a spherical surface S (second spherical surface).

We now define an objective function $f_S(x)$ indicated in Equation (19), where x that minimizes the objective function $f_S(x)$ will be a practical value as the center point $x_0$ of the spherical surface S. The center point $x_0$ can be obtained by Equation (20), in a case in which a covariance matrix A expressed in Equation (21) is regular.

$f_S(x) = \|X(x - q_C) - j\|_2$ (19)

$x_0 = A^{-1}X^T j + q_C$ (20)

where $A = X^T X$ (21)

Thus, with an assumption that plural pieces of magnetic data $q_1$ to $q_N$ are stochastically distributed adjacent to a spherical surface S, minimizing an error between three-axis coordinates represented by the plural pieces of magnetic data $q_1$ to $q_N$ and the spherical surface S allows us to calculate a center point $x_0$ of the spherical surface S.

As described above, in a case in which a non-uniform external magnetic field Bx is weak, or in a case in which, even if a non-uniform external magnetic field Bx exists, plural pieces of magnetic data $q_1$ to $q_N$ are measured while changing only the orientation of the device 1 without moving the position thereof, a center point $x_0$ of a spherical surface S almost coincides with a center point $x_{0G}$ of a spherical surface $S_G$ representing a geomagnetic field Bg. Thus, in a case in which a three-dimensional figure SD almost coincides with a spherical surface S, a center point $x_0$ of the spherical surface S almost coincides with a center point $x_{0G}$ of a spherical surface $S_G$ representing a geomagnetic field, and therefore, the center point $x_0$ of the spherical surface S can be employed as an offset c.

3. Distribution of Magnetic Data Detected by Magnetic Sensor

In a case in which plural pieces of magnetic data $q_1$ to $q_N$ output by the three-dimensional magnetic sensor 60 are distributed adjacent to a spherical surface S, the plural pieces of magnetic data $q_1$ to $q_N$ need to be distributed in the sensor coordinate system $\Sigma_S$ in a manner that has a three-dimensional extent, to calculate a center point $x_0$ of the spherical surface S.

Figure 6:
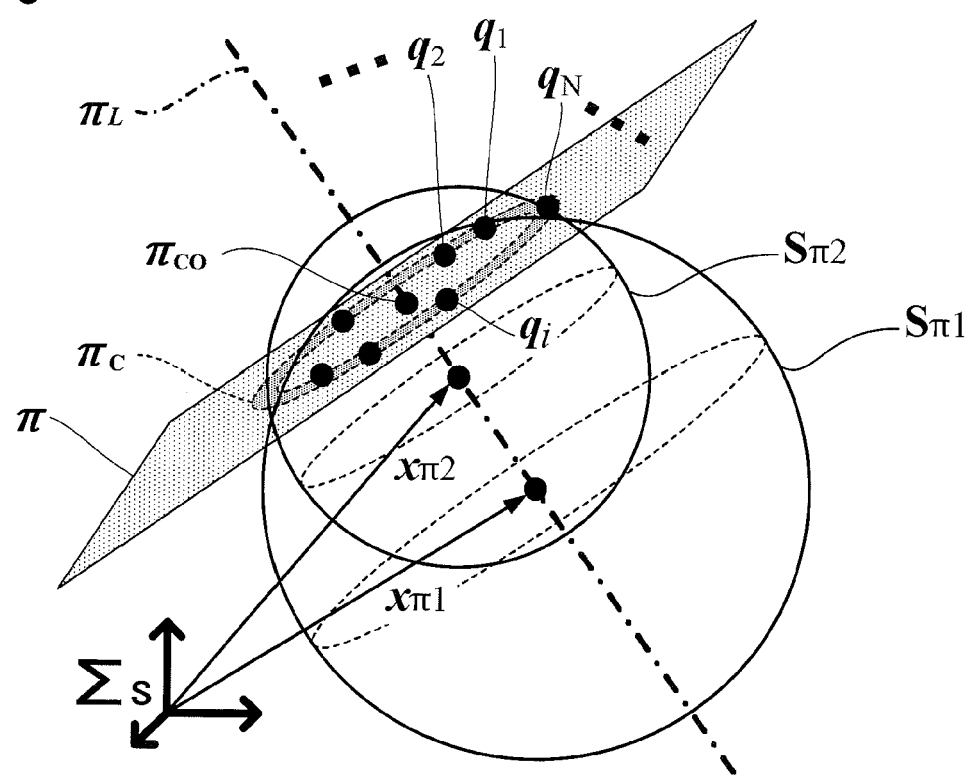
FIG. 6 is a conceptual diagram for explaining a case in which plural sets of coordinates represented by plural magnetic data pieces detected by the three-dimensional magnetic sensor are distributed in a two-dimensional manner according to an embodiment of the present invention.

For example, as shown in FIG. 6, in a case in which plural pieces of magnetic data $q_1$ to $q_N$ are distributed two-dimensionally, adjacent to a circle $\pi(\text{pi})_C$ in a plane $\pi$ of the sensor coordinate system $\Sigma_S$, it is only possible to identify that a spherical surface S is a spherical surface that has a circle $\pi_C$ as a plane of a section. A spherical surface having the circle $\pi_C$ as a plane of a section may be a spherical surface $S_{\pi 1}$ that has, as the center, a center point $x_{\pi 1}$ being on a line $\pi_L$ passing through a center point $\pi_{CO}$ of the circle $\pi_C$ and perpendicular to the plane π, or may be a spherical surface $S_{\pi 2}$ that has, as the center, a center point $x_{\pi 2}$ different from the center point $x_{\pi 1}$ being on the line $\pi_L$. Thus, it is possible to identify that a center point $x_0$ is on the line $\pi_L$ passing through the center point $\pi_{CO}$ of the circle $\pi_C$ and perpendicular to the plane π, but it is not possible to specify where on the line $\pi_L$ the center point $x_0$ is.

In a case in which the device 1 changes its orientation in right-and-left direction like an automobile or another moving body does and in a case in which the device 1 is moved by a hand of a user like a mobile phone or another portable device is but its movement is insufficient, the change in orientation of the device 1 sometimes turns out to be not three-dimensional but two-dimensional. In this case, because, in the sensor coordinate system $\Sigma_S$, the distribution of plural sets of coordinates indicated by plural pieces of magnetic data $q_1$ to $q_N$ does not have a three-dimensional extent but spreads two-dimensionally, it is not possible to calculate a center point $x_0$ based on the plural pieces of magnetic data $q_1$ to $q_N$.

In a case in which, due to effects such as measurement errors of the three-dimensional magnetic sensor 60, plural pieces of magnetic data $q_1$ to $q_N$ slightly have a three-dimensional extent, a center point $x_\pi$ of some sort of a spherical surface Sπ having the plural pieces of magnetic data $q_1$ to $q_N$ adjacent thereto is calculated. However, this center point $x_\pi$ is one that has coordinates stochastically determined due to the effects of measurement errors included in the plural pieces of magnetic data $q_1$ to $q_N$. It is highly probable that the center point $x_\pi$ differs from a center point $x_0$ of a spherical surface S having plural pieces of magnetic data measured if the change in orientation of the device 1 is three-dimensional. For example, in a case in which, as shown in FIG. 6, the pieces of magnetic data $q_1$ to $q_N$ are distributed on the plane π with errors in a vertical direction, even if the center point $x_{\pi 1}$ of the spherical surface $S_{\pi 1}$ is calculated from the plural pieces of magnetic data $q_1$ to $q_N$, the center point $x_{\pi 2}$ of the spherical surface $S_{\pi 2}$ may be a center point $x_0$ of a spherical surface S in reality. A center point $x_\pi$ having such inaccurate coordinates cannot be employed as an offset c.

As shown in FIG. 6, even if the plural pieces of magnetic data $q_1$ to $q_N$ are distributed two-dimensionally, it is possible to determine that a center point $x_0$ of a spherical surface S having the plural pieces of magnetic data adjacent thereto, is on the line $\pi_L$, with the plural pieces of magnetic data being measured in a case in which the change in orientation of the device 1 is three-dimensional.

In other words, from among information on the center point $x_\pi$ calculated based on the plural pieces of magnetic data $q_1$ to $q_N$ distributed two-dimensionally on the plane n, information on a vertical direction (i.e., a line $\pi_L$ direction) with respect to the plane π has little accuracy, whereas information on a parallel direction with respect to the plane π has accuracy.

Therefore, from among information of the center point $x_\pi$, information on a direction with accuracy (i.e., information that a center point $x_0$ as a candidate for an offset c is on the line $\pi_L$) can be used in calculating an offset c.

Figure 7:
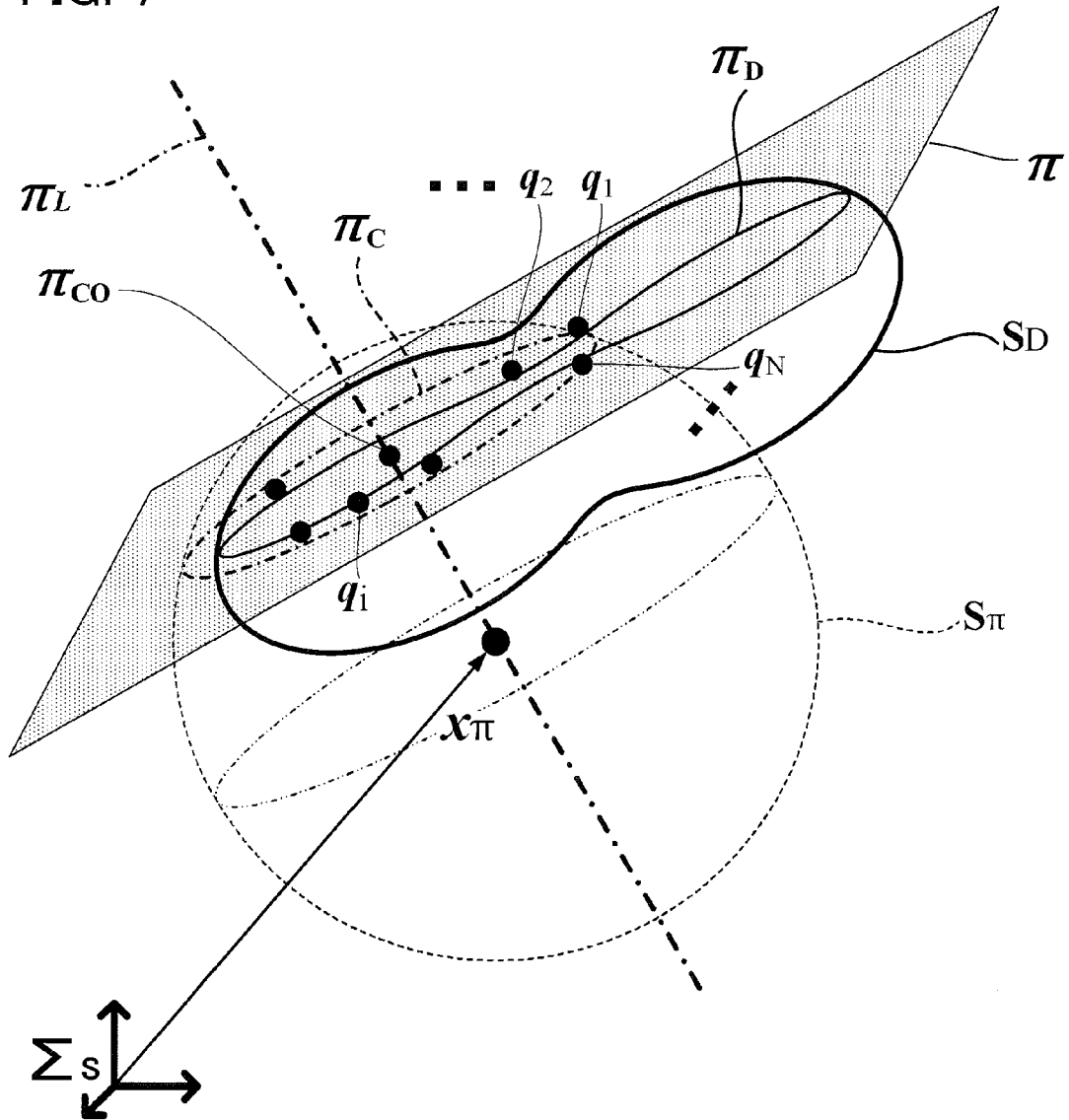
FIG. 7 is a conceptual diagram for explaining a case in which plural sets of coordinates represented by plural magnetic data pieces detected by the three-dimensional magnetic sensor are distributed in a plane in a two-dimensional manner and are distributed near a curve having a distorted shape different from a circumference of a circle according to an embodiment of the present invention.

FIG. 7 shows a case in which the effects of a non-uniform external magnetic field Bx are large, in which a three-dimensional figure SD has a shape greatly differing from a spherical surface, and in which pieces of magnetic data $q_1$ to $q_N$ sequentially output from the three-dimensional magnetic sensor 60 are distributed two-dimensionally on a plane π.

In this case, assuming that the plural pieces of magnetic data $q_1$ to $q_N$ are adjacent to a circumference $\pi_C$, it would be possible to identify that a center point $x_0$ of a spherical surface S is on a line $\pi_L$ passing through a center point $\pi_{CO}$ of the circumference $\pi_C$ and perpendicular to the plane π. However, in a case in which the three-dimensional figure SD has a distorted shape that is greatly different from a spherical surface, the plural pieces of magnetic data $q_1$ to $q_N$ adjacent to the surface of the three-dimensional figure SD are not adjacent to a spherical surface S. Therefore, it is highly likely that a center point $x_0$ does not coincide with a center point $x_{0G}$ of a spherical surface $S_G$ representing a geomagnetic field Bg, the center point $x_0$ being calculated assuming that the plural pieces of magnetic data $q_1$ to $q_N$ are adjacent to the circumference $\pi_C$ that is a plane of a section, which is cut by the plane π, of the spherical surface S. Even if the center point $x_0$ is on the line $\pi_L$, it is highly likely that the center point $x_{0G}$ is not on the line $\pi_L$.

Thus, even if plural pieces of magnetic data $q_1$ to $q_N$ are distributed two-dimensionally, and even if it is possible to identify that a center point $x_0$ of a spherical surface S is on the line $\pi_L$, employing the center point $x_0$ as an offset c needs to be avoided in a case in which the effects of an external magnetic field Bx are large and in which a center point $x_{0G}$ of a spherical surface $S_G$ representing a geomagnetic field Bg does not coincide with the center point $x_0$ of the spherical surface S.

It is to be noted that, in a case in which plural pieces of magnetic data $q_1$ to $q_N$ are distributed two-dimensionally on a plane π, it is difficult to know a three-dimensional shape of a three-dimensional figure SD.

However, in a case in which a three-dimensional figure SD has a distorted shape greatly differing from a spherical surface, it is highly likely that a curve $\pi_D$ representing a plane of a section, which is cut by the plane π, of the three-dimensional figure SD, has a distorted shape differing from a circumference. Therefore, assuming that plural pieces of magnetic data $q_1$ to $q_N$ are distributed adjacent to the curve $\pi_D$, representing a plane of a section, which is cut by the plane π, of the three-dimensional figure SD, evaluating the degree of distortion in the shape of the curve $\pi_D$ allows to determine the degree of difference between the shape of the three-dimensional figure SD and the shape of the spherical surface. In a case in which the shape of the curve $\pi_D$ has a shape that is different from the circumference and is greatly distorted, it is highly probable that the three-dimensional figure SD has a shape different from the spherical surface and that a center point $x_{0G}$ of a spherical surface $S_G$ representing a geomagnetic field Bg does not coincide with a center point $x_0$ of a spherical surface S. Accordingly, in a case in which a curve $\pi_D$ has a distorted shape differing from a circumference, even if a center point $x_0$ of a spherical surface S can be identified to be on a line $\pi_L$, employing the center point $x_0$ of the spherical surface S as an offset c needs to be avoided. On the other hand, in a case in which the shape of a curve $\pi_D$ can be considered as a circumference with no distortion, it can be considered that the curve $\pi_D$ almost coincides with a circumference $\pi_C$. In this case, it can be considered that a three-dimensional figure SD almost coincides with a spherical surface S, and a center point $x_0$ of the spherical surface S can be employed as an offset c.

In the present embodiment, for both of a case in which plural pieces of magnetic data $q_1$ to $q_N$ are distributed with a three-dimensional extent and a case in which plural pieces of magnetic data $q_1$ to $q_N$ are two-dimensionally distributed, the magnitude of the effects of an external magnetic field Bx are estimated based on plural pieces of magnetic data $q_1$ to $q_N$, i.e., the degree of difference in shape between a three-dimensional figure SD and a spherical surface, is estimated. Based on this result of the estimation, it is determined whether to employ a center point $x_0$ of a spherical surface S as an offset c.

In the following, a description will be given of specific examples of a method of calculating a center point $x_0$ of a spherical surface S and a method of determining whether to employ a center point $x_0$ as an offset c according to the present embodiment.

4. Device Configuration and Software Configuration

Figure 8:
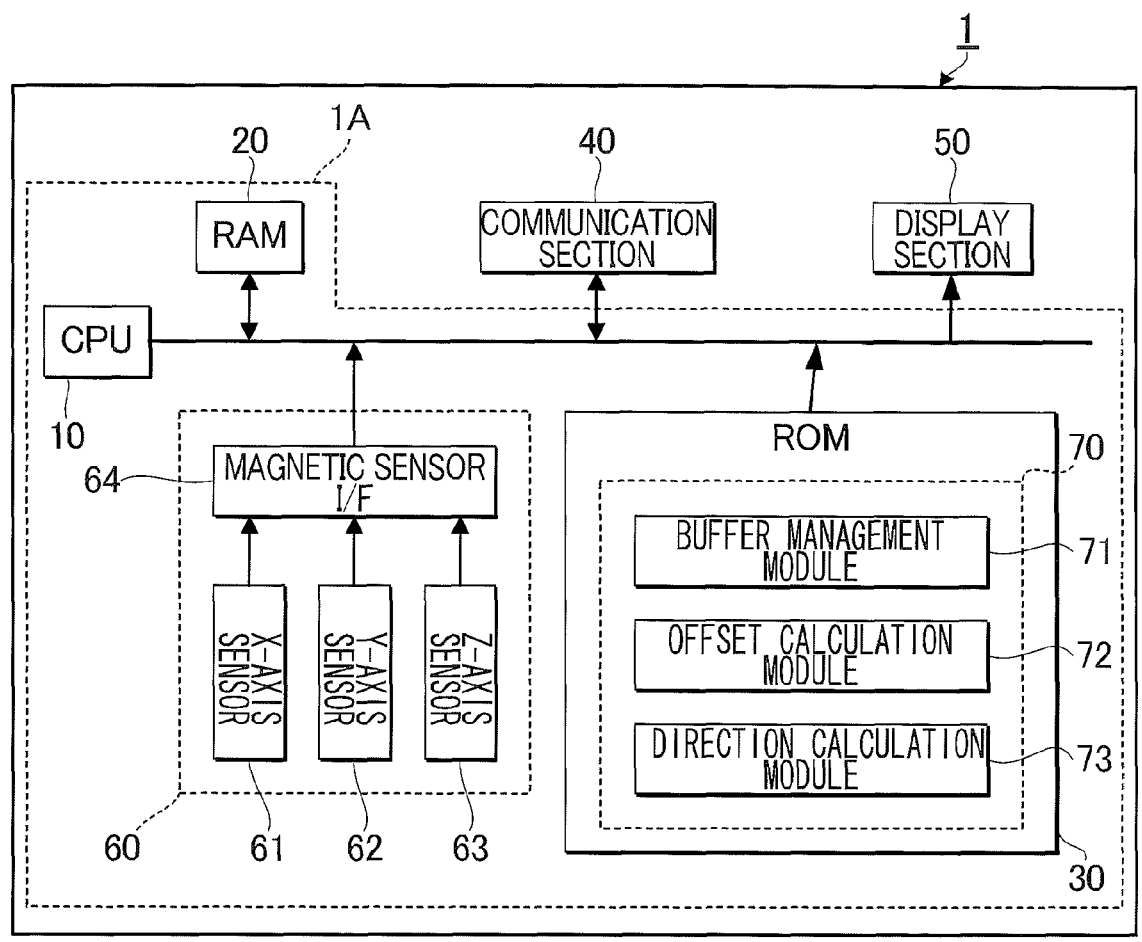
FIG. 8 is a block diagram showing a configuration of a device in which a three-dimensional magnetic sensor is mounted according to an embodiment of the present invention.

FIG. 8 is a block diagram showing a configuration of a device 1 according to an embodiment of the present invention.

The device 1 has a CPU 10 that is connected to various elements via a bus and that controls the entire device, a RAM 20 that serves as a work area of the CPU 10, a ROM 30 that stores therein various computer programs and pieces of data, a communication section 40 that performs communication, a display section 50 that displays images, and a three-dimensional magnetic sensor 60 that detects a geomagnetic field and that outputs geomagnetic data.

The three-dimensional magnetic sensor 60 has an x-axis geomagnetic sensor (x-axis sensor) 61, a y-axis geomagnetic sensor (y-axis sensor) 62, and a z-axis geomagnetic sensor (z-axis sensor) 63. Each sensor may be configured with an MI element (Magnetic Impedance element), an MR element (Magnetoresistance effect element), or another type of appropriate element. A geomagnetic sensor I/F 64 AD-converts an output signal from each sensor and outputs magnetic data. This magnetic data is data that indicates, by three components along the x-axis, y-axis, and z-axis of a sensor coordinate system $\Sigma_S$, the outputs from the x-axis geomagnetic sensor 61, the y-axis geomagnetic sensor 62, and the z-axis geomagnetic sensor 63 as vector data with respect to the sensor coordinate system $\Sigma_S$. Preferably, the three-dimensional magnetic sensor 60 may be mounted in the device 1 so that the x-axis geomagnetic sensor 61, the y-axis geomagnetic sensor 62, and the z-axis geomagnetic sensor 63 are orthogonal to one another.

The CPU 10 runs and executes a magnetic data processing program 70 stored in the ROM 30, thereby calculating an offset from the output data from the three-dimensional magnetic sensor 60 and calculating the direction and the magnitude of a geomagnetic field.

The display section 50 displays, by an arrow or by another appropriate direction pointer, direction information indicating the direction of a geomagnetic field calculated by the CPU 10 having executed the magnetic data processing program 70. It is to be noted that the magnetic data processing program 70 may run in cooperation with a map application program or another appropriate application program. The display section 50 may display on a map the direction information such as an arrow indicating the direction of a geomagnetic field.

The CPU 10, the RAM 20, the three-dimensional magnetic sensor 60, and the magnetic data processing program 70 serve as a geomagnetic field measurement device 1A for calculating the direction and magnitude of, or the direction of, an accurate geomagnetic field based on pieces of magnetic data detected by the three-dimensional magnetic sensor 60. This geomagnetic data is data that represents, by three components along the x-axis, y-axis, and z-axis of the sensor coordinate system $\Sigma_S$, a vector having a horizontal component towards the magnetic north pole and a vertical component in the direction of magnetic dip (elevation angle) in the ground coordinate system $\Sigma_G$ as vector data viewed from the sensor coordinate system $\Sigma_S$.

The magnetic data processing program 70 is composed of a group of modules including a buffer management module 71, an offset calculation module 72, a direction calculation module 73, etc.

The magnetic data processing program 70 calculates an offset c, and calculates accurate geomagnetic data based on this offset c and plural pieces of magnetic data detected by the three-dimensional magnetic sensor 60.

It is to be noted that the offset c does not always take fixed coordinates. That is, the offset c needs to be changed as necessary. This is because an internal magnetic field Bi changes in a case in which the internal state of the device 1 has changed, for example, in a case in which the magnitude of a current that flows through parts mounted in the device 1 has changed, or in a case in which magnetization of parts mounted in the device 1 has changed. Assuming such a change in the internal magnetic field Bi, an accurate geomagnetic field Bg can be measured by updating, as necessary, an offset c that is a vector representing the internal magnetic field Bi. In the following description on the updating of an offset c, for simplicity, an offset c that has not yet updated is referred to as an old offset $c_0$, and an updated offset c will be referred to as a new offset $c_1$.

The buffer management module 71 stores pieces of magnetic data $q_1$ to $q_N$ sequentially output from the three-dimensional magnetic sensor 60 in a buffer (N is a natural number of at least 4, representing the prescribed number for measuring magnetic data necessary for deriving an offset with high accuracy). The RAM 20 is used as a storage means or a storage device for storing these plural pieces of magnetic data $q_1$ to $q_N$.

The offset calculation module 72 calculates a new offset $c_1$ by using plural pieces of magnetic data $q_1$ to $q_N$ stored by the buffer management module 71, and updates an offset c from an old offset $c_0$ to the new offset $c_1$. The RAM 20 is used as a retaining means or a retaining section for retaining an offset c.

The Direction calculation module 73 corrects a piece of magnetic data $q_i$ sequentially output from the three-dimensional magnetic sensor 60 by an offset c retained by the offset calculation module 72, to calculate accurate geomagnetic data, and generates direction information. The direction calculation module 73 calls at appropriate intervals the buffer management module 71 and the offset calculation module 72, to give an instruction to update an offset.

5. Flow of Process

Figure 9:
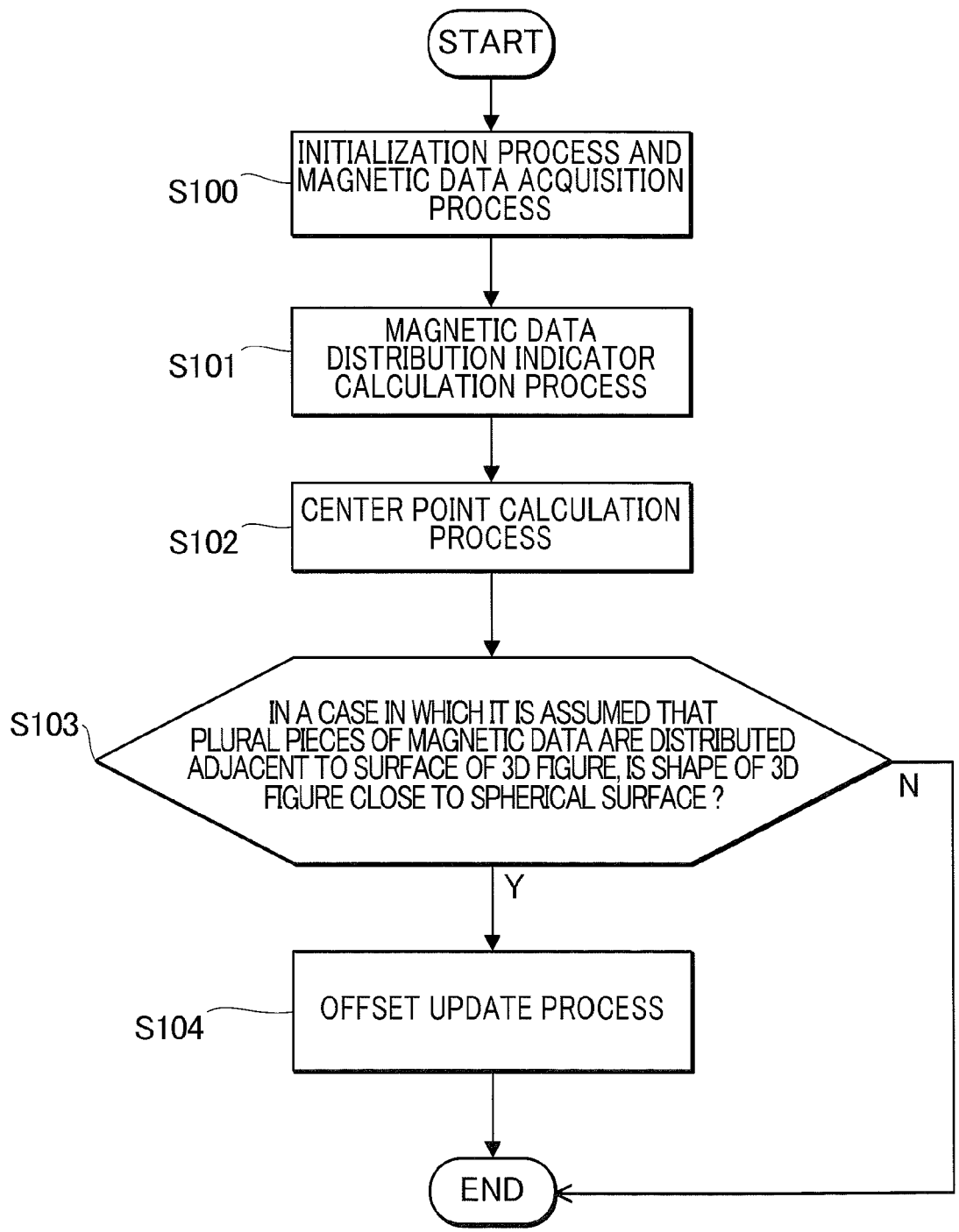
FIG. 9 is a flowchart showing a procedure of a process according to an embodiment of the present invention.

FIG. 9 is a flowchart showing a flow of a process for calculating an offset c. This flowchart is performed in a case in which the direction calculation module 73 calls the buffer management module 71 and the offset calculation module 72, to give an instruction to update an offset. The direction calculation module 73 gives an instruction to update an offset in a case in which updating of an offset c is required in such a case in which an instruction from a superior computer program is received.

In Step S100, the CPU 10 performs an initialization process and a magnetic data acquisition process. In the initialization process, the CPU 10 calls the buffer management module 71, and discards pieces of magnetic data stored in the RAM 20. Although in the present embodiment all pieces of magnetic data are discarded, only a certain percentage of pieces of data stored in the RAM 20 from older items may be discarded instead. In the magnetic data acquisition process, N number of pieces of magnetic data $q_1$ to $q_N$ output from the three-dimensional magnetic sensor 60 are stored in the RAM 20.

In Step S101, the CPU 10 performs a magnetic data distribution indicator calculation process. Thus, the CPU 10 serves as a distribution indicator calculation section (or distribution indicator calculation means). The magnetic data distribution indicator calculation process is a process for calculating indicators, based on the N number of pieces of magnetic data $q_1$ to $q_N$ stored in the RAM 20 in Step S100, the indicators showing the extent of distribution of plural sets of coordinates indicated by the N number of pieces of magnetic data $q_1$ to $q_N$ in the sensor coordinate system $\Sigma_S$. Specifically, in the magnetic data distribution indicator calculation process, the CPU 10 calculates a covariance matrix A representing a variance of the N number of pieces of magnetic data $q_1$ to $q_N$, and calculates eigenvalues $\lambda_1$ to $\lambda_3$ and eigenvectors $u_1$ to $u_3$ of the covariance matrix A. It is to be noted in the following description, from among the indicators showing the extent of distribution, the eigenvalue $\lambda_3$, in particular, will be sometimes called "a distribution indicator".

As a result, it is possible to know what degree of extent the sets of coordinates indicated respectively by the N number of pieces of magnetic data $q_1$ to $q_N$ have, for each of the eigenvectors $u_1$ to $u_3$ directions in the sensor coordinate system $\Sigma_S$.

In Step S102, the CPU 10 performs a center point calculation process. Thus, the CPU 10 serves as a center point calculation section (or center point calculation means).

In the center point calculation process, a center point $x_0$ of a spherical surface S defined assuming that the spherical surface S has the plural sets of coordinates indicated by the N number of pieces of magnetic data $q_1$ to $q_N$ adjacent thereto is calculated based on the N number of pieces of magnetic data $q_1$ to $q_N$ obtained in Step S100 and the indicators obtained in Step S101. The center point $x_0$ indicates a set of coordinates as a candidate for a new offset $c_1$ in updating an offset c from an old offset $c_0$ to a new offset $c_1$.

In Step S103, the CPU 10 performs a distortion determination process. Thus, the CPU 10 serves as a distortion determination section (or distortion determination means).

The distortion determination process is a process of determining, based on the N number of pieces of magnetic data $q_1$ to $q_N$ obtained in Step S100, the various distribution indicators obtained in Step S101, and the center point $x_0$ calculated in Step S102, whether the shape of the distribution for the N number of pieces of data is one adjacent to a spherical surface, such as shown in the above-described FIGS. 2 and 4, the spherical surface having a certain point as the center. In other words, the distortion determination process is a process for determining the degree of a difference between the shape of a certain three-dimensional figure SD and the shape of a spherical surface, in a case in which it is assumed that the N-number of pieces of magnetic data $q_1$ to $q_N$ are distributed adjacent to a surface of the three-dimensional figure SD.

In a case in which it is determined that the shape of the three-dimensional figure SD can be regarded as a spherical surface, i.e., in a case in which it is determined that the N number of pieces of magnetic data $q_1$ to $q_N$ are distributed adjacent to a surface of a three-dimensional figure having a shape approximate to a spherical surface such as shown in FIGS. 2 and 4, the CPU 10 advances the process to Step S104. On the other hand, in a case in which the three-dimensional figure SD has a greatly distorted shape differing from a spherical surface, the CPU 10 ends the process shown in the flowchart.

In Step S104, the CPU 10 performs an offset update process. Thus, the CPU 10 serves as an offset update section (or offset update means).

The offset update process is a process of updating an offset c from an old offset $c_0$ to a new offset $c_1$ after employing the center point $x_0$ as the new offset $c_1$. After updating the offset c, the CPU 10 ends the process shown in the flowchart.

In the present embodiment, in Step S103, in a case in which it is determined that the three-dimensional figure SD has a greatly distorted shape different from a spherical surface, the CPU 10 ends the process shown in the flowchart, but the present invention is not limited thereto.

For example, in Step S103, in a case in which it is determined that the three-dimensional figure SD has a greatly distorted shape differing from a spherical surface, the CPU 10 may return the process to Step S100, or may temporarily stop the process after outputting some kind of message on the display section 50, to restart the process from Step S100 after receiving an instruction from a user.

In obtaining the N number of pieces of magnetic data $q_1$ to $q_N$, the effects from an external magnetic field Bx can be suppressed to a low level if the user, instead of rotating the device 1 while holding the device 1 in the hand, changes only an orientation of the device 1 without moving a position thereof (see FIG. 4B). Therefore, in Step S103, in a case in which it is determined that the three-dimensional figure SD has a greatly distorted shape differing from a spherical surface, the CPU 10 may give an instruction to the user to rotate the device 1 without moving the position thereof. The instruction to the user may be given by displaying, on the display section 50 of the device 1, images, moving images, etc., or by using sounds, etc. Thus, the CPU 10 and the display section 50 serve as a section that prompts (or means arranged to prompt) a user to change an orientation of a device without changing a position of the device in a case in which it is determined that there is distortion. In this case, the display section 50 serves as a part of the geomagnetic field measurement device 1A.

In the following, a description will be given in further detail of the magnetic data distribution indicator calculation process, the center point calculation process, the distortion determination process, and the offset update process performed by the CPU 10 in Steps S101 to S104.

6. Magnetic Data Distribution Indicator Calculation Process

Figure 10:
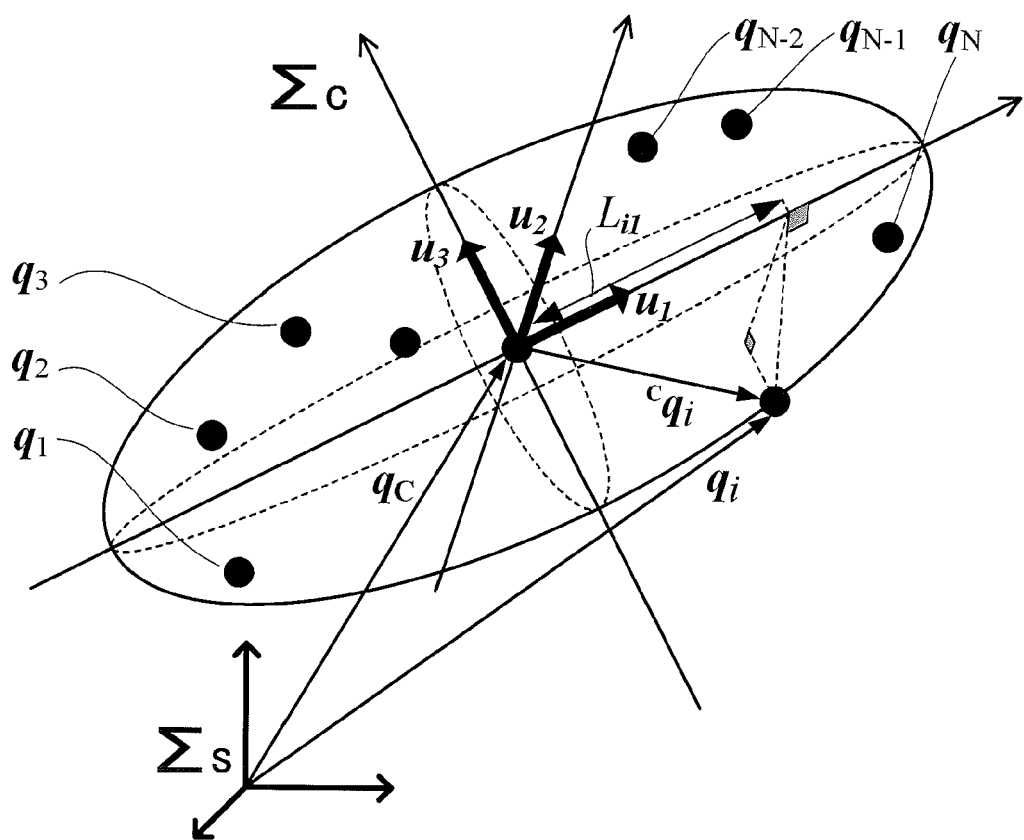
FIG. 10 is a conceptual diagram for explaining a magnetic data distribution indicator calculation process according to an embodiment of the present invention.

A description will be given of the magnetic data distribution indicator calculation process in Step S101 with reference to FIG. 10. FIG. 10 is a diagram showing how plural pieces of magnetic data $q_1$ to $q_N$ are distributed in the sensor coordinate system $\Sigma_S$, and shows an example in which the plural pieces of magnetic data $q_1$ to $q_N$ are distributed in a three-dimensional extent.

In the magnetic data distribution indicator calculation process, the CPU 10 calculates, with use of a covariance matrix A indicated as Equation (21), indicators as to what degree the distribution of the plural pieces of magnetic data $q_1$ to $q_N$ has a three-dimensional extent, i.e. as to how much distribution of the plural pieces of magnetic data $q_1$ to $q_N$ spreads three-dimensionally. In the following, a description will be given of the nature of the covariance matrix A.

The covariance matrix A is a 3-by-3 symmetric matrix, and has three eigenvalues and three eigenvectors orthogonal to one another. The eigenvalues of the covariance matrix A are denoted in descending order by a maximum eigenvalue $\lambda(\text{lambda})_1$, an intermediate eigenvalue $\lambda_2$, and a minimum eigenvalue $\lambda_3$, and eigenvectors normalized to the magnitude of 1 are denoted by $u_1$, $u_2$, and $u_3$, the eigenvectors corresponding to the respective eigenvalues. A vector expressing a piece of magnetic data $q_i$ in the above-described barycentric coordinate system $\Sigma_C$ having the center of gravity $q_C$ as the origin is denoted by ${}^C q_i$, wherein an eigenvalue $\lambda_j$ (j=1, 2, 3) is equal to a variance $\sigma(\text{sigma})^2_j$ of an eigenvector $u_j$ direction.

As shown in FIG. 10, each eigenvector $u_1$ to $u_3$ is located so that the origin $q_C$ of the barycentric coordinate system $\Sigma_C$ is the starting point. Here, we assume, for example, a case in which j=1. The eigenvalue $\lambda_1$ is equal to a value of the second power $(L_{i1})^2$ of length $L_{i1}$ of the projection of the vector $^Cq_i$ onto the eigenvector $u_1$, averaged for the N number of pieces of magnetic data $^Cq_i$ (i=1, 2, ... N). Thus, the eigenvalue $\lambda_1$ is an indicator representing to what degree the N number of pieces of magnetic data $^Cq_i$ is distant from the center of gravity $q_C$ in the direction of the eigenvector $u_1$. The degree of the extent, in the direction of the eigenvector $u_j$, for the distribution of the plural pieces of magnetic data $q_1$ to $q_N$ can be determined based on the magnitude of a corresponding eigenvalue $\lambda_j$.

In a case in which the direction of the eigenvector $u_3$ corresponding to the minimum eigenvalue $\lambda_3$ is a direction in which the distribution of the plural pieces of magnetic data $q_1$ to $q_N$ is the smallest, the minimum eigenvalue $\lambda_3$ is an indicator showing the degree of the extent in a direction in which the extent of distribution of the plural pieces of magnetic data $q_1$ to $q_N$ is the smallest. Therefore, the degree of three-dimensional extent for the distribution of the plural pieces of magnetic data $q_1$ to $q_N$ can be estimated by the value of the minimum eigenvalue $\lambda_3$. In a case in which the value of the minimum eigenvalue $\lambda_3$ is large, the plural pieces of magnetic data $q_1$ to $q_N$ are distributed in a manner having a three-dimensional extent, whereas in a case in which the value of the minimum eigenvalue $\lambda_3$ is small, the plural pieces of magnetic data $q_1$ to $q_N$ are distributed two-dimensionally.

Thus, in the magnetic data distribution indicator calculation process, the eigenvector $u_3$ and the minimum eigenvalue $\lambda_3$ of the covariance matrix A shown in Equation (21) are used to calculate the direction in which the extent of the distribution for the plural pieces of magnetic data $q_1$ to $C_N$ in the sensor coordinate system $\Sigma_S$ is the smallest, and as well as to calculate the degree of the extent for the direction in which the extent is the smallest.

7. Center Point Calculation Process

A description will be next given of the center point calculation process of Step S102.

As described above, because an internal magnetic field Bi changes in a case in which the internal state of the device 1 changes, an offset c representing the internal magnetic field Bi needs to be updated as necessary. The center point calculation process is a process of calculating a center point $x_0$, which is a candidate for a new offset $c_1$, in updating this offset c from an old offset $c_0$ to a new offset $c_1$.

Figure 11:
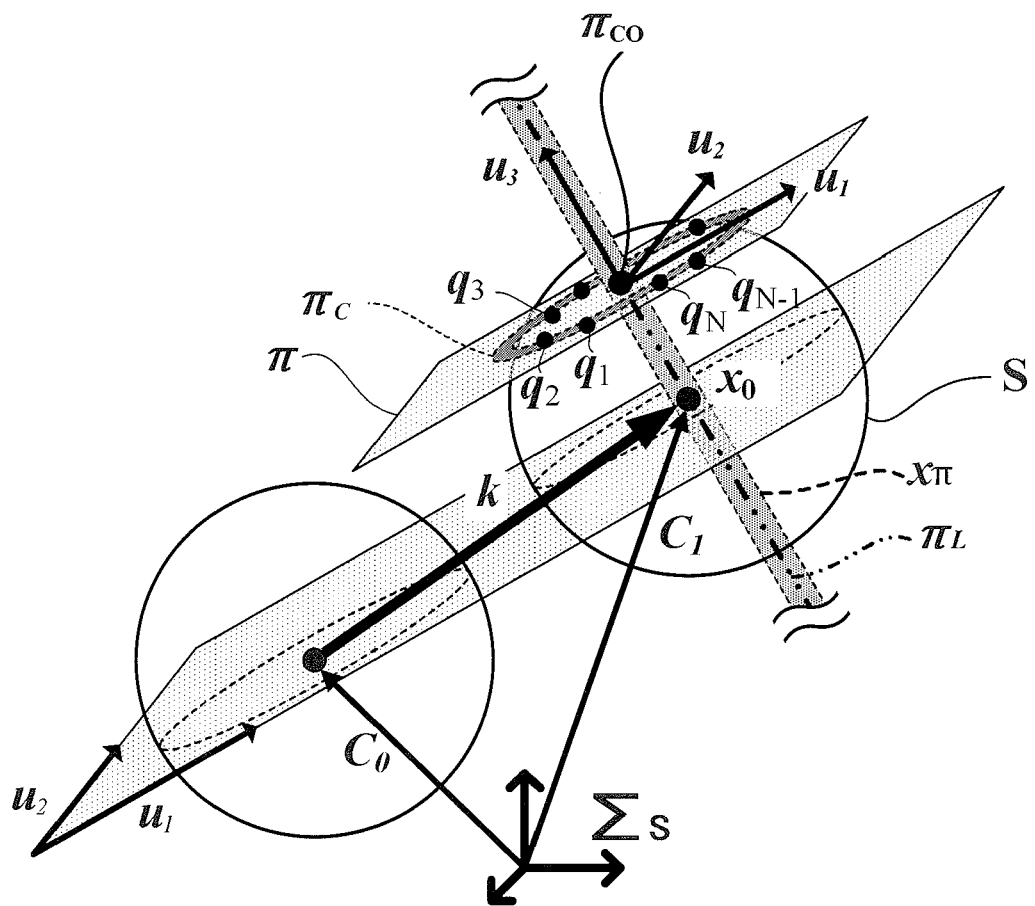
FIG. 11 is a conceptual diagram for explaining a center point calculation process according to an embodiment of the present invention.

As shown in FIG. 11, during a given period, even in a case in which plural pieces of magnetic data $q_1$ to $q_N$ output from the three-dimensional magnetic sensor 60 are distributed two-dimensionally on a plane $\pi$, if they are distributed slightly three-dimensionally due to the effects of measurement errors, a center point $x_\pi$ of a spherical surface $S\pi$ is calculated. The spherical surface $S\pi$ is defined based on the plural pieces of magnetic data $q_1$ to $q_N$, assuming that the spherical surface $S\pi$ has plural sets of coordinates indicated by the plural pieces of magnetic data $q_1$ to $q_N$ adjacent thereto. Be cause such center point $x_\pi$ is one that has coordinates stochastically calculated due to measurement errors of respective pieces of magnetic data $q_1$ to $q_N$, it is highly likely that the center point $x_\pi$ is different from a center point $x_0$ of a spherical surface S defined based on the plural pieces of magnetic data adjacent thereto. The plural pieces of magnetic data are those that would be measured if, during the period, the orientation of the device 1 was changed three-dimensionally.

However, it is possible to identify that the center point $x_0$ of the spherical surface S is on a line $\pi_L$ passing through the center point $x_\pi$ and perpendicular to the plane $\pi$. From among information on coordinates of the center point $x_\pi$, information on a direction parallel to the line $\pi_L$ is inaccurate, but information on a direction vertical to the line $\pi_L$ is accurate. Therefore, in a case in which an offset c as of before the period was started (old offset $c_0$) is not on line $\pi_L$, more accurate geomagnetic field Bg can be calculated by performing a correction process of updating the offset c from an old offset $c_0$ to a new offset $c_1$ that is on the line $\pi_L$, compared with a case in which the offset c is not updated from the old offset $C_0$.

In the center point calculation process, in estimating the center point $x_0$, for information on a direction that is highly accurate among information on coordinates indicated by the center point $x_\pi$, the information of the center point $x_\pi$ is used (i.e., information calculated from the plural pieces of magnetic data $q_1$ to $q_N$ output from the three-dimensional magnetic sensor 60 during the period is used), and, information of the old offset $c_0$ is used for information on a direction with low accuracy among the information on the coordinates indicated by the center point $x_\pi$. Accordingly, the center point $x_0$ can be obtained only based on accurate information by removing inaccurate information from the information on the coordinates of the center point $x_\pi$. A vector $(x_0 - c_0)$ from the old offset $C_0$ pointing to the center point $x_0$ will be referred to as a renewal vector (renewal vector for center point calculation) k.

As shown in FIG. 11, in a case in which the plural pieces of magnetic data $q_1$ to $q_N$ are distributed two-dimensionally on the plane $\pi$ and the distribution of the plural pieces of magnetic data $q_1$ to $q_N$ does not spread in the direction of the line $\pi_L$, the direction of the line $\pi_L$ coincides with the direction indicated by the eigenvector $u_3$ of the covariance matrix A. Therefore, from among the information on the coordinates of the center point $x_\pi$, information on the direction of the eigenvector $u_3$ is inaccurate information. The plane $\pi$ is parallel to the direction indicated by the eigenvectors $u_1$ and $u_2$ of the covariance matrix A. Therefore, from among the information indicated by the coordinates of the center point $x_\pi$, the information on the direction of the eigenvector $u_1$ and the direction of the eigenvector $u_2$ are accurate information.

A renewal vector k is a vector for calculating the center point $x_0$ by using information on the direction that is accurate from among information on the coordinates of the center point $x_\pi$. Therefore, in a case in which the plural pieces of magnetic data $q_1$ to $q_N$ are distributed two-dimensionally, the renewal vector k is determined so that the vector has no component for the direction of the eigenvector $u_3$. In other words, the renewal vector k is expressed as a linear combination of the eigenvectors $u_1$ and $u_2$. In this case, the following Equation (22) will hold between the renewal vector k and the eigenvector $u_3$.

$$u_3^T k = 0 \qquad (22)$$

A constraint shown in Equation (22) is a constraint representing a case in which the distribution of the plural pieces of magnetic data $q_1$ to $q_N$ has no three-dimensional extent and is of a completely flattened shape, i.e., a case in which the distribution has no extent in the direction of the eigenvector $u_3$, and is completely two-dimensional.

On the other hand, in a case in which the distribution of the plural pieces of magnetic data $q_1$ to $q_N$ is not flattened completely and has an extent in the direction of the eigenvector $u_3$, it is not that the properties of coordinates of the center point $x_\pi$ for the direction of the eigenvector $u_3$ is completely missing. In this case, the renewal vector k and the eigenvector $u_3$ do not have to be completely orthogonal, and it is favorable if the constraint shown in Equation (22) is loosened. Accordingly, in the present embodiment, the constraint shown in Equation

(22) is loosened depending on the magnitude of extent, in the direction of the eigenvector $u_3$, of the distribution of points indicated by the sets of coordinates indicated by the pieces of magnetic data $q_1$ to $q_N$ (i.e., the magnitude of the minimum eigenvalue $\lambda_3$ of the covariance matrix A).

To loosen the constraint shown in Equation (22), we introduce an error (third error) $\delta_U$ shown in Equation (23). The error $\delta_U$ is a product of inner product $\epsilon$(epsilon)$_3$ shown in Equation (24) and a coefficient (first coefficient) $\alpha$ (alpha). The inner product $\epsilon_3$ is an inner product of the renewal vector k and the eigenvector $u_3$. The inner product $\epsilon_3$ will be zero in a case in which the renewal vector k and the eigenvector $u_3$ are mutually orthogonal, but otherwise, will be a value other than zero.

It is to be noted that the renewal vector k is a position vector expressed with the old offset $c_0$ as the starting point, the position vector representing a position indicated by a vector x which is a variable for obtaining the position of the center point $x_0$. For simplicity of calculation and to be consistent with Equation (13), the renewal vector k is expressed as a position vector when the vector x and the old offset $c_0$ are viewed from the center of gravity $q_c$ as shown in Equation (25).

$$\delta_U = \alpha \epsilon_3 \tag{23}$$

$$\text{where } \epsilon_3 = u_3^T k \tag{24}$$

$$k = (x - q_C) - (c_0 - q_C) \tag{25}$$

A coefficient $\alpha$ in Equation (23) is a coefficient for loosening the constraint shown in Equation (22).

We consider determining the renewal vector k by reducing the error $\delta_U$ to zero or a small value close to zero. In a case in which the renewal vector k and the eigenvector $u_3$ are not mutually orthogonal, the inner product $\epsilon_3$ will have a large value. In a case in which the coefficient $\alpha$ is set to a sufficiently small value (for example, zero or a small value close to zero), even if the inner product $\epsilon_3$ has a large value, it is possible to reduce the error $\delta_U$ close to zero or a small value close to zero. On the other hand, in a case in which the coefficient $\alpha$ is set to a large value, it is not possible to reduce the error $\delta_U$ to zero or a small value close to zero unless the inner product $\epsilon_3$ turns out to be zero or a small value close to zero by the renewal vector k and the eigenvector $u_3$ being mutually orthogonal.

Thus, in Equation (23), when reducing the error $\delta_U$ to zero or a small value close to zero by setting the coefficient $\alpha$ to zero or a small value close to zero, a constraint requiring that the renewal vector k and the eigenvector $u_3$ be mutually orthogonal shown in Equation (22) is loosened. On the other hand, in Equation (23), when reducing the error $\delta_U$ to zero or a small value close to zero by setting the coefficient $\alpha$ to a large value, Equation (23) will be an equation that gives the same constraint as Equation (22).

In the present embodiment, the coefficient $\alpha$ has a positive value, and is determined as a function of the eigenvalue $\lambda_3$ such as shown in the following Equation (26), where a constant $k_\alpha$ of Equation (26) is a real number satisfying $k_\alpha > 0$. In a case in which the eigenvalue $\lambda_3$ is a large value, the coefficient $\alpha$ turns out to be a small value close to zero. In a case in which the eigenvalue $\lambda_3$ is a small value, the coefficient $\alpha$ turns out to be a large value close to 1.

$$\alpha = e^{-k_\alpha \lambda_3} \tag{26}$$

To calculate a center point $x_0$ that minimizes the error $\delta_S$ shown in Equation (17) and the error $\delta_U$ shown in Equation (23), we introduce an objective function (center point calculation function) gs(x) shown in Equation (27). The objective function gs(x) is a function representing the magnitude of a vector (center point calculation vector) $\delta_{SU}$. The vector $\delta_{SU}$, as shown in Equation (28), is a vector of (N+1)-dimension, having the error $\delta_S$ and the error $\delta_U$ as elements.

In a case in which the distribution of the plural pieces of magnetic data $q_1$ to $q_N$ spreads two-dimensionally, feasible coordinates can be calculated, by minimizing the error $\delta_S$, of the center point $x_\pi$ of the spherical surface S$\pi$, which is defined based on the plural pieces of magnetic data $q_1$ to $q_N$, assuming that the spherical surface S$\pi$ has plural sets of coordinates indicated by the plural pieces of magnetic data $q_1$ to $q_N$ adjacent thereto. By additionally minimizing the error $\delta_U$, coordinates that are feasible as the center point $x_0$ can be calculated with the use of only information on a direction with high accuracy, from among information on coordinates indicated by the center point $x_\pi$.

In a case in which the distribution of the plural pieces of magnetic data $q_1$ to $q_N$ spreads three-dimensionally, the coefficient $\alpha$ is set to zero or a small value close to zero. Therefore, even if the error $\delta_U$ is minimized, the constraint shown in Equation (22) is loosened and does not function well (or does not function perfectly).

Therefore, by calculating x that minimizes the objective function gs(x), coordinates feasible as the center point $x_0$ of the spherical surface S (second spherical surface), which is defined based on the plural pieces of magnetic data $q_1$ to $q_N$, assuming that the spherical surface S has plural sets of coordinates indicated by the plural pieces of magnetic data $q_1$ to $q_N$ adjacent thereto, can be obtained for both cases of the distribution of the plural pieces of magnetic data $q_1$ to $q_N$ spreading two-dimensionally and three-dimensionally.

$$g_S(x) = \|\delta_{SU}\|_2 \tag{27}$$

$$\text{where } \delta_{SU} = \begin{bmatrix} \delta_S \\ \delta_U \end{bmatrix} \tag{28}$$

In the following, a description will be given of a method of calculating a solution x (=center point $x_0$) that minimizes the objective function gs(x). The vector $\delta_{SU}$ is transformed as shown in Equation (29) by substituting Equations (17), (23) to (25) into Equation (28), wherein a matrix $X_S$ is a (N+1)-by-3 matrix such as shown in Equation (30), and a vector $j_s$ is a (N+1)-dimensional vector shown in Equation (31).

$$\delta_{SU} = \begin{bmatrix} X(x - q_C) - j \\ \alpha u_3^T(x - q_C) - \alpha u_3^T(c_0 - q_C) \end{bmatrix} \tag{29}$$

$$= \begin{bmatrix} X \\ \alpha u_3^T \end{bmatrix}(x - q_C) - \begin{bmatrix} j \\ \alpha u_3^T(c_0 - q_C) \end{bmatrix}$$

$$= X_S(x - q_C) - j_s$$

$$\text{where } X_S = \begin{bmatrix} X \\ \alpha u_3^T \end{bmatrix} \tag{30}$$

$$j_S = \begin{bmatrix} j \\ \alpha u_3^T(c_0 - q_C) \end{bmatrix} \tag{31}$$

The center point $x_0$ obtained as the solution x that would minimize the objective function gs(x) is obtained as a solution for a simultaneous linear equation of three variables shown in Equation (32), and is represented as a three-dimensional vector shown in Equation (35). Here, Equation (32) is calculated by applying the least squares method to Equation (27). A matrix $A_S$ is a 3-by-3 matrix shown in Equation (33), a vector $X_S^T j_S$ is a three-dimensional vector shown in Equation (34).

$$A_S(x-q_C) = X_S^T j_S \quad (32)$$

$$\text{where } A_S = X_S^T X_S = X^T X + \alpha^2 u_3 u_3^T \quad (33)$$

$$X_S^T j_S = X^T j + \alpha^2 u_3^T (c_0 - q_C) u_3 \quad (34)$$

$$x_0 = A_S^{-1} X_S^T j_S + q_C \quad (35)$$

8. Distortion Determination Process

A description is next given of the distortion determination process of Step S103.

The distortion determination process of the present embodiment is a process of determining the degree of difference between a shape of a three-dimensional figure SD having plural pieces of magnetic data $q_1$ to $q_N$ adjacent to the surface thereof and the shape of a spherical surface (first spherical surface), for both a case in which the plural pieces of magnetic data $q_1$ to $q_N$ are distributed three-dimensionally and a case in which the plural pieces of magnetic data $q_1$ to $q_N$ are distributed two-dimensionally.

In the following, as a precondition for the distortion determination process according to the present embodiment, a description will be first given of a distortion determination process (Section 8.1) limited to a case in which the plural pieces of magnetic data $q_1$ to $q_N$ are distributed in a three-dimensional manner. A description will then be given of the distortion determination process according to the present embodiment (Section 8.2).

8.1. Distortion Determination Process in a Case in which Magnetic Data Pieces are Distributed Three-dimensionally In a case in which plural pieces of magnetic data $q_1$ to $q_N$ are distributed three-dimensionally, and in which the shape of a surface of a three-dimensional figure SD can be regarded as approximately a spherical surface due to the effects of a non-uniform external magnetic field Bx being small, a center point $x_0$ of a spherical surface S (first spherical surface) shown in Equation (20) almost coincides with a center point $x_{0G}$ of a spherical surface $S_G$ representing a geomagnetic field. However, as shown in FIG. 3, in a case in which an external magnetic field Bx is not uniform and in which the effects of an external magnetic field Bx are large, plural pieces of magnetic data $q_1$ to $q_N$ sequentially output from the three-dimensional magnetic sensor 60 are not distributed adjacent to the spherical surface S having the center point $x_0$ as the center, and will be distributed adjacent to a surface of a three-dimensional figure SD having a distorted shape differing from a spherical surface. In this case, because it is highly likely that the center point $x_0$ of the spherical surface S will have coordinates different from ones for the center point $x_{0G}$ of the spherical surface $S_G$ representing the geomagnetic field Bg, employing the center point $x_0$ as an offset c needs to be avoided (refer to FIG. 13).

However, in a case in which the shape of the three-dimensional figure SD is sufficiently approximate to that of the spherical surface S, the center point $x_0$ of the spherical surface S can be employed as an offset c.

Figure 14A:
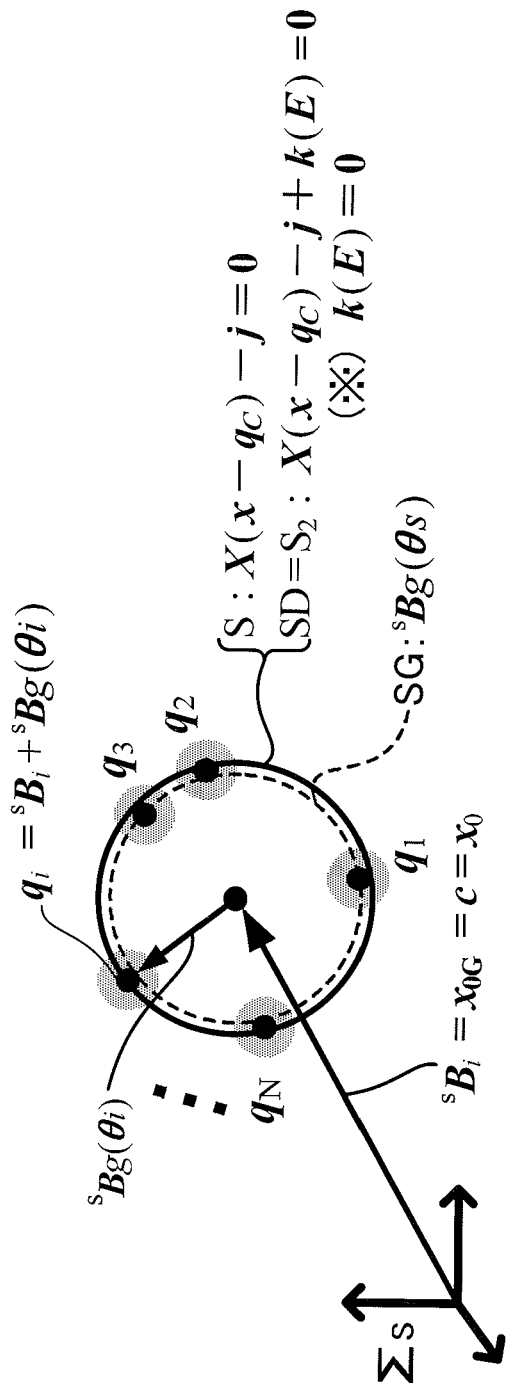
FIGS. 14A, 14B, and 14C are each a conceptual diagram for explaining the distortion determination process according to an embodiment of the present invention.
Figure 14B:
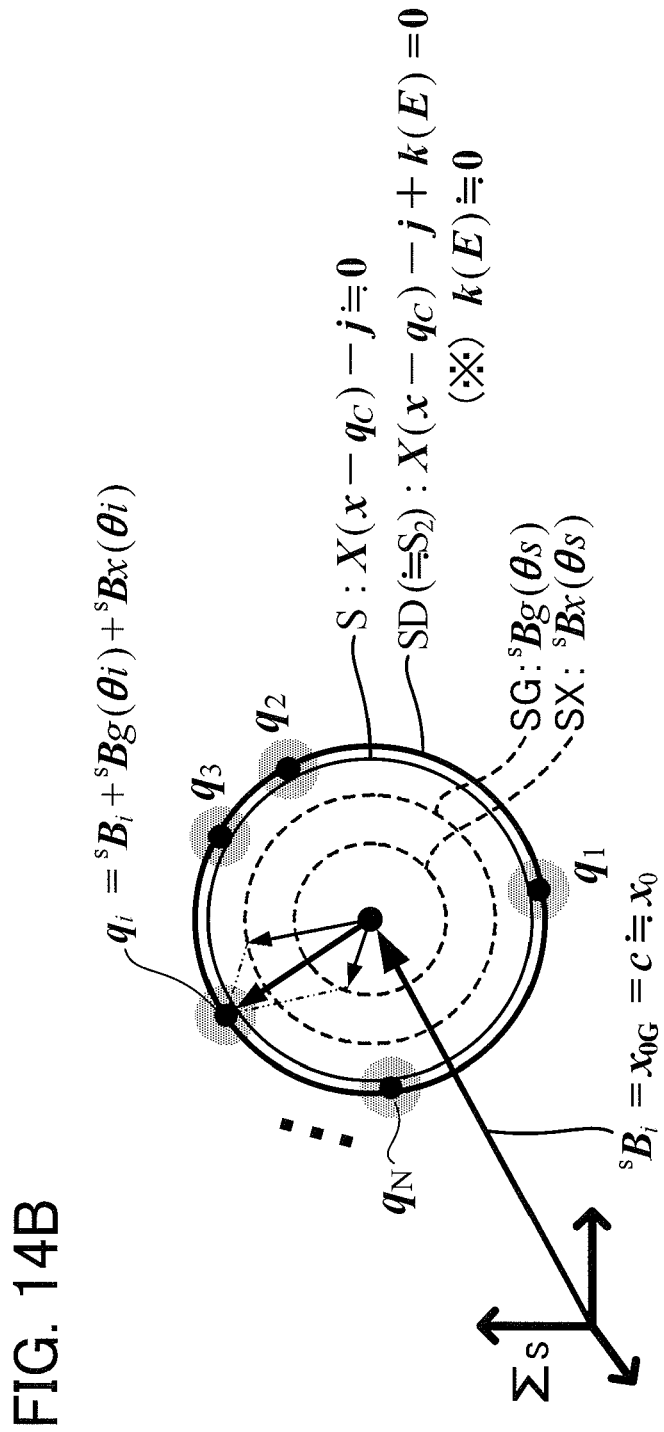
Figure 14C:
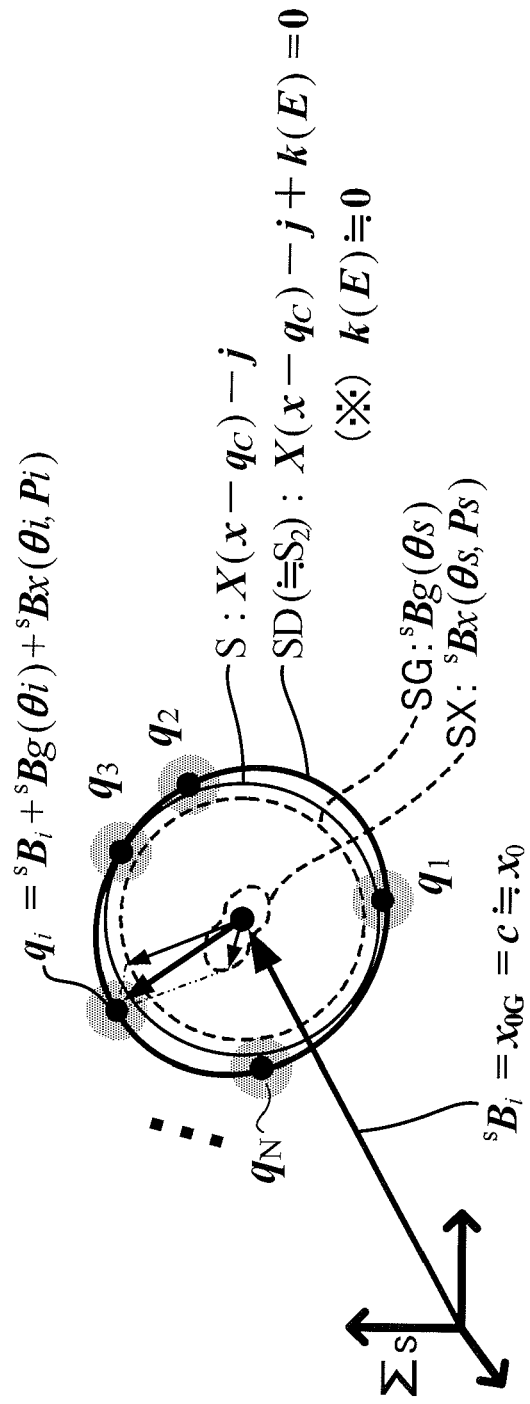

For example, as shown in FIG. 4A, in a case in which the effects of an external magnetic field Bx are small, plural pieces of magnetic data $q_1$ to $q_N$ sequentially output from the three-dimensional magnetic sensor 60 will be, in the sensor coordinate system $\Sigma_S$, distributed adjacent to the spherical surface S having the center point $x_0$ calculated in Step S102 as the center, and the spherical surface S and the center point $x_0$ thereof will be approximately equal to the spherical surface $S_G$ representing the geomagnetic field Bg and the center point $x_{0G}$ thereof (see FIG. 14C).

Additionally, as shown in FIG. 4B, in a case in which an external magnetic field Bx is detected by the three-dimensional magnetic sensor 60 as an approximately uniform magnetic field, for example, when plural pieces of magnetic data $q_1$ to $q_N$ are obtained by changing only the orientation of the device 1 without moving the position thereof (to be more precise, the position of the three-dimensional magnetic sensor 60), the plural pieces of magnetic data $q_1$ to $q_N$ will be distributed adjacent to the spherical surface S having the center point $x_0$ calculated in Step S102 as the center point. In this case, the spherical surface S is different from the spherical surface $S_G$ representing the geomagnetic field Bg, but the center point $x_0$ of the spherical surface S is approximately equal to the center point $x_{0G}$ of the spherical surface $S_G$ (refer to FIG. 14B).

The distortion determination process of this section is a process of estimating how much the shape of a three-dimensional figure SD is close to the shape of a spherical surface, in a case in which it is assumed that plural pieces of magnetic data $q_1$ to $q_N$ are distributed adjacent to the surface of the three-dimensional figure SD. In a case in which the shape of the three-dimensional figure SD is estimated to be sufficiently close to the shape of the spherical surface, the center point $x_0$ of the spherical surface S can be employed as a new offset $c_1$.

In the above center point calculation process, plural errors between a spherical surface S and plural sets of coordinates indicated by respective plural pieces of magnetic data $q_1$ to $q_N$ are expressed using the error $\delta_S$. The plural errors exist in a case in which it is assumed that the plural pieces of magnetic data $q_1$ to $q_N$ are distributed adjacent to the spherical surface S shown in Equation (13).

Figure 12:
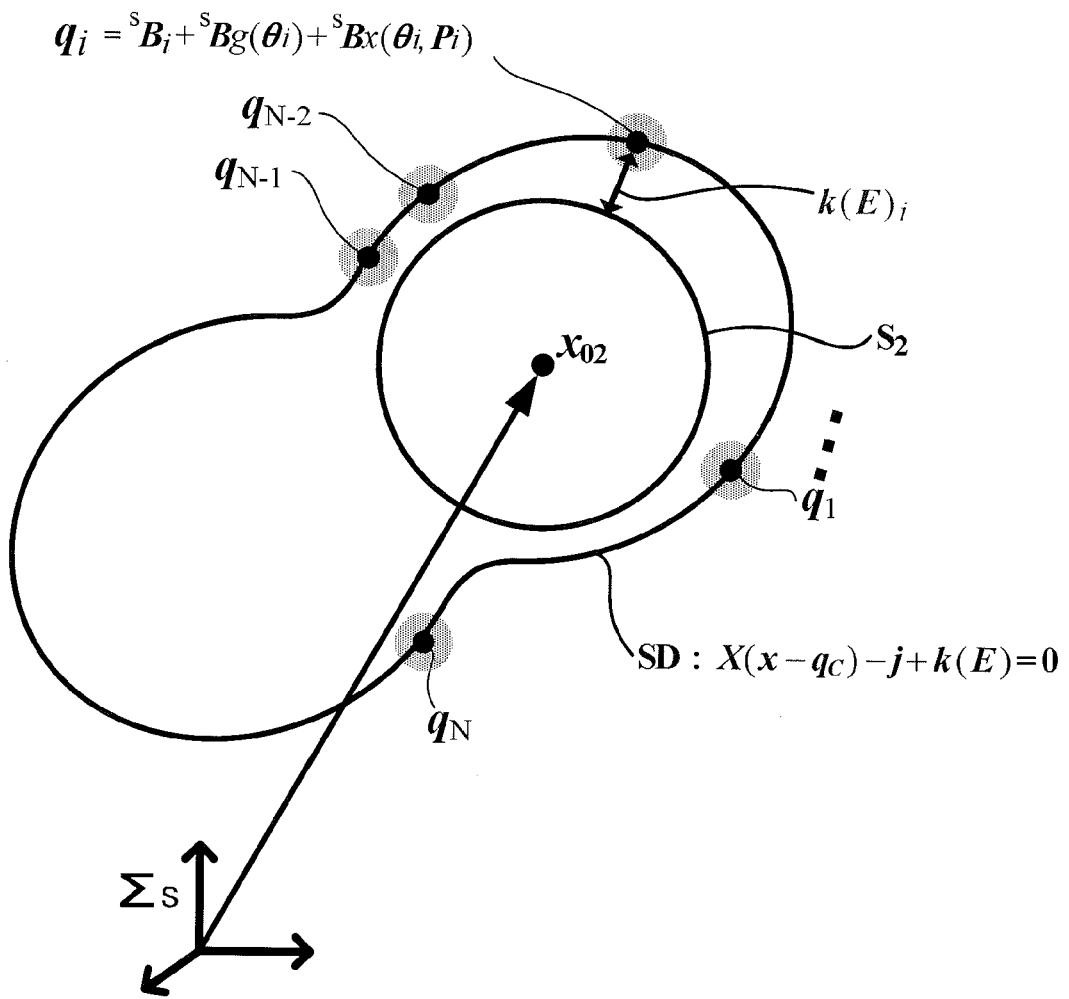
FIG. 12 is a conceptual diagram for explaining a three-dimensional figure of a distortion determination process according to an embodiment of the present invention.

In contrast, in the distortion determination process of this section, as shown in FIG. 12, it is assumed that plural pieces of magnetic data $q_1$ to $q_N$ are distributed adjacent to a surface of a three-dimensional figure SD that has a distorted shape different from a spherical surface and is shown in Equation (36). The three-dimensional figure SD shown in Equation (36) is the sum of "$X(x-q_c)-j$", which is a component representing a spherical surface, and k(E), which is a component representing distortion as shown in Equation (37). A suffix subscript "N" of $0_N$ appearing in the right-hand side of Equation (36) represents a dimension of a zero vector.

The spherical surface represented by the component "$X(x-q_c)-j$" appearing in Equation (36) and the spherical surface S calculated in the center point calculation process do not necessarily correspond to each other. Accordingly, in the following, the spherical surface represented by the component "$X(x-q_c)-j$" appearing in Equation (36) will be referred to as a spherical surface $S_2$ (first spherical surface), and the center point thereof as a center point $x_{02}$. In this section, a vector x is a variable for representing the center point $x_{02}$ of the spherical surface $S_2$.

The distortion determination process is a process of estimating how much the shape of the three-dimensional figure SD differs from the shape of the spherical surface $S_2$, by estimating the magnitude of the component k(E) of Equation (36), k(E) representing the distortion.

$$X(x - q_C) + k(E) - j = 0_N \quad (36)$$

$$\text{where } k(E) = \begin{bmatrix} (q_1 - x_0)^T E(q_1 - x_0) \\ \vdots \\ (q_N - x_0)^T E(q_N - x_0) \end{bmatrix} \quad (37)$$

$$E = \begin{bmatrix} e_{11} & e_{12} & e_{13} \\ e_{12} & e_{22} & e_{23} \\ e_{13} & e_{23} & e_{33} \end{bmatrix} \quad (38)$$

The component k(E) representing distortion as shown in Equation (37) is an N-dimensional vector. The i-th-row element $ke(E)_i$ of the component k(E) representing distortion is a value $ke(q_i - x_0)$ given by substituting a vector $(q_i - x_0)$ (first vector $(q_i - w)$) into a function ke(p) represented by the following Equation (39). The vector "$(q_i - x_0)$" represents a piece of magnetic data $q_i$ viewed from a coordinate system having the center point $x_0$ (a reference point w) of the spherical surface S (second spherical surface) as the origin. The function ke(p) is a function having a distortion estimation matrix E shown in Equation (38) as a coefficient matrix, and is a quadratic function in three variables, $p = (p_x, p_y, p_z)$, shown in Equation (40). The distortion estimation matrix E is a 3-by-3 symmetric matrix as shown in Equation (38).

$$ke(p) = p^T E p \quad (39)$$

$$\text{where } p = [p_x, p_y, p_z]^T \quad (40)$$

It is to be noted that, Equation (36) has no solution considering an error such as a measurement error of the three-dimensional magnetic sensor 60 because there would be no chance of every set of coordinates indicated by each of plural pieces of magnetic data $q_1$ to $q_N$ being at a position completely coinciding with the three-dimensional figure SD. Accordingly, to obtain a practical solution by a statistical method, we introduce an error $\delta_{SD}$ (three-dimensional error), represented by Equation (41), which is a vector that absorbs error.

The error $\delta_{SD}$, is an N-dimensional vector having, as each element, an error between a set of coordinates indicated by each of plural pieces of magnetic data $q_1$ to $q_N$ and the surface of the three-dimensional figure SD. The vector is expressed as the sum of an error $\delta_{S2}$ (first spherical surface error) and the component k(E) representing distortion. Although described later in detail, the error $\delta_{S2}$ is a component corresponding to the component "$X(x - q_c) - j$" of Equation (36), with the component "$X(x - q_c) - j$" representing a spherical surface.

The three-dimensional figure SD having the surface to which plural pieces of magnetic data $q_1$ to $q_N$ are adjacent is expressed by a vector x and a distortion estimation matrix E that minimize a norm of the error $\delta_{SD}$, i.e., a vector x and a distortion estimation matrix E that minimize $(\delta_{SD})^T(\delta_{SD})$.

We now define an objective function $f_{SD}(E, x)$ (three-dimensional figure distortion estimation function) shown in the following Equation (42). The three-dimensional figure SD having plural pieces of magnetic data $q_1$ to $q_N$ adjacent thereto is expressed by an x and a distortion estimation matrix E that would minimize this objective function $f_{SD}(E, x)$.

$$\begin{aligned}\delta_{SD} &= \delta_{S2} + k(E) \\ &= X(x - q_C) + k(E) - j\end{aligned} \quad (41)$$

$$f_{SD}(E, x) = \|X(x - q_C) + k(E) - j\|_2 \quad (42)$$

The magnitude of the component k(E) representing distortion (i.e., the degree of difference between the shape of the three-dimensional figure SD and the shape of the spherical surface $S_2$) can be estimated based on a distortion estimation value $g_D(E)$ indicated by Equations (43) and (44), which will be described later. In a case in which the distortion estimation value $g_D(E)$ is equal to or less than a threshold $\delta_0$, the three-dimensional figure SD and the spherical surface $S_2$ can be considered as coinciding perfectly with each other, rendering the shape of the three-dimensional figure SD approximately equal to the shape of the spherical surface S. In this case, the center point $x_0$ calculated in the center point calculation process can be employed as an offset c. On the other hand, in a case in which the distortion estimation value $g_D(E)$ has a value greater than the threshold $\delta_0$, the center point $x_0$ cannot be employed as an offset c. In other words, in a case in which the distortion estimation value $g_D(E)$ is within an allowable distortion range, an offset is updated in the offset updating process of Step S104; in a case in which the distortion estimation value $g_D(E)$ is not within the allowable distortion range, the offset updating process of Step S104 is not performed. Thus, an offset is updated or not updated depending on the distortion estimation value $g_D(E)$.

In the following, a description will be given of the difference in nature between an error $\delta_S$ represented by Equation (17) and the error $\delta_{SD}$ represented by Equation (41).

The error $\delta_S$ represented by Equation (17) is a vector for absorbing errors between sets of coordinates indicated by N-number of pieces of magnetic data $q_1$ to $q_N$ and the spherical surface S. Each element of the first to the N-th row composing the error $\delta_S$ is an independent variable. Therefore, in a case in which the error $\delta_S$ is used to absorb an error between a set of coordinates indicated by each of the N number of pieces of magnetic data $q_1$ to $q_N$ and the spherical surface S, each of N number of errors between the N number of pieces of magnetic data $q_1$ to $q_N$ and the spherical surface S will be an independent value with no mutual constraints. That is, each of the N number of errors represented by the error $\delta_S$ is respectively determined stochastically and independently, and the N number of errors are, as a whole, white noise that is symmetrical and has no direction dependency.

Therefore, Equations (19) to (21) are used to obtain a center point $x_0$ of the spherical surface S that would minimize errors that are white noise by considering the errors between sets of coordinates of N number of pieces of magnetic data $q_1$ to $q_N$ and the spherical surface S as white noise having symmetry and having no direction dependency.

On the other hand, the error $\delta_{SD}$ represented by Equation (41) is a vector that absorbs errors between sets of coordinates indicated respectively by N number of pieces of magnetic data $q_1$ to $q_N$ and the three-dimensional figure SD. More specifically, the error $\delta_{SD}$ is a vector that has, as elements, values expressed as the sum of the error $\delta_{S2}$ and the component k(E) representing distortion, the error $\delta_{S2}$ representing errors between the sets of coordinates indicated respectively by the N number of pieces of magnetic data $q_1$ to $q_N$ and the spherical surface $S_2$ and the component k(E) representing an error between the spherical surface $S_2$ and the three-dimensional figure SD. The error $\delta_{S2}$, like the error $\delta_S$, is represented by the right-hand side of Equation (17), and is a vector that expresses, as white noise, errors between sets of coordinates indicated respectively by the N number of pieces of magnetic data $q_1$ to $q_N$ and the spherical surface $S_2$.

On the other hand, the component k(E) representing distortion is a vector having a three variable quadratic function ke(p) shown in Equation (39) as each component. A three variable quadratic function is a function including terms with variables in a quadratic form, and with use of the function, various curved surfaces on a three-dimensional space can be plotted, such as a straight line, a plane, a cylindrical surface, a spherical surface, an ellipsoid, a conical surface, a hyperboloid of one sheet, a hyperboloid of two sheets, various paraboloids, etc. Therefore, the component k(E) representing distortion expresses each of the N number of errors between N number of sets of coordinates indicated by N number of pieces of magnetic data $q_1$ to $q_N$ and the spherical surface $S_2$, as something not mutually independent but as a value having a constraint that all of the N number of errors are on a curved surface in a three-dimensional space are represented by the identical function ke(p).

Thus, the error $_{SSD}$ expresses, as a whole, the N number of errors between the sets of coordinates respectively indicated by N number of pieces of magnetic data $q_1$ to $q_N$ and the three-dimensional figure SD, by the error $\delta_{S2}$, which is white noise, and by the component k(E) representing distortion, which is an error of which characteristic is distortion from a spherical surface $S_2$. Thus, by introducing the error $\delta_{SD}$, it has been made possible to divide a vector (the error $\delta_{SD}$) representing the N number of errors between the N number of sets of coordinates respectively indicated by the N number of pieces of magnetic data $q_1$ to $q_N$ and the three-dimensional figure SD into the error $\delta_{S2}$ resulting from white noise and an error resulting from distortion represented by the component k(E).

In the following, a description will be given, with reference to FIGS. 13 and 14, as to how to distinguish, depending on the magnitude of a component k(E) representing distortion, between a case in which a center point $x_0$ of a spherical surface S can be employed as a new offset $c_1$ and a case in which a center point $x_0$ of a spherical surface S cannot be employed as a new offset $c_1$.

Figure 13:
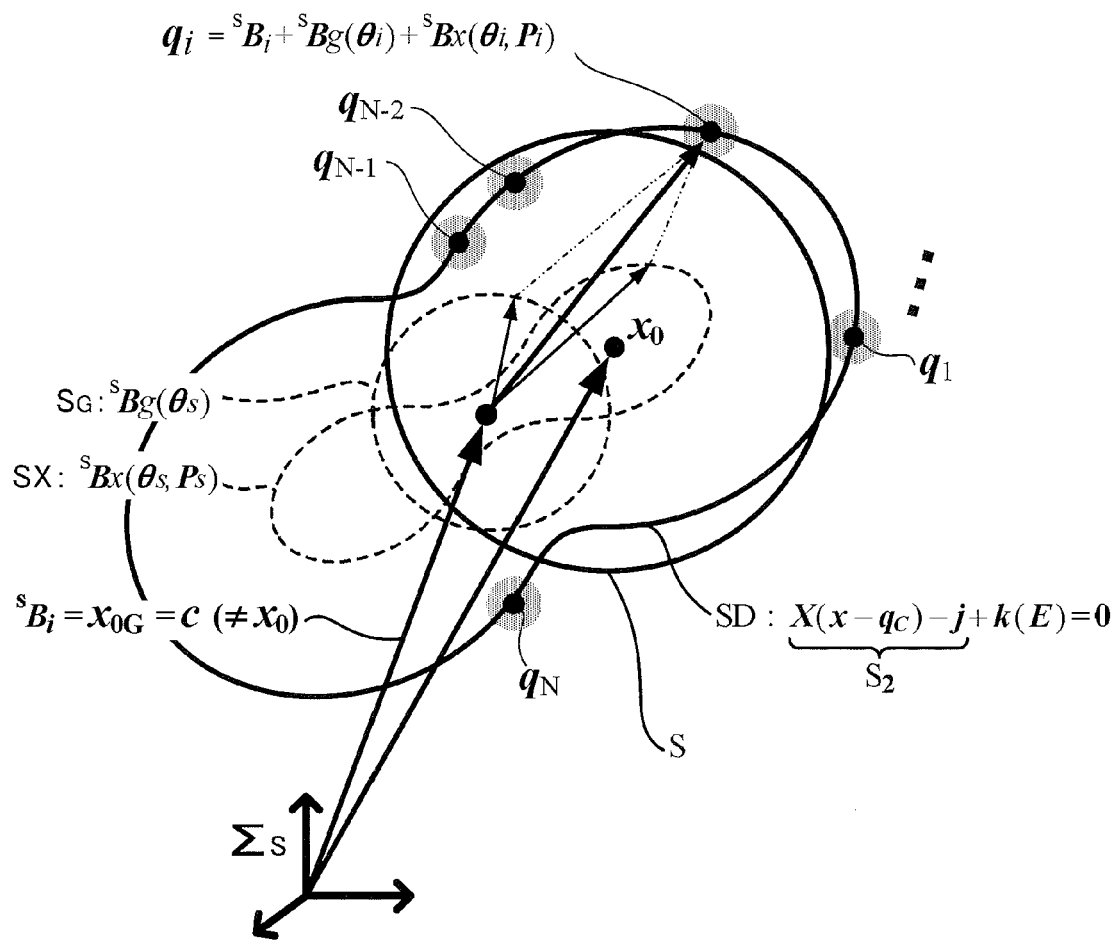
FIG. 13 is a conceptual diagram for explaining a distortion determination process according to an embodiment of the present invention.

FIG. 13 shows a case in which a component k(E) representing distortion is large, i.e., a case in which, due to the effects of a non-uniform external magnetic field Bx, a three-dimensional figure SD has a shape greatly different from a spherical surface $S_2$. For simplicity, FIGS. 13 and 14 respectively show a case in which Equation (36) is satisfied, assuming that plural pieces of magnetic data $q_1$ to $q_N$ are distributed so as to completely match the surface of the three-dimensional figure SD.

In a case shown in FIG. 13, plural pieces of magnetic data $q_1$ to $q_N$ are distributed on the three-dimensional figure SD having a distorted shape greatly different from the spherical surface $S_2$. In this case, it is not possible to consider that the plural pieces of magnetic data $q_1$ to $q_N$ are distributed on a spherical surface S. Because the center point calculation process is a process of calculating a center point $x_0$ as a candidate for an offset c (a center point $x_{0G}$ of a spherical surface $S_G$ representing a geomagnetic field) assuming that plural pieces of magnetic data $q_1$ to $q_N$ are adjacent to the spherical surface S, the center point $x_0$ of the spherical surface S not having plural pieces of magnetic data $q_1$ to $q_N$ adjacent thereto is meaningless as an offset c.

Furthermore, a three-dimensional figure SD is a superposition of a spherical surface $S_G$ representing a geomagnetic field Bg and a curved surface SX representing an external magnetic field Bx and also is a superposition of a spherical surface $S_2$ and a component k(E) representing distortion. The component k(E) representing distortion is a vector of which each element represents an error between each set of coordinates indicated respectively by plural pieces of magnetic data $q_1$ to $q_N$ and the spherical surface of the three-dimensional figure SD, each element specifically representing a portion of the error that cannot be expressed as white noise. The component k(E) representing distortion is different from the curved surface SX representing the external magnetic field Bx. Therefore, in a case in which the component k(E) representing distortion is large, it is highly likely that the spherical surface $S_2$ turns out to be different from the spherical surface $S_G$. Even in a case in which it is possible to consider that a spherical surface S coincides with the spherical surface $S_2$, it is highly likely that the spherical surface S and a center point $x_0$ thereof turn out to be different from the spherical surface $S_G$ and a center point $x_{0G}$ thereof.

Thus, in a case in which Equation (36) holds and in which the component k(E) representing distortion is large, it is highly likely that a center point $x_0$ of a spherical surface S does not coincide with a center point $x_{0G}$ of a spherical surface $S_G$. Therefore, employing the center point $x_0$ of the spherical surface S as an offset c needs to be avoided.

On the other hand, in a case in which the component k(E) representing distortion results in "0", a center point $x_0$ of a spherical surface S can be employed as an offset c.

For example, a case in which there is no external magnetic field Bx, such as shown in FIG. 14A, is discussed. In this example, a three-dimensional figure SD, which is a superposition of a spherical surface $S_G$ representing a geomagnetic field Bg and a curved surface SX representing an external magnetic field Bx, is equal to the spherical surface $S_G$, and the shape of a surface of the three-dimensional figure SD is a spherical surface.

In a case in which the shape of the surface of the three-dimensional figure SD is a spherical surface and in which the component k(E) representing distortion is "0", the three-dimensional figure SD coincides with a spherical surface $S_2$. Therefore, in a case in which Equation (36) is satisfied, Equation (13) is simultaneously satisfied. Thus, because a spherical surface S is a spherical surface defined based on plural pieces of magnetic data $q_1$ to $q_N$, assuming that plural sets of coordinates indicated by the plural pieces of magnetic data $q_1$ to $q_N$ are adjacent thereto, the three-dimensional figure SD coincides with the spherical surface S. As a result, the spherical surface S will coincide with the spherical surface $S_G$, and then a center point $x_0$ of the spherical surface S will represent the center point $x_{0G}$. In this case, the center point $x_0$ can be employed as an offset c.

In a case in which the component k(E) representing distortion is small (in a case in which the component k(E) representing distortion is approximately equal to zero), a center point $x_0$ of a spherical surface S can be considered and employed as an offset c.

For example, a discussion is given of a case in which an external magnetic field Bx is detected, by the three-dimensional magnetic sensor 60, as an approximately uniform magnetic field, as shown in FIG. 14B. In this example, because it is possible to consider the shape of a surface of a curved surface SX representing the external magnetic field Bx as a spherical surface having a center point $x_{0G}$ as the center, a three-dimensional figure SD, which is a superposition of a spherical surface $S_G$ and the curved surface SX, has a shape close to a spherical surface having the center point $x_{0G}$ as the center.

In a case in which the three-dimensional figure SD is a shape close to a spherical surface and in which the component k(E) representing distortion is a small value close to "0", the three-dimensional figure SD and a spherical surface $S_2$ will be approximately the same. Then, in a case in which Equation (36) holds, Equation (13) can be considered to also hold. Therefore, the three-dimensional figure SD and a spherical surface S will be approximately equal, and plural pieces of magnetic data $q_1$ to $q_N$ distributed on the three-dimensional figure SD can be considered as being distributed on the spherical surface S having a center point $x_0$ as the center. As a result, the center point $x_0$ of the spherical surface S and the center point $x_{0G}$ of the spherical surface $S_G$ will have almost identical sets of coordinates. Therefore, also in such a case as shown in FIG. 14B, the center point $x_0$ of the spherical surface S can be employed as an offset c.

Additionally, as shown in FIG. 14C, a discussion is given of a case in which the magnitude of a non-uniform external magnetic field Bx detected by the three-dimensional magnetic sensor 60 is sufficiently small and the effects of a curved surface SX can be ignored.

In this example, because a three-dimensional figure SD, which is a superposition of a spherical surface $S_G$ representing a geomagnetic field Bg and a curved surface SX representing an external magnetic field Bx, can be considered to be approximately equal to the spherical surface $S_G$ representing the geomagnetic field Bg, the shape of the three-dimensional figure SD can be considered to be a spherical surface.

In a case in which the three-dimensional figure SD has a shape close to a spherical surface and in which the component k(E) representing distortion is a small value close to "0", the three-dimensional figure SD and a spherical surface $S_2$ will be approximately equal. Then, in a case in which Equation (36) holds, it can be considered that Equation (13) also holds, and the three-dimensional figure SD and a spherical surface S will be approximately equal.

Therefore, because the spherical surface S and the spherical surface $S_G$ are approximately equal, the center point $x_0$ and the center point $x_{0G}$ of the spherical surface $S_G$ will have approximately identical sets of coordinates. Therefore, in a case shown in FIG. 14C, the center point $x_0$ of the spherical surface S can be employed as an offset c.

Thus, in a case in which a component k(E) representing distortion is small, plural pieces of magnetic data $q_1$ to $q_N$ distributed on a three-dimensional figure SD can be considered to be distributed also on a spherical surface S, and therefore, a center point $x_0$ of a spherical surface S can be employed as an offset c. In the following, after the nature of a distortion estimation matrix E is described, a method of estimating the magnitude of a component k(E) representing distortion will be described.

As described above, each element of a component k(E) representing distortion, which is an N-dimensional vector, is expressed in a three variable quadratic form having, as a coefficient, a distortion estimation matrix E, which is a 3-by-3 symmetric matrix. That is, among the component k(E) representing distortion, the i-th row element $ke(q_i-x_0)$ is an inner product of a vector $q_i-x_0$ representing a set of coordinates of a magnetic data $q_i$ and a vector $E(q_i-x_0)$ obtained by converting the vector $q_i-x_0$ by the distortion estimation matrix E. The starting point of the vector $q_i-x_0$ is a center point $x_0$ of a spherical surface S.

Here, we denote eigenvalues of the distortion estimation matrix E as a maximum eigenvalue $\lambda_{E1}$, an intermediate eigenvalue $\lambda_{E2}$, and a minimum eigenvalue $\lambda_{E3}$, in a descending order of their absolute values and denote eigenvectors normalized to the magnitude of 1 as $u_{E1}$, $u_{E2}$, and $U_{E3}$, the eigenvectors corresponding to respective eigenvalues. Because the distortion estimation matrix E is a symmetric matrix, the three eigenvectors $u_{E1}$, $u_{E2}$, $u_{E3}$ of the distortion estimation matrix E are mutually orthogonal.

In a case in which the vector $q_i-x_0$ is parallel to the eigenvector $u_{E1}$, the vector $E(q_i-x_0)$ is a vector that is parallel to the vector $q_i-x_0$ and that has a length of a $\lambda_{E1}$ multiple of the vector $q_i-x_0$. That is, the value of an element $ke(q_i-x_0)$ is $\lambda_{E1}(|q_i-x_0|^2)$. Therefore, the absolute value of the element $ke(q_i-x_0)$ will increase as the direction represented by the vector $q_i-x_0$ becomes closer to the direction represented by the eigenvector $u_{E1}$.

The distortion estimation matrix E is a matrix obtained by minimizing the objective function $f_{SD}(E,x)$ having a vector x and the distortion estimation matrix E as variables. As noted above, in this section, the vector x is a variable for representing a center point $x_{02}$ of a spherical surface $S_2$.

In a case in which a set of coordinates for a piece of magnetic data $q_i$ that is adjacent to the surface of a three-dimensional figure SD indicates a position very distant from the spherical surface $S_2$, it is not favorable to consider that an error between a set of coordinates indicated by the piece of magnetic data $q_i$ and the spherical surface $S_2$ is an error $\delta_{S2}$, which is white noise from the spherical surface $S_2$. The component k(E) representing distortion is a vector defined to absorb, as errors resulting from distortion, large errors which are inappropriate to be considered as white noise. The large errors are a part of errors between the spherical surface $S_2$ and sets of coordinates indicated respectively by plural pieces of magnetic data $q_1$ to $q_N$ that are adjacent to the three-dimensional figure SD. Thus, the component k(E) representing distortion is determined in such a way that it represents the difference between a three-dimensional figure SD having plural pieces of magnetic data $q_1$ to $q_N$ adjacent to the surface thereof and shape of a spherical surface $S_2$.

Then, in a case in which a set of coordinates indicated by a piece of magnetic data $q_i$ is very distant from the spherical surface $S_2$, each component of the distortion estimation matrix E is determined so that the i-th-row element $ke(q_i-x_0)$ of the component k(E) representing distortion will be a large value. Specifically, each component of the distortion estimation matrix E is determined so that the direction of the eigenvector $u_{E1}$ corresponding to the maximum eigenvalue $\lambda_{E1}$ of the distortion estimation matrix E is closer to the direction of the vector $q_i-x_0$.

The component k(E) representing distortion is a vector representing, as a whole, N number of errors between plural pieces of magnetic data $q_1$ to $q_N$ and the spherical surface $S_2$.

Therefore, each component of the distortion estimation matrix E is determined so that the direction of the eigenvector $u_{E1}$ corresponding to the maximum eigenvalue $\lambda_{E1}$ of the distortion estimation matrix E and the direction pointing to an area become closer to each other when the area is viewed from the center point $x_0$ of the spherical surface S, in which area large numbers of pieces of magnetic data $q_i$ are located, with each magnetic data piece $q_i$ having a large error from the spherical surface $S_2$. Then, the maximum eigenvalue $\lambda_{E1}$ of the distortion estimation matrix E will be a value representing a degree of the magnitude of an error between the spherical surface $S_2$ and plural pieces of magnetic data that are in the direction of the eigenvector $u_{E1}$ when viewed from the center point $x_0$.

Thus, it is possible to express, by a distortion estimation matrix E, the degree of the difference in shape between a three-dimensional figure SD and a spherical surface $S_2$, and the direction in which the difference in shape therebetween is large.

We now define a distortion estimation value $g_D(E)$ shown in the following Equations (43) and (44) as an estimation value for estimating the magnitude of a component k(E) representing distortion. The distortion estimation value $g_D(E)$ is a norm of a distortion estimation matrix E when an objective function $f_{SD}(E,x)$ is minimized, i.e., the distortion estimation value $g_D(E)$ is the absolute value of the maximum eigenvalue $\lambda_{E1}$ of the distortion estimation matrix E.

In a case in which the value of the distortion estimation value $g_D(E)$ is zero, Equation (36) coincides with Equation (13), and a three-dimensional figure SD becomes equal to a spherical surface S. Additionally, even in a case in which the value of the distortion estimation value $g_D(E)$ is not zero, if the value is equal to or less than a certain threshold $\delta_0$, it is possible to determine that a three-dimensional figure SD has a shape close to a spherical surface S. In these cases, because plural pieces of magnetic data $q_1$ to $q_N$ can be considered as being distributed adjacent to a spherical surface S, a center point $x_0$ of the spherical surface S obtained by the above-described center point calculation process can be employed as an offset c.

$$g_D(E)=|\lambda_{E1}|=\|E\|_2 \tag{43}$$

$$\text{where } f_{SD}(E,x) \to \text{Min} \tag{44}$$

In the following, a description is given of a method for calculating a distortion estimation value $g_D(E)$.

The function ke(p) shown in Equation (39) is a function expressed in a quadratic form, and therefore can be expressed as an inner product of vectors as shown in the following Equation (45). Furthermore, because the i-th-row element $ke(q_i-x_0)$ of a component k(E) representing distortion is a value obtained by substituting a vector $(q_i-x_0)$ into the variable p of Equation (39), the element $ke(q_i-x_0)$ can be expressed as shown in Equation (46) by using a six-dimensional vector $ke_2(i)$ indicated by Equation (47) and a six-dimensional vector $e_E$ in which the elements of distortion estimation matrix E are lined up, the vector $e_E$ being expressed by Equation (48).

$$ke(p) = e_{11}p_x^2 + e_{22}p_y^2 + e_{33}p_z^2 + 2e_{12}p_xp_y + 2e_{13}p_xp_z + 2e_{23}p_yp_z \tag{45}$$

$$= \begin{bmatrix} p_x^2 \\ p_y^2 \\ 2p_xp_y \\ p_z^2 \\ 2p_yp_z \\ 2p_xp_z \end{bmatrix}^T \begin{bmatrix} e_{11} \\ e_{22} \\ e_{12} \\ e_{33} \\ e_{23} \\ e_{13} \end{bmatrix}$$

$$ke(q_i - x_0) = ke_2(i)^T e_E \quad (i=1,\ldots,N) \tag{46}$$

$$\text{where } ke_2(i) = \begin{bmatrix} (x_i - x_0)^2 \\ (y_i - y_0)^2 \\ 2(x_i - x_0)(y_i - y_0) \\ (z_i - z_0)^2 \\ 2(y_i - y_0)(z_i - z_0) \\ 2(x_i - x_0)(z_i - z_0) \end{bmatrix} \quad (i=1,\ldots,N) \tag{47}$$

$$e_E = [e_{11}\ e_{22}\ e_{12}\ e_{33}\ e_{23}\ e_{13}]^T \tag{48}$$

Here, we introduce a matrix $X_2$ shown in Equation (49). The matrix $X_2$ is an N-by-9 matrix in which the transposition of the six-dimensional vector $ke_2(i)$ shown in Equation (47) and the transposition of three-dimensional vectors $(q_i-q_c)$ are lined up in the i-th row.

$$X_2 = \begin{bmatrix} ke_2(1)^T & (q_1-q_C)^T \\ ke_2(2)^T & (q_2-q_C)^T \\ \vdots & \vdots \\ ke_2(N)^T & (q_N-q_C)^T \end{bmatrix} \tag{49}$$

$$= \begin{bmatrix} (x_1-x_0)^2 & \ldots & (x_N-x_0)^2 \\ (y_1-y_0)^2 & \ldots & (y_N-y_0)^2 \\ 2(x_1-x_0)(y_1-y_0) & \ldots & 2(x_N-x_0)(y_N-y_0) \\ (z_1-z_0)^2 & \ldots & (z_N-z_0)^2 \\ 2(y_1-y_0)(z_1-z_0) & \ldots & 2(y_N-y_0)(z_N-z_0) \\ 2(x_1-x_0)(z_1-z_0) & \ldots & 2(x_N-x_0)(z_N-z_0) \\ (x_1-x_C) & \ldots & (x_N-x_C) \\ (y_1-y_C) & \ldots & (y_N-y_C) \\ (z_1-z_C) & \ldots & (z_N-z_C) \end{bmatrix}^T$$

Using the matrix $X_2$ shown in Equation (49), the objective function $f_{SD}(E,x)$ shown in Equation (42) can be transformed to an objective function $g_{SD}(e)$ expressed in Equation (50). A vector e is, as shown in Equation (51), a 9-dimensional vector in which in the six-dimensional vector $e_E$ shown in Equation (48) and the three-dimensional vector $e_x$ shown in Equation (52) are lined up. Furthermore, the vector $e_x$ of Equation (52) is a vector obtained by subtracting a center of gravity $q_c$ shown in Equation (4) from the vector x, which is a variable for representing a center point $x_{02}$ of a spherical surface $S_2$.

$$g_{SD}(e) = \|X_2 e - j\|_2 \tag{50}$$

$$\text{where } e = \begin{bmatrix} e_E \\ e_X \end{bmatrix} \tag{51}$$

$$e_X = x - q_C \tag{52}$$

A solution $e=e_0$ that minimizes the objective function $g_{SD}(e)$ represented by Equation (50) can be obtained by applying the Gaussian elimination method, Cholesky decomposition method, or another appropriate method, to a simultaneous equation as shown in the following Equation (53). Equation (53) is calculated by applying the least squares method to Equation (50).

$$(X_2^T X_2) e_0 = X_2^T j \tag{53}$$

Based on the thus obtained solution $e_0$, a distortion estimation matrix E is restored by Equation (38). Then, the value of the distortion estimation value $g_D(E)$ shown in Equation (43), i.e., the norm of the distortion estimation matrix E, is obtained. The norm of the distortion estimation matrix E is equal to the absolute value of an eigenvalue (the maximum eigenvalue $\lambda_{E1}$), of which the absolute value is maximum among the three eigenvalues of the distortion estimation matrix E. Therefore, the norm can be obtained by the Jacobi method or by a power algorithm.

In this case, a center point $x_{02}$ of a spherical surface $S_2$ is obtained by substituting, into Equation (52), a portion of the solution $e_0$ that minimizes the objective function $g_{SD}(e)$, the portion corresponding to $e_x$ of Equation (51). In a case in which the value of the distortion estimation value $g_D(E)$ is equal to or less than the threshold $\delta_0$, a center point $x_0$ of a spherical surface S obtained by the center point calculation process and the center point $x_{02}$ of the spherical surface $S_2$ will have approximately equal coordinates. Therefore, in a case in which the value of the distortion estimation value $g_D(E)$ is equal to or less than the threshold $\delta_0$, either the center point $x_0$ of the spherical surface S or the center point $x_{02}$ of the spherical surface $S_2$ can be employed as an offset c.

In the distortion determination process of this section described so far, it is presumed that the distribution of plural pieces of magnetic data $q_1$ to $q_N$ has a three-dimensional extent (distribution). However, in a case in which plural pieces of magnetic data $q_1$ to $q_N$ are distributed two-dimensionally, there is a case in which the rank of the 9-by-9 matrix $X_2{}^T X_2$ shown in Equation (53) becomes less than "9", as is clear from Equation (49). In this case, it is not possible to calculate a solution $e_0$ based on Equation (53), and therefore, it is not possible to obtain a distortion estimation matrix E, either.

The present embodiment assumes not only a case in which plural pieces of magnetic data $q_1$ to $q_N$ are distributed three-dimensionally but also a case in which plural pieces of magnetic data $q_1$ to $q_N$ are distributed two-dimensionally. Therefore, also in a case in which plural pieces of magnetic data $q_1$ to $q_N$ are distributed two-dimensionally, it is necessary to estimate what extent a three-dimensional figure SD having plural pieces of magnetic data $q_1$ to $q_N$ adjacent to surface thereof has a distorted shape from a spherical surface.

Accordingly, in the following Section 8.2, a description will be given of a method of estimating the degree of difference between the shape of a three-dimensional figure SD and the shape of a spherical surface also in a case in which plural pieces of magnetic data $q_1$ to $q_N$ are distributed two-dimensionally.

8.2. Distortion Determination Process of Present Embodiment

In the following, a description will be given of the distortion determination process according to the present embodiment. The distortion determination process according to the present embodiment is to expand the distortion determination process described in Section 8.1, applicable only to a case in which plural pieces of magnetic data $q_1$ to $q_N$ are distributed three-dimensionally, to a process that is also applicable to a case in which plural pieces of magnetic data $q_1$ to $q_N$ are distributed two-dimensionally.

As shown in FIG. 7, in a case in which plural pieces of magnetic data $q_1$ to $q_N$ are distributed two-dimensionally on a plane $\pi$, it is not possible to express accurately the three-dimensional shape of a three-dimensional figure SD having plural pieces of magnetic data $q_1$ to $q_N$ adjacent to the surface thereof. However, even in this case, it is possible to express a two-dimensional shape of a curve $\pi_D$ that is a plane of a section, which is cut by the plane $\pi$ of the three-dimensional figure SD. Therefore, the degree of the difference in shape between the three-dimensional figure SD and a spherical surface can be estimated by estimating the degree of difference between the shape of the curve $\pi_D$ on the plane $\pi$ having plural pieces of magnetic data $q_1$ to $q_N$ adjacent thereto and the shape of a circumference on the plane $\pi$.

As described above, in a case in which plural pieces of magnetic data $q_1$ to $q_N$ are distributed two-dimensionally on a plane $\pi$, eigenvectors $u_1$ and $u_2$ of a covariance matrix A representing the variance of plural pieces of magnetic data $q_1$ to $q_N$ will be parallel to the plane $\pi$, and an eigenvector $u_3$ will be vertical to the plane $\pi$. Therefore, to estimate the degree of difference in shape between a curve $\pi_D$ on the plane $\pi$ and a circumference on the plane $\pi$, it is only necessary to estimate the degree of difference in shape between a three-dimensional figure SD and a spherical surface $S_2$ with regard to the directions of eigenvectors $u_1$ and $u_2$.

In a case in which the plural pieces of magnetic data $q_1$ to $q_N$ are distributed two-dimensionally on the plane $\pi$, it is not possible to know the shape of the three-dimensional figure SD in the direction of the eigenvector $u_3$. Therefore, estimating the degree of difference in shape between the three-dimensional figure SD and the spherical surface $S_2$ with regard to the direction of the eigenvector $u_3$ is preferably to be avoided.

Accordingly, in the present embodiment, a distortion estimation matrix E is defined, assuming that there is no difference in shape between a three-dimensional figure SD and a spherical surface $S_2$ with regard to the direction of an eigenvector $u_3$ corresponding to a minimum eigenvalue $\lambda_3$ of a covariance matrix A.

Specifically, a distortion estimation matrix E is defined under constraints that a minimum eigenvalue $\lambda_{E3}$ of the distortion estimation matrix E is "0" and that an eigenvector $u_3$ corresponding to the minimum eigenvalue of a covariance matrix A and eigenvector $u_{E3}$ corresponding to the minimum eigenvalue $\lambda_{E3}$ of the distortion estimation matrix E are parallel.

When such distortion estimation matrix E is defined, a vector $Eu_3$ obtained by converting the eigenvector $u_3$ of the covariance matrix A by the distortion estimation matrix E will be "0", and the inner product of the eigenvector $u_3$ of the covariance matrix A and the vector $Eu_3$ will be "0". Therefore, for a piece of magnetic data $q_i$ in which an eigenvector $u_3$ and a vector $q_i - x_0$ are parallel, an element $ke(q_i - x_0)$ of a component $k(E)$ representing distortion will be "0". Thus, regarding the distortion estimation matrix E according to the present embodiment, it is considered that the error between a piece of magnetic data $q_i$ and a spherical surface $S_2$ is "0", when the magnetic data piece $q_i$ is in the direction of an eigenvector $u_3$ of a covariance matrix A when viewed from a center point $x_0$. In other words, the distortion estimation matrix E is defined as a matrix where it is considered to have no difference in shape between a three-dimensional figure SD and a spherical surface $S_2$ in the direction of an eigenvector $u_3$.

Equation (54) shows a constraint (second constraint) for calculating a distortion estimation matrix E that estimates the difference in shape between a three-dimensional figure SD and a spherical surface $S_2$, but that is considered to have no difference in shape between the three-dimensional figure SD and the spherical surface $S_2$ as to the direction of eigenvector $u_3$, as described above.

$$Eu_3 = 0_3 \qquad (54)$$

Equation (54) shows that a vector $Eu_3$ obtained by converting an eigenvector $u_3$ of a covariance matrix A by a distortion estimation matrix E is a zero vector.

Because the distortion estimation matrix E is a symmetric matrix, the three eigenvectors $u_{E1}$ to $u_{E3}$ of the distortion estimation matrix E are mutually orthogonal. The eigenvector $u_3$ of the covariance matrix A and the vector $Eu_3$ each is expressed as a linear combination of the eigenvectors $u_{E1}$ to $u_{E3}$ of the distortion estimation matrix E, for example, as $u_3 = v_1 u_{E1} + v_2 u_{E2} + v_3 u_{E3}$, and $Eu_3 = w_1 u_{E1} + w_2 u_{E2} + w_3 u_{E3}$. In a case in which a vector parallel to an eigenvector of a matrix is converted by the matrix, the converted vector is parallel to the vector that has not yet converted, and the converted vector has a magnitude of a multiple of an eigenvalue corresponding to the eigenvector of the matrix. Therefore, $w_1 = \lambda_{E1} v_1$, $w_2 = \lambda_{E2} v_2$ and $w_3 = \lambda_{E3} v_3$ hold true between the eigenvector $u_3$ and the vector $Eu_3$. Therefore, Equation (54) indicates that all of the three eigenvalues $\lambda_{E1}$ to $\lambda_{E3}$ of the distortion estimation matrix E are "0" or that the eigenvector $u_3$ of the covariance matrix A is expressed by a linear combination of at least one of the eigenvectors $u_{E1}$ to $u_{E3}$ corresponding to at least one eigenvalue of which a value is "0" among the three eigenvalues $\lambda_{E1}$ to $\lambda_{E3}$ of the distortion estimation matrix E.

In a case in which plural pieces of magnetic data $q_1$ to $q_N$ are distributed two-dimensionally on a plane $\pi$ and in which there is a difference in shape, on the plane $\pi$, between a three-dimensional figure SD and a spherical surface $S_2$, a maximum eigenvalue $\lambda_{E1}$ and an intermediate eigenvalue $\lambda_{E2}$ of a distortion estimation matrix E will be values greater than "0". Therefore, Equation (54) will indicate that a minimum eigenvalue $\lambda_{E3}$ of the distortion estimation matrix E is "0" and that an eigenvector $u_3$ of a covariance matrix A and an eigenvector $u_{E3}$ of the distortion estimation matrix E are parallel.

In a case in which there is no difference in shape, on a plane $\pi$, between a three-dimensional figure SD and a spherical surface $S_2$, i.e., in a case in which a curve $\pi_D$ and a circumference $\pi_C$ coincide with each other in FIG. 7, Equation (54) indicates that all of the three eigenvalues $\lambda_{E1}$ to $\lambda_{E3}$ of the distortion estimation matrix E will be "0".

Thus, by introducing the constraint expressed by Equation (54), a distortion estimation matrix E is defined so that eigenvectors $u_{E1}$ and $u_{E2}$ are parallel to a plane $\pi$ and so that the eigenvector $u_{E3}$ is parallel to a line $\pi_L$. Then, as a property of a matrix, the distortion estimation matrix E will be used to estimate the degree of difference in shape between a three-dimensional figure SD and a spherical surface $S_2$ only in the directions of eigenvectors $u_1$ and $u_2$ of a covariance matrix A, and will be considered to have no distortion in the direction of the eigenvector $u_3$.

In the present embodiment, not only in a case in which plural pieces of magnetic data $q_1$ to $q_N$ are distributed two-dimensionally, but also in a case in which, as described in Section 8.1, plural pieces of magnetic data $q_1$ to $q_N$ are distributed with a three-dimensional extent, the degree of difference in shape between a three-dimensional figure SD and a spherical surface $S_2$ needs to be estimated. In a case in which the distribution of plural pieces of magnetic data $q_1$ to $q_N$ has a three-dimensional extent, the degree of difference in shape between a three-dimensional figure SD and a spherical surface $S_2$ needs to be estimated also for the direction of an eigenvector $u_3$ of a covariance matrix A. Therefore, in estimating the degree of difference in shape between the three-dimensional figure SD and the spherical surface $S_2$, the constraint indicated in Equation (54) should not be strictly satisfied, but the constraint indicated in Equation (54) needs to be loosened depending on the degree of a three-dimensional extent of plural pieces of magnetic data $q_1$ to $q_N$.

Accordingly, we introduce an error (second error) $\delta_E$ as shown in Equation (55). The error $\delta_E$ is a three-dimensional vector in which a coefficient (second coefficient) $\beta$ is multiplied with a vector $Eu_3$ shown in the left-hand side of Equation (54). The coefficient $\beta$ will be a large value in a case in which plural pieces of magnetic data $q_1$ to $q_N$ are distributed two-dimensionally, and will be zero or have a small value close to zero in a case in which plural pieces of magnetic data $q_1$ to $q_N$ are distributed three-dimensionally.

$$\delta_E = \beta E u_3 \quad (55)$$

We now assume a case in which that an error $\delta_E$ is minimized close to zero or to a small value close to zero.

In a case in which a coefficient $\beta$ has a large value, it would not be possible to reduce the error $\delta_E$ close to zero as long as a vector $Eu_3$ of Equation (55) is not reduced close to zero. Therefore, in a case in which the coefficient $\beta$ has a large value, Equation (55) will be an equation that indicates a condition equal to the constraint indicated by Equation (54).

On the other hand, in a case in which a coefficient $\beta$ is zero or has a small value close to zero, an error $\delta_E$ can be reduced close to zero even if a vector $Eu_3$ has a large value. Therefore, in a case in which the coefficient $\beta$ is zero or has a small value close to zero, Equation (55) will be an equation that indicates a condition where the constraint indicated by Equation (54) is loosened by the coefficient $\beta$.

Thus, by minimizing an error $\delta_E$ close to zero, the degree of difference between the shape of a three-dimensional figure SD and the shape of a spherical surface $S_2$ can be estimated depending on the degree of a three-dimensional extent of a distribution of plural pieces of magnetic data $q_1$ to $q_N$.

In the present embodiment, the coefficient $\beta$ is defined as a function of an eigenvalue $\lambda_3$, which has a positive value, as shown in the following Equation (56), where a constant $k_\beta$ of Equation (56) is a real number satisfying $k_\beta > 0$. The coefficient $\beta$ will be a small value close to zero in a case in which an eigenvalue $\lambda_3$ is a large value, and will be a large value close to 1 in a case in which an eigenvalue $\lambda_3$ is a small value.

$$\beta = e^{-k_\beta \lambda_3} \quad (56)$$

An error $\delta_E$ shown in Equation (55) is transformed by a matrix M expressed in Equation (58) to what is shown in Equation (57). The matrix M is a 6-by-3 matrix that has, as components, each element of an eigenvector $u_3$ corresponding to a minimum eigenvalue $\lambda_3$ of a covariance matrix A shown in Equation (59). $0_{3\times3}$ in Equation (57) is a 3-by-3 zero matrix.

$$\delta_E = \beta [M^T \ 0_{3\times 3}] e \quad (57)$$

$$\text{where } M^T = \begin{bmatrix} u_{3x} & 0 & u_{3y} & 0 & 0 & u_{3z} \\ 0 & u_{3y} & u_{3x} & 0 & u_{3z} & 0 \\ 0 & 0 & 0 & u_{3z} & u_{3y} & u_{3x} \end{bmatrix} \quad (58)$$

$$u_3 = \begin{bmatrix} u_{3x} \\ u_{3y} \\ u_{3z} \end{bmatrix} \quad (59)$$

In the distortion determination process described in Section 8.1 (the distortion determination process in a case in which pieces of magnetic data are distributed three-dimensionally), each component of a distortion estimation matrix E and a center point $x_{O2}$ of a spherical surface $S_2$ are calculated by minimizing an objective function $f_{SD}(E,x)$, and the degree of difference in shape between a three-dimensional figure SD having plural pieces of magnetic data $q_1$ to $q_N$ adjacent thereto and the spherical surface $S_2$ is estimated based on the norm of the distortion estimation matrix E.

A method of calculating a center point $x_{O2}$ of a spherical surface $S_2$ by minimizing an objective function $f_{SD}(E,x)$ is to minimize a component "$X(x-q_c)-j$" representing a spherical surface while considering a component $k(E)$ representing distortion. This method uses a method described in Section 2 (calculating the center point of a spherical surface in a case in which it is assumed that pieces of magnetic data are distributed adjacent to a spherical surface thereof), i.e., a method of calculating a center point $x_O$ of a spherical surface S by minimizing an error $\delta_S$ shown in Equation (17). Therefore, a center point $x_{O2}$ of a spherical surface $S_2$ is calculated presuming that plural pieces of magnetic data $q_1$ to $q_N$ are distributed three-dimensionally.

However, in a case in which plural pieces of magnetic data $q_1$ to $q_N$ are distributed two-dimensionally, it is not possible to calculate a center point $x_{O2}$ of a spherical surface $S_2$ based on the method described in Section 2, which presumes that plural pieces of magnetic data $q_1$ to $q_N$ are distributed three-dimensionally.

Accordingly, in a distortion determination process used in a case in which plural pieces of magnetic data $q_1$ to $q_N$ are distributed two-dimensionally, a center point $x_{O2}$ of a spherical surface $S_2$ to be used for the distortion determination process is calculated while considering Equation (22) described in Section 7 (the center point calculation process).

Equation (22) is a constraint for calculating a center point of a spherical surface in a case in which plural pieces of magnetic data $q_1$ to $q_N$ are distributed two-dimensionally. Specifically, in calculating each component of a distortion estimation matrix E and a center point $x_{02}$ of a spherical surface $S_2$, a condition of minimizing an error $\delta_U$ shown in Equation (23) is given, thereby calculating the center point $x_{02}$ of the spherical surface $S_2$ depending on the degree of a three-dimensional extent of plural pieces of magnetic data $q_1$ to $q_N$.

The renewal vector k shown in Equation (22) is a vector for calculating a center point $x_0$ of a spherical surface S. However, in the distortion determination process, a center point $x_{02}$ of a spherical surface $S_2$ needs to be calculated. Therefore, a vector indicating a center point $x_{02}$ of a spherical surface $S_2$ with an old offset $c_o$ as the starting point of the vector will be referred to as a renewal vector (renewal vector for distortion determination) $k_2$, and an error for loosening a condition (first constraint) that the renewal vector $k_2$ and an eigenvector $u_3$ are mutually orthogonal will be referred as an error (first error) $\delta_{U2}$.

Based on Equation (23), the error $\delta_{U2}$ will be expressed as shown in the following Equation (60).

$$\begin{aligned}\delta_{U2} &= \alpha u_3^T k_2 \\ &= \alpha u_3^T \{(x - q_C) - (c_0 - q_C)\} \\ &= \alpha\{[0_6^T \ u_3^T]e - u_3^T(c_0 - q_C)\}\end{aligned} \quad (60)$$

Here, we introduce a vector (distortion estimation vector) $\delta_{SD2}$ shown in Equation (61).

The vector $\delta_{SD2}$ is an (N+4)-dimensional vector having as elements an error $\delta_{SD}$ shown in Equation (41), an error $\delta_E$ shown in Equation (55), and an error $\delta_{U2}$ shown in Equation (60). The error $\delta_{SD}$ shown in Equation (41), for simplicity of calculation, is transformed to a vector "$X_2 e - j$" as appeared in Equation (50) and then is applied to Equation (61). Similarly, the error $\delta_E$ shown in Equation (55), for simplicity of calculation, is transformed to an equation shown in Equation (57) and then applied to Equation (61).

$$\delta_{SD2} = \begin{bmatrix}\delta_{SD} \\ \delta_E \\ \delta_{U2}\end{bmatrix} = \begin{bmatrix}X(x - q_C) + k(E) - j \\ \beta E u_3 \\ \alpha u_3^T k_2\end{bmatrix} \quad (61)$$

$$= \begin{bmatrix}X_2 e - j \\ \beta[M^T \ 0_{3\times 3}]e \\ \alpha\{[0_6^T \ u_3^T]e - u_3^T(c_0 - q_C)\}\end{bmatrix}$$

$$= \begin{bmatrix}X_2 \\ \begin{bmatrix}\beta M^T & 0_{3\times 3} \\ 0_6^T & \alpha u_3^T\end{bmatrix}\end{bmatrix} e - \begin{bmatrix}j \\ 0_3 \\ \alpha u_3^T(c_0 - q_C)\end{bmatrix}$$

In a case in which a vector $\delta_{SD2}$ is minimized, an error $\delta_{SD}$, an error $\delta_{U2}$, and an error $\delta_E$ are minimized overall.

In both cases in which the distribution of plural pieces of magnetic data $q_1$ to $q_N$ is two-dimensional and in which the distribution is three-dimensional, minimizing an error $\delta_{U2}$ enables the calculation of a center point $x_{02}$ of a spherical surface $S_2$. Consequently, a distortion estimation matrix E can be calculated even in a case in which the distribution of plural pieces of magnetic data $q_1$ to $q_N$ is two-dimensional.

Additionally, minimizing an error $\delta_E$ enables the calculation of a distortion estimation matrix E that estimates the degree of difference in shape between a three-dimensional figure SD and a spherical surface $S_2$ only with regard to a direction to which the distribution of plural pieces of magnetic data $q_1$ to $q_N$ has an extent.

Thus, with a distortion estimation matrix E calculated by minimizing an error $\delta_{U2}$, and a vector $\delta_{SD2}$ including an error $\delta_E$, the degree of difference in shape between a three-dimensional figure SD and a spherical surface $S_2$ can be estimated in both cases in which the extent of the distribution of plural pieces of magnetic data $q_1$ to $q_N$ is two-dimensional and in which the distribution is three-dimensional.

Here, to minimize a vector $\delta_{SD2}$ shown in Equation (61), we introduce an objective function (distortion estimation function) $g_{SD2}(e)$ as shown in Equation (62). A solution $e = e_{02}$ that minimizes the objective function $g_{SD2}(e)$ can be obtained by applying the Gaussian elimination method, the Cholesky decomposition method, or another appropriate method to a simultaneous equation expressed in the following Equation (63). Equation (63) is calculated by applying the least squares method to Equation (62).

$$g_{SD2}(e) = \|\delta_{SD2}\|_2 \quad (62)$$

$$\left(X_2^T X_2 + \begin{bmatrix}\beta^2 MM^T & 0_{6\times 3} \\ 0_{3\times 6} & \alpha^2 u_3 u_3^T\end{bmatrix}\right)e = X_2^T j + \begin{bmatrix}0_6 \\ \alpha^2 u_3^T(c_0 - q_C)u_3\end{bmatrix} \quad (63)$$

A distortion estimation matrix E is restored with Equation (38) based on a solution $e_{02}$, and the value of a distortion estimation value $g_D(E)$ shown in Equation (43), i.e., the norm of the distortion estimation matrix E, is obtained. It is then determined whether the value of the distortion estimation value $g_D(E)$ is equal to or less than the threshold $\delta_0$. In a case in which the determination result is affirmative, the CPU 100 advances the process to the subsequent offset update process. On the other hand, in a case in which the determination result is negative, the CPU 100 ends a series of processes.

9. Offset Update Process

The offset update process is a process that is executed in a case in which the value of a distortion estimation value $g_D(E)$ is equal to or less than the threshold $\delta_0$. In the offset update process, the value indicated by the coordinates of a center point $x_0$ calculated in the center point calculation process is employed as a new offset $c_1$, and then the offset c is updated from the old offset $c_0$ to the new offset $c_1$.

In the present embodiment, a center point $x_0$ is employed as a new offset $c_1$, but a center point $x_{02}$ of a spherical surface $S_2$ may be employed as a new offset $c_1$. This is because, in a case in which the value of a distortion estimation value $g_D(E)$ is equal to or less than the threshold $\delta_0$, both a center point $x_0$ of a spherical surface S and a center point $x_{02}$ of a spherical surface $S_2$ almost coincide with a center point $x_{0G}$ of a spherical surface $S_G$ representing a geomagnetic field Bg.

A center point $x_{02}$ of a spherical surface $S_2$ is obtained by substituting into Equation (52) a portion corresponding to $e_x$ of Equation (51), the portion being a portion of solution $e = e_{02}$ that minimizes an objective function $g_{SD2}(e)$.

10. Conclusion

As has been described in the foregoing, the present embodiment has a magnetic data distribution indicator calculation process for calculating a minimum eigenvalue $\lambda_3$ of a covariance matrix A representing the degree of a three-dimensional extent of the distribution of plural pieces of magnetic data $q_1$ to $q_N$ and an eigenvector $u_3$ corresponding to the minimum eigenvalue $\lambda_3$ of the covariance matrix A representing the direction in which the extent is the smallest, a center point calculation process for calculating a center point $x_0$ as a candidate for a new offset $c_1$ both in a case in which the distribution of plural pieces of magnetic data $q_1$ to $q_N$ are three-dimensional and in a case in which the distribution is two-dimensional, a distortion determination process for determining whether it is valid to employ the center point $x_0$ as an offset by estimating the degree of distortion in the shape of a three-dimensional figure SD both in a case in which the distribution of plural pieces of magnetic data $q_1$ to $q_N$ are three-dimensional and in a case in which the distribution is two-dimensional, and an offset update process for employing the center point $x_0$ as a new offset $c_1$ and updating an offset c from an old offset $c_o$ to a new offset $c_1$ in a case in which a result of the determination in the distortion determination process is affirmative.

With these four processes, both in a case in which the distribution of plural pieces of magnetic data $q_1$ to $q_N$ are three-dimensional and in a case in which the distribution is two-dimensional, employing a center point $x_0$ as an offset c can be prevented, when the center point $x_0$ are calculated based on plural pieces of magnetic data $q_1$ to $q_N$ that are measured in a circumstance in which the effects from an external magnetic field Bx are large, thereby enabling the employment, as an offset c, of only an appropriate center point $x_0$ that indicates the value close to an internal magnetic field Bi.

Thus, according to the present embodiment, calculating the value of an accurate geomagnetic field Bg with an accurate offset has been made possible both in a case in which the distribution of plural pieces of magnetic data $q_1$ to $q_N$ are three-dimensional and in a case in which the distribution is two-dimensional. As a result, it has been made possible to calculate an appropriate geomagnetic field Bg even in such a case in which the three-dimensional magnetic sensor 60 is mounted in the device 1, such as an automobile, that changes its orientation only in the right and left directions and changes its orientation a little in the up and down directions.

In the distortion determination process, we have defined a vector $\delta_{SD2}$ having as elements, an error $\delta_{SD}$, an error $\delta_{U2}$, and an error $\delta_E$. The error $\delta_{SD}$ is a vector representing errors between plural sets of coordinates for plural pieces of magnetic data $q_1$ to $q_N$ and the surface of a three-dimensional figure SD. The error $\delta_{U2}$ is a value representing the inner product of a renewal vector $k_2$ and an eigenvector $u_3$. The renewal vector $k_2$ is a vector indicating a center point $x_{02}$ of a spherical surface $S_2$ from an old offset $c_0$ and the eigenvector $u_3$ indicates a direction for which the extent of the distribution of plural pieces of magnetic data $q_1$ to $q_N$ is the smallest. The error $\delta_E$ expresses that, in a case in which the distribution of plural pieces of magnetic data $q_1$ to $q_N$ has a two-dimensional extent, the degree of difference in shape between the three-dimensional figure SD and the spherical surface $S_2$ is estimated only with regard to the direction having the extent. A distortion estimation matrix E and a center point $x_{02}$ that would minimize the norm of the vector $\delta_{SD2}$ are calculated, and the degree of difference in shape between the three-dimensional figure SD and the spherical surface $S_2$ is estimated based on a distortion estimation value $g_D(E)$ representing the magnitude of a maximum eigenvalue $\lambda_{E1}$ of the distortion estimation matrix E (the norm of the distortion estimation matrix E).

In a case in which plural pieces of magnetic data $q_1$ to $q_N$ are distributed two-dimensionally, the rank of a 9-by-9 matrix $X_2^T X_2$ shown in Equation (53) is sometimes less than "9". In this case, it is not possible to calculate a solution $e_0$ based on Equation (53), and it is not possible to calculate a distortion estimation value $g_D(E)$ representing the norm of a distortion estimation matrix E. Therefore, it is not possible to estimate the degree of difference in shape between a three-dimensional figure SD and a spherical surface S.

In contrast, in the present embodiment, by introducing an error $\delta_{U2}$ and an error $\delta_E$, a solution $e_{02}$ is calculated with Equation (63) that has considered a case in which plural pieces of magnetic data $q_1$ to $q_N$ are distributed two-dimensionally, and a distortion estimation value $g_D(E)$ is calculated based on the solution $e_{02}$. Consequently, in the distortion determination process according to the present embodiment, it has been made possible to estimate the degree of difference in shape between a three-dimensional figure SD and a spherical surface $S_2$ even in a case in which plural pieces of magnetic data $q_1$ to $q_N$ are distributed two-dimensionally. Accordingly, it has been made possible to prevent employing, as an offset c, an inappropriate center point $x_0$ calculated based on plural pieces of magnetic data $q_1$ to $q_N$ affected by an external magnetic field Bx, and instead to employ, as an offset c, only an appropriate center point $x_0$ indicating a value close to an internal magnetic field Bi.

Additionally, a distortion estimation matrix E is calculated by minimizing the norm of a vector $\delta_{SD2}$, which has an error $\delta_E$ as an element. The error $\delta_E$ represents that the degree of difference in shape between a three-dimensional figure SD and a spherical surface $S_2$ is not estimated with regard to the direction of an eigenvector $u_3$ in a case in which the distribution of plural pieces of magnetic data $q_1$ to $q_N$ has a two-dimensional extent.

In calculating a distortion estimation matrix E, an error $\delta_E$ is minimized, whereby, in a case in which the distribution of plural pieces of magnetic data $q_1$ to $q_N$ is two-dimensional, the degree of difference in shape between a three-dimensional figure SD and a spherical surface $S_2$ is not estimated with regard to the direction of an eigenvector $u_3$ in which the degree of difference in shape between the three-dimensional figure SD and the spherical surface $S_2$ cannot be estimated, and whereby the distortion estimation matrix E for estimating the degree of difference in shape between the three-dimensional figure SD and the spherical surface $S_2$ is calculated only with regard to the directions of eigenvectors $u_1$ and $u_2$.

An error $\delta_E$ is a product of a second constraint (see Equation (54)) and a coefficient $\beta$. The second constraint expresses that the degree of difference in shape between a three-dimensional figure SD and a spherical surface $S_2$ is not estimated with regard to the direction of an eigenvector $u_3$. The coefficient $\beta$ loosens the second constraint depending on the degree of the three-dimensional extent of plural pieces of magnetic data $q_1$ to $q_N$ (depending on the magnitude of an eigenvalue $\lambda_3$ representing the degree of extent in the direction of the eigenvector $u_3$).

Thus, because the distortion determination process according to the present embodiment calculates a distortion estimation matrix E by considering an error $\delta_E$ that has such coefficient $\beta$, the degree of difference in shape between a three-dimensional figure SD and a spherical surface $S_2$ can now be estimated depending on the degree of the three-dimensional extent, not only in a case in which plural pieces of magnetic data $q_1$ to $q_N$ are distributed two-dimensionally, but also in a case in which the data pieces are distributed with a three-dimensional extent.

Additionally, a center point $x_0$ is calculated by minimizing the norm of a vector $\delta_{SU}$, which is a vector having an error $\delta_U$ as an element.

In calculating a center point $x_0$, an error $\delta_U$ is minimized, thereby to calculate a center point $x_0$ of a spherical surface S as a candidate for a new offset $c_1$ by removing, from information of a center point $x_\pi$ for a spherical surface $S\pi$, inaccurate information on the direction of an eigenvector $u_3$ in a case in which the distribution of plural pieces of magnetic data $q_1$ to $q_N$ is two-dimensional. Accordingly, in the center point calculation process according to the present embodiment, it has been made possible to calculate, depending on the degree of a three-dimensional extent, a center point $x_0$ of a spherical surface S which is a candidate for an accurate offset c also in a case in which plural pieces of magnetic data $q_1$ to $q_N$ are distributed two-dimensionally.

Furthermore, in the magnetic data distribution indicator calculation process according to the present embodiment, a minimum eigenvalue $\lambda_3$ of a covariance matrix A and an eigenvector $u_3$ are calculated, the minimum eigenvalue $\lambda_3$ representing the degree of a three-dimensional extent of the distribution of plural pieces of magnetic data $q_1$ to $q_N$ in the sensor coordinate system $\Sigma_S$, and the eigenvector $u_3$ representing a direction in which the extent is the smallest.

Therefore, in the center point calculation process, it has been made possible to calculate an appropriate center point $x_0$ depending on the degree of the three-dimensional extent for the distribution of plural pieces of magnetic data $q_1$ to $q_N$. Also, in the distortion determination process, it has been made possible to determine the degree of difference in shape between a three-dimensional figure SD and a spherical surface $S_2$ depending on the degree of the three-dimensional extent for the distribution of plural pieces of magnetic data $q_1$ to $q_N$.

In the distortion determination process according to the present embodiment, the degree of difference in shape between a three-dimensional figure SD and a spherical surface $S_2$ is estimated based on a distortion estimation matrix E calculated by minimizing the norm of a vector $\delta_{SD2}$ having an error $\delta_{SD}$ shown in Equation (41) as an element. The error $\delta_{SD}$ expresses two cases distinctly. In one case, plural pieces of magnetic data $q_1$ to $q_N$ are distributed in such a way as to have an error from a spherical surface $S_2$, the error corresponding merely to white noise. In the other case, plural pieces of magnetic data $q_1$ to $q_N$ are distributed adjacent to the surface of a three-dimensional figure SD having a distorted shape different from the spherical surface $S_2$.

For example, with an error $\delta_S$ shown in Equation (17), it is not possible to determine, in a case in which N-number of pieces of magnetic data $q_1$ to $q_N$ are distributed with an error and are deviated from a spherical surface S, whether the error is caused by white noise or by a non-uniform external magnetic field Bx. That is, even in a case in which N-number of pieces of magnetic data $q_1$ to $q_N$ are distributed adjacent to the surface of a three-dimensional figure SD that has a greatly distorted shape from a spherical surface $S_2$, it is only possible to estimate this error simply as an error caused by white noise from a spherical surface. In contrast, because an error $\delta_{SD}$ is used in the distortion determination process according to the present embodiment, it has been made possible to distinguish an error caused by white noise and an error caused by the effects from a non-uniform external magnetic field Bx.

In a case in which N number of errors between N number of sets of coordinates indicated by N number of pieces of magnetic data $q_1$ to $q_N$ and a spherical surface $S_2$, as a whole, are simply white noise, a center point $x_0$ calculated in the center point calculation process and a vector representing an internal magnetic field Bi (a center point $x_{0G}$ of a spherical surface $S_G$ representing a geomagnetic field Bg) can be considered to having almost the same coordinates. In the distortion determination process of the present embodiment, it is possible to distinguish between an error that is simple white noise and distortion due to a non-uniform external magnetic field Bx. Therefore, a center point $x_0$ calculated in a case in which there is white noise can be employed as an offset c. On the other hand, in the distortion determination process in the present embodiment, it is possible to prevent employing, as an offset c, a center point $x_0$ calculated in a case in which there is distortion of a three-dimensional figure SD distorted due to a non-uniform external magnetic field Bx. Therefore, the present embodiment has an advantage that it is possible to prevent employing an inaccurate value as an offset.

A distortion estimation matrix E is a matrix representing the magnitude of N number of errors between N number of sets of coordinates indicated by N number of pieces of magnetic data $q_1$ to $q_N$ and a spherical surface $S_2$. The distortion estimation matrix E has an eigenvector $u_{E1}$ and a maximum eigenvalue $\lambda_{E1}$ representing the magnitude of the error. The eigenvector $u_{E1}$ points to a direction in which, when viewed from a center point $x_0$, an error between a set of coordinates of a piece of magnetic data $q_i$ and the spherical surface $S_2$ is large. In the distortion determination process of the present embodiment, it has been made possible to estimate the degree of difference in shape between a three-dimensional figure SD and a spherical surface $S_2$ based on a distortion estimation value $g_D(E)$ representing the magnitude of a maximum eigenvalue $\lambda_{E1}$ of a distortion estimation matrix E (the norm of the distortion estimation matrix E). Accordingly, it has been made possible to prevent employing a center point $x_0$ of a spherical surface S calculated in the center point calculation process as an offset in a case in which the effects of an external magnetic field Bx are large and in which the degree of difference in shape between a three-dimensional figure SD and a spherical surface $S_2$ is large.

Additionally, in the center point calculation process according to the present embodiment, by assuming that plural pieces of magnetic data $q_1$ to $q_N$ are distributed adjacent to a spherical surface S having a center point $x_0$ as the center, the center point $x_0$ is calculated from the plural pieces of magnetic data $q_1$ to $q_N$, and a result of the calculation is considered as a candidate for an offset. Such a center point calculation process has an advantage that a candidate for an offset c can be calculated by a simple calculation, thereby increasing the processing speed.

In the center point calculation process according to the present embodiment, in calculating a center point $x_0$, the values of plural pieces of magnetic data $q_1$ to $q_N$ are expressed in the barycentric coordinate system $\Sigma_C$, which has a center of gravity $q_c$ of plural pieces of magnetic data $q_1$ to $q_N$ as the origin.

Accordingly, compared with a case in which the calculation is performed using output values, from the three-dimensional magnetic sensor 60, of plural pieces of magnetic data $q_j$ to $q_N$ expressed in the sensor coordinate system $\Sigma_S$, the values of the data pieces can be made smaller and can be expressed in a variable type requiring a small memory size. Thus, the magnetic data processing program 70 according to the present embodiment has an advantage that the amount of memory used can be reduced.

B. Modifications

The present invention is not limited to the above embodiments, and modifications such as are described below are possible. Also, it is possible to combine two or more modifications of the modifications described below.

Modification 1

In the above embodiment, a coefficient α is defined as a function of an eigenvalue $\lambda_3$ as shown in Equation (26), but a coefficient α may be given in two values. For example, in a case in which an eigenvalue $\lambda_3$ is equal to or greater than a threshold (predetermined magnitude) $\lambda_0$, a coefficient α may be set so as to take zero or a positive, small value (second value) that is, without end, close to zero, and in a case in which an eigenvalue $\lambda_3$ is less than the threshold $\lambda_0$, a coefficient $\alpha$ may be set to take a positive, large value (first value).

In this case, in a case in which an eigenvalue $\lambda_3$ is a value less than a threshold $\lambda_0$ and in which information of coordinates of a center point $x_\pi$ is not accurate in the direction of an eigenvector $u_3$, a pair of a renewal vector k and a center point $x_0$ and a pair of a renewal vector $k_2$ and a center point $x_{02}$ can be generated by using, from information on coordinates of the center point $x_\pi$, only information for the directions of eigenvectors $u_1$ and $u_2$ that are highly accurate.

Similarly, in the above embodiment, a coefficient $\beta$ is defined as a function of an eigenvalue $\lambda_3$, such as shown in Equation (56), but a coefficient $\beta$ may be given in two values. For example, in a case in which an eigenvalue $\lambda_3$ is equal to or greater than a threshold $\lambda_0$, a coefficient $\beta$ may be set so as to take zero or a positive, small value (fourth value) that is close to zero without end, and in a case in which an eigenvalue $\lambda_3$ is less than a threshold $\lambda_0$, a coefficient $\beta$ may be set to take a positive, large value (third value).

In this case, in a case in which an eigenvalue $\lambda_3$ is a value less than a threshold $\lambda_0$ and in which the distribution of plural pieces of magnetic data $q_1$ to $q_N$ is two-dimensional, the degree of difference in shape between a three-dimensional figure SD and a spherical surface $S_2$ can be estimated more accurately.

Modification 2

In the above embodiment, a coefficient $\alpha$ is defined as a function of an eigenvalue $\lambda_3$ as shown in Equation (26), but the coefficient $\alpha$ may be a function having as variables the ratio of magnitude between an eigenvalue $\lambda_1$ and an eigenvalue $\lambda_3$. For example, a coefficient $\alpha$ may be defined as a function such that, as an eigenvalue $\lambda_3$ becomes smaller in comparison with an eigenvalue $\lambda_1$, the value of the coefficient $\alpha$ becomes greater.

Similarly, in the above embodiment, a coefficient $\beta$ is defined as a function of an eigenvalue $\lambda_3$ as shown in Equation (56), but the coefficient $\beta$ may be a function having as variables the ratio of magnitude between an eigenvalue $\lambda_1$ and an eigenvalue $\lambda_3$. For example, a coefficient $\beta$ may be defined as a function such that, as an eigenvalue $\lambda_3$ becomes smaller in comparison with an eigenvalue $\lambda_1$, the value of the coefficient $\beta$ becomes greater.

In this case, in a case in which the distribution of plural pieces of magnetic data $q_1$ to $q_N$ is two-dimensional, the degree of difference in shape between a three-dimensional figure SD and a spherical surface can be estimated more accurately. Also, in a case in which the distribution of plural pieces of magnetic data $q_1$ to $q_N$ is two-dimensional, a center point $x_0$ as a candidate for a new offset $c_1$ can be calculated by removing, from information of center point $x_\pi$, inaccurate information on the direction of an eigenvector $u_3$.

Modification 3

In the above embodiment and modifications, a distortion estimation matrix E is calculated based on a solution $e_{02}$ that minimizes an objective function $g_{SD2}(e)$ representing the magnitude of a vector $\delta_{SD2}$ that includes, as elements, an error $\delta_{U2}$, in which a constraint shown in Equation (22) is loosened with a coefficient $\alpha$, and an error $\delta_E$, in which a constraint shown in Equation (54) is loosened with a coefficient $\beta$, but the present invention is not limited thereto. Alternatively, a distortion estimation matrix E may be calculated under a condition that the constraints shown in Equations (22) and (54) are strictly satisfied in a case in which a minimum eigenvalue $\lambda_3$ of a covariance matrix A is a value less than a threshold $\lambda_0$ and in which the distribution of plural pieces of magnetic data $q_1$ to $q_N$ is considered to have a two-dimensional extent (not having a three-dimensional extent).

For example, in a case in which the distribution of plural pieces of magnetic data $q_1$ to $q_N$ is two-dimensional, a solution $e = e_{O4}$ that would minimize an objective function $g_{SD}(e)$ shown in Equation (50) may be calculated under a condition that the constraints shown in Equations (22) and (54) are strictly satisfied, and a distortion estimation matrix E may be calculated by using this solution. A solution $e_{O4}$ that would minimize the objective function $g_{SD}(e)$ calculated under a condition in which the constraints shown in Equations (22) and (54) are strictly satisfied is calculated with the Lagrange multiplier and with the following Equation (64).

As described above, the constraint shown in Equation (22) represents, in a strict sense, a condition that a renewal vector k and an eigenvector $u_3$ are mutually orthogonal, but in the present modification, similarly to Section 8.2, the constraint shown in Equation (22) is used as a constraint that represents that a renewal vector $k_2$ and an eigenvector $u_3$ are mutually orthogonal.

$$\begin{bmatrix} X_2^T X_2 & M_2 \\ M_2^T & 0_{3 \times 3} \end{bmatrix} \begin{bmatrix} e \\ \rho \end{bmatrix} = \begin{bmatrix} X_2^T j \\ b_\rho \end{bmatrix} \tag{64}$$

$$\text{where } M_2 = \begin{bmatrix} M^T & 0_{3 \times 3} \\ 0_6^T & u_3^T \end{bmatrix}^T \tag{65}$$

$$b_\rho = \begin{bmatrix} 0_3 \\ u_3^T (c_0 - q_C) \end{bmatrix} \tag{66}$$

A matrix $M_2$ is a 4-by-9 matrix shown in Equation (65), and a vector $\rho$ is a four-dimensional vector having four Lagrange undetermined multipliers as elements. A vector $b_\rho$ is a 4-dimensional vector shown in Equation (66).

Because a solution $e_{O4}$ calculated with Equation (64) is a solution that strictly satisfies the constraints shown in Equations (22) and (54), the degree of difference in shape between a three-dimensional figure SD and a spherical surface can be accurately estimated in a case in which the distribution of plural pieces of magnetic data $q_1$ to $q_N$ is two-dimensional.

Modification 4

In the above embodiment and modifications, a center point $x_0$ is calculated with Equation (35) by minimizing a vector $\delta_{SU}$, which is a vector including, as an element, an error $\delta_U$ in which the constraint shown in Equation (22) is loosened with a coefficient $\alpha$, but the present invention is not limited thereto. In a case in which a minimum eigenvalue $\lambda_3$ of a covariance matrix A is a value less than a threshold $\lambda_0$ and in which the distribution of plural pieces of magnetic data $q_1$ to $q_N$ can be considered as having a two-dimensional extent (not having a three-dimensional extent), a center point $x_4$ that strictly satisfies the constraint shown in Equation (22) may be calculated. A center point $x_4$ that strictly satisfies the constraint shown in Equation (22) is calculated using the Lagrange multiplier and with the following Equation (67).

$$X_4 x_4 = b_4 \tag{67}$$

$$\text{where } X_4 = \begin{bmatrix} A & u_3 \\ u_3^T & 0 \end{bmatrix} \tag{68}$$

-continued $$x_4 = \begin{bmatrix} x \\ \rho_4 \end{bmatrix} \quad (69)$$

$$b_4 = \begin{bmatrix} X^T j \\ u_3^T c_0 \end{bmatrix} \quad (70)$$

A matrix $X_4$ is a 4-by-4 matrix shown in Equation (68). A vector $x_4$ is a four-dimensional vector having, as elements, a Lagrange undetermined multiplier $\rho_4$ and a vector x representing three-dimensional variables shown in Equation (18). A vector $b_4$ is a four-dimensional vector shown in Equation (70).

Because a center point $x_A$ calculated by Equation (67) has coordinates that strictly satisfy the constraint shown in Equation (22), a center point $x_A$ can be calculated as a candidate for a new offset $c_1$ by strictly removing inaccurate information in the direction of an eigenvector $u_3$ from information of the center point $x_7$, in a case in which the distribution of plural pieces of magnetic data $q_1$ to $q_N$ is two-dimensional.

Modification 5

In the above embodiment and modifications, in the center point calculation process, a center point $x_0$ is calculated with Equation (35) by minimizing a vector $\delta_{SU}$, which is a vector including, as an element, an error $\delta_U$ in which the constraint shown in Equation (22) is loosened by a coefficient $\alpha$, but the present invention is not limited thereto. Instead, a center point $x_0$ may be calculated without considering the constraint shown in Equation (22). For example, a center point $x_0$ may be obtained with Equation (20) by using a method described in Section 2 (2. Calculating the center point of a spherical surface in a case in which it is assumed that pieces of magnetic data are distributed adjacent to the spherical surface). Also, only in a case in which a minimum eigenvalue $\lambda_3$ of a covariance matrix A calculated in the magnetic data distribution indicator calculation process is a value equal to or greater than a threshold $\lambda_0$, and in which the distribution of plural pieces of magnetic data $q_1$ to $q_N$ can be considered as having a three-dimensional extent, a center point $x_0$ may be obtained with Equation (20).

In a case in which it is assumed that plural pieces of magnetic data $q_1$ to $q_N$ are distributed adjacent to a certain spherical surface, a center point $x_0$ is a center point of this spherical surface. Therefore, a center point $x_0$ can be calculated by a freely chosen method for calculating the center point of a spherical surface defined based on pieces of magnetic data $q_1$ to $q_N$ assuming that the spherical surface has the plural pieces of magnetic data $q_1$ to $q_N$ adjacent thereto. In a case in which plural pieces of magnetic data $q_1$ to $q_N$ are used to calculate a center point $x_0$, determining the degree of difference between the shape of a three-dimensional figure SD having the plural pieces of magnetic data $q_1$ to $q_N$ adjacent to the surface thereof and the shape of a spherical surface allows the determination as to whether the center point $x_0$ is a value including an error calculated under the effects from a non-uniform external magnetic field Bx, i.e., whether it is appropriate to employ the center point $x_0$ as an offset c.

Modification 6

In the above embodiment and modifications, a distortion estimation matrix E that minimizes the norm of a vector $\delta_{SD2}$ having an error $\delta_{SD}$, an error $\delta_{U2}$, and an error $\delta_E$ as elements is calculated, thereby to estimate the degree of difference in shape between a three-dimensional figure SD and a spherical surface depending on the degree of a three-dimensional extent for plural pieces of magnetic data $q_1$ to $q_N$ in both cases in which the plural pieces of magnetic data $q_1$ to $q_N$ are distributed two-dimensionally and in which they are distributed three-dimensionally, but the present invention is not limited thereto. Assuming that plural pieces of magnetic data $q_1$ to $q_N$ are distributed with a three-dimensional extent, the degree of difference in shape between a three-dimensional figure SD and a spherical surface may be estimated.

For example, the degree of difference in shape between a three-dimensional figure SD and a spherical surface may be estimated by the distortion determination process limited for use in a case in which plural pieces of magnetic data $q_1$ to $q_N$ are distributed with a three-dimensional extent, which is described in Section 8.1 (8.1. Distortion determination process in a case in which pieces of magnetic data are distributed three-dimensionally). Specifically, calculating, with Equation (53), a solution $e=e_0$ that minimizes an objective function $g_{SD}(e)$ shown in Equation (50) and obtaining the norm of a distortion estimation matrix E calculated using the solution $e_c$, enables the estimation of the degree of difference in shape between a three-dimensional figure SD and a spherical surface.

Only in a case in which a minimum eigenvalue $\lambda_3$ of a covariance matrix A calculated in the magnetic data distribution indicator calculation process has a value equal to or greater than a threshold $\lambda_0$, and in which the distribution of plural pieces of magnetic data $q_1$ to $q_N$ can be considered as having a three-dimensional extent, may the degree of difference in shape between a three-dimensional figure SD and a spherical surface be estimated using the distortion determination process limited to a case in which the distribution has a three-dimensional extent. In this case, in a case in which a minimum eigenvalue $\lambda_3$ of a covariance matrix A calculated in the magnetic data distribution indicator calculation process is a value less than a threshold $\lambda_0$, the initialization process and the magnetic data acquisition process may be executed again.

Modification 7

In the above embodiment and modifications, the process of calculating and updating an offset c includes the initialization process, the magnetic data acquisition process, the magnetic data distribution indicator calculation process, the center point calculation process, the distortion determination process, and the offset update process, but the present invention is not limited thereto, and may be configured without the magnetic data distribution indicator calculation process.

In this case, the center point calculation process may be one that calculates a center point $x_0$ with Equation (20). Additionally, the degree of difference in shape between a three-dimensional figure SD and a spherical surface may be estimated by using the distortion determination process, described in Section 8.1, limited to a case in which plural pieces of magnetic data $q_1$ to $q_N$ are distributed with a three-dimensional extent, and a distortion estimation matrix E may be calculated using a solution $e_0$ obtained by Equation (53).

Modification 8

In the above embodiment and modifications, the process of calculating and updating an offset c includes the initialization process, the magnetic data acquisition process, the center point calculation process, the distortion determination process, and the offset update process, but the present invention is not limited thereto, and may be configured without having the center point calculation process.

Modification 9

In the above embodiment and modifications, a component k(E) representing distortion, as expressed in Equation (37), is a vector having as each element a value given by substituting, into a function kelp) shown in Equation (39), a vector ($q_i-x_0$)

(first vector) indicating a set of coordinates of a piece of magnetic data $q_i$ in a coordinate system having a center point $x_0$ (reference point w) of a spherical surface S (second spherical surface) as the origin, but the present invention is not limited thereto. The component k(E) representing distortion may have as each element a value given by substituting, into Equation (39), a vector (first vector) indicating a set of coordinates of a magnetic data $q_i$ in a coordinate system having, as the origin, a reference point other than a center point $x_0$ of a spherical surface S.

For example, a component k(E) representing distortion may be, as shown in the following Equation (71), expressed by using a vector indicating a set of coordinates of a magnetic data $q_i$ in a coordinate system having a center of gravity $q_c$ of plural pieces of magnetic data $q_1$ to $q_N$ as the origin, in which case, the center of gravity $q_c$ is used as the reference point w. Also, as a method requiring less calculation than the above-described center point calculation process, coordinates of a candidate for a center point of a spherical surface defined based on plural pieces of magnetic data $q_1$ to $q_N$ assuming that the spherical surface has the plural pieces of magnetic data $q_1$ to $q_N$ adjacent thereto may be obtained, and a vector indicating a set of coordinates of a magnetic data $q_i$ in a coordinate system having the obtained coordinates as the origin may be used to express the component k(E) representing distortion. In this case, the coordinates of a candidate for a center point of a spherical surface defined based on pieces of magnetic data $q_1$ to $q_N$ assuming that the spherical surface has the plural pieces of magnetic data $q_1$ to $q_N$ adjacent thereto is used as the reference point w.

Even in a case in which a component k(E) representing distortion is expressed using a vector indicating a set of coordinates of a piece of magnetic data $q_i$ in a coordinate system having, as the origin, a set of coordinates different from a center point $x_0$ of a spherical surface S calculated by the center point calculation means (the center point calculation section), each component of a distortion estimation matrix E is determined so that the direction of an eigenvector $u_{E1}$ corresponding to a maximum eigenvalue $\lambda_{E1}$ of the distortion estimation matrix E is close to a direction viewed from the coordinates (i.e., the origin that is different from the center point $x_0$) to an area including large numbers of pieces of magnetic data $q_i$ having large errors from a spherical surface $S_2$. Also, a maximum eigenvalue $\lambda_{E1}$ of a distortion estimation matrix E will be a value representing the degree of the magnitude of errors between plural pieces of magnetic data and the spherical surface $S_2$ and the errors that are in the direction of an eigenvector $u_{E1}$ when viewed from the coordinates (i.e., the origin that is different from the center point $x_0$). Therefore, also in this case, the degree of difference in shape between a three-dimensional figure SD and a spherical surface $S_2$ can be estimated with a distortion estimation matrix E.

$$k(E) = \begin{bmatrix} (q_1 - q_C)^T E(q_1 - q_C) \\ \vdots \\ (q_N - q_C)^T E(q_N - q_C) \end{bmatrix} \quad (71)$$

In a case in which a component k(E) representing distortion is expressed using a vector indicating a set of coordinates of a magnetic data $q_i$ in a coordinate system having, as the origin, a set of coordinates different from a center point $x_0$ of a spherical surface S, the center point calculation process may be performed only in a case in which a determination result of the distortion determination process is affirmative (i.e., in a case in which the distortion is small). In this case, the distortion determination process may be performed without performing the center point calculation process. In other words, because a set of coordinates of a candidate for the center point of a spherical surface having plural pieces of magnetic data $q_1$ to $q_N$ adjacent thereto are obtained with a method requiring less calculation than the center point calculation process, the coordinates then being used to perform the distortion determination process, the burden of calculation can be reduced in a case in which a determination result by the distortion determination process becomes negative.

Also, in a case in which a component k(E) representing distortion is expressed using a vector indicating a set of coordinates of a magnetic data $q_1$ in a coordinate system having, as the origin, a set of coordinates differing from a center point $x_0$ of a spherical surface S, a center point $x_{02}$ of a spherical surface $S_2$ calculated in the distortion determination process may be used as a new offset $c_1$ without performing the center point calculation process. In this case, because it is possible to calculate and update an offset c without performing the center point calculation process, the process of calculating and updating an offset c can be simplified, and the processing speed can be increased by reducing the burden of calculation.

Modification 10

In the above embodiment and modifications, in the distortion determination process, the degree of difference in shape between a three-dimensional figure SD and a spherical surface $S_2$ is estimated using a component k(E) representing distortion, which is a vector having, as each element, a value given by substituting, into a function ke(p), a vector $(q_1 - x_0)$ indicating a set of coordinates of a magnetic data $q_1$ in a coordinate system that has a center point $x_0$ of a spherical surface S as the origin, but the present invention is not limited thereto. The degree of difference in shape between a three-dimensional figure SD and a spherical surface $S_2$ may be estimated by two distortion estimation matrices E, one being calculated using a component k(E) representing distortion having as an element a value obtained by substituting into the function ke(p) a vector indicating a set of coordinates of a piece of magnetic data $q_i$ in a coordinate system having a center point $x_0$ of a spherical surface S as the origin and the other being calculated using a component k(E) representing distortion having as an element a value obtained by substituting, into the function ke(p), a vector indicating a set of coordinates of a piece of magnetic data $q_i$ in a coordinate system having as the origin coordinates other than a center point $x_0$ of a spherical surface S.

For example, in the distortion determination process, the degree of difference in shape between a three-dimensional figure SD and a spherical surface $S_2$ may be first estimated (first estimation), with a distortion estimation matrix E calculated using a component k(E) representing distortion represented by a vector indicating the coordinates of magnetic data $q_i$ in a coordinate system having a center of gravity $q_c$ as the origin. Subsequently, in a case in which, in the first estimation, the degree of difference in shape between the three-dimensional figure SD and the spherical surface $S_2$ is estimated as being small, the degree of difference in shape between the three-dimensional figure SD and the spherical surface $S_2$ may be estimated (second estimation) with a distortion estimation matrix E calculated using a component k(E) representing distortion represented by a vector indicating a set of coordinates of a magnetic data $q_i$ in a coordinate system having a center point $x_0$ as the origin. Then, in a case in which the degree of difference in shape between the three-dimensional figure SD and the spherical surface $S_2$ is estimated as being small in both of the first and second estimations, a determination result in the distortion determination process will be affirmative (the degree of difference in shape is small), and the center point $x_0$ may then be employed as a new offset $c_1$.

Additionally, in the distortion determination process, the second estimation may be performed first, and in a case in which, in the second estimation, the degree of difference in shape between the three-dimensional figure SD and the spherical surface $S_2$ is estimated as being small, the first estimation may then be performed.

Thus, by performing the estimation of the difference in shape between a three-dimensional figure SD and a spherical surface $S_2$ twice using two components k(E) representing distortion expressed in two coordinate systems, the difference in shape between the three-dimensional figure SD and the spherical surface $S_2$ can be estimated more accurately, compared with a case in which the estimation is performed only once using one component k(E) representing distortion expressed in one coordinate system.

Modification 11

In the above embodiment, the device 1 has the CPU 10, the RAM 20, ROM 30, the communication section 40, the display section 50, and the three-dimensional magnetic sensor 60, but the present invention is not limited thereto, and the device 1 may have a sensor other than the three-dimensional magnetic sensor 60. For example, in a case in which the device 1 has, in addition to the three-dimensional magnetic sensor 60, a sensor such as an acceleration sensor and an angular velocity sensor other than the three-dimensional magnetic sensor 60, outputs from these plural sensors may be used to calculate a vector $^SBi$ representing the direction and the magnitude of an internal magnetic field Bi, and this may be used as a center point $x_0$.

In the distortion determination process, regardless of how a center point $x_0$ is calculated, it is possible to determine whether the calculated center point $x_0$ is one that represents the direction and magnitude of an internal magnetic field Bi calculated without being affected by a non-uniform external magnetic field Bx.

Modification 12

In the above embodiments and modifications, the device 1 is configured to have a three-dimensional magnetic sensor 60, but the present invention is not limited thereto. Instead, the device 1 may contain a two-dimensional magnetic sensor.

Therefore, the geomagnetic field measurement device according to the above embodiments and modifications may be adapted to determine whether an offset for the three-dimensional magnetic sensor 60 is correct or incorrect, and to update the offset for the three-dimensional magnetic sensor 60, but the present invention is not limited thereto. Instead, the geomagnetic field measurement device of the present invention may be adapted to determine whether an offset for a two-dimensional magnetic sensor is correct or incorrect, and to update the offset for the two-dimensional magnetic sensor.

The two-dimensional magnetic sensor has two magnetic sensor modules for dividing a magnetic field vector of the above-described geomagnetic field Bg, external magnetic field Bx, and internal magnetic field Bi into components of two directions that are mutually orthogonal and for detecting the scalar quantity of the components. The two-dimensional magnetic sensor then outputs a two-dimensional vector data having, as two components thereof, scalar quantities respectively output by the two magnetic sensor modules. The two-dimensional magnetic sensor then outputs a two-dimensional vector data having two components configured in a similar manner as for the three-dimensional magnetic sensor 60, except for not having a Z-axis sensor 63.

In the following, a two-axis coordinate system will be referred to as a sensor coordinate system $\Sigma_{S2}$. The sensor coordinate system $\Sigma_{S2}$ is a two-axis coordinate system fixed to a two-dimensional magnetic sensor, and is mounted so as to plot, on an x-axis and a y-axis, each of values output by the two sensor modules of the two-dimensional magnetic sensor.

The geomagnetic field measurement device of Modification 12 performs an initialization process, a magnetic data acquisition process, a magnetic data distribution indicator calculation process, a center point calculation process, a distortion determination process, and an offset update process using pieces of magnetic data q that are pieces of two-dimensional vector data.

Specifically, the initialization process, the magnetic data acquisition process, and the magnetic data distribution indicator calculation process performed by the geomagnetic field measurement device according to Modification 12 are the same as the initialization process, the magnetic data acquisition process, and the magnetic data distribution indicator calculation process performed by the geomagnetic field measurement device according to the above embodiments and modifications, except that pieces of two-dimensional vector data (magnetic data q) are used instead of pieces of three-dimensional vector data (magnetic data q).

For example, the magnetic data distribution indicator calculation process performed by the geomagnetic field measurement device according to Modification 12 is a process in which the distribution of plural sets of coordinates respectively indicated by plural pieces of magnetic data $q_1$ to $q_N$ is determined as a one-dimensional distribution not having a two-dimensional extent in a case in which a smaller one of the two eigenvalues of a 2-by-2 covariance matrix A is less than a threshold, the covariance matrix A representing a variance of sets of coordinates respectively indicated by plural pieces of magnetic data $q_1$ to $q_N$.

The offset update process performed by the geomagnetic field measurement device according to Modification 12 is the same as the offset update process performed by the geomagnetic field measurement device according to the above embodiments and modifications, except that an offset c that is a two-dimensional vector (or two-dimensional coordinates) is used instead of an offset c that is a three-dimensional vector (or three-dimensional coordinates).

The center point calculation process performed by the geomagnetic field measurement device according to Modification 12 is the same as the center point calculation process (i.e., the center point calculation process performed by using the method described in Section 2) performed by the geomagnetic field measurement device according to Modification 5, except that a magnetic data q that is two-dimensional vector data is used instead of a magnetic data q that is three-dimensional vector data.

In other words, the center point calculation process performed by the geomagnetic field measurement device according to Modification 12 is a process expressed by the above Equations (1) to (21) from which z-axis components have been removed, and is a process of calculating a center point $x_0$ of a circumference S defined so as to have sets of coordinates for plural pieces of magnetic data $q_1$ to $q_N$ adjacent thereto, each set of the coordinates being expressed in the sensor coordinate system $\Sigma_{S2}$.

Additionally, the distortion determination process performed by the geomagnetic field measurement device according to Modification 12 is the same as the distortion determination process performed by the geomagnetic field measurement device according to Modification 6 (i.e., the distortion determination process described in Section 8.1), except that a magnetic data q that is a two-dimensional vector data is used instead of a magnetic data q that is a three-dimensional vector data.

In other words, the distortion determination process performed by geomagnetic field measurement device according to Modification 12 is a process expressed by the above Equations (36) to (53) from which z-axis components have been removed, and is a process of determining to what degree the shape of a curve SD is different from the shape of a circumference (circumference $S_2$), with the curve SD being defined so as to have sets of coordinates for plural pieces of magnetic data $q_1$ to $q_N$ adjacent thereto, each set of the coordinates being expressed in the sensor coordinate system $\Sigma_{S'}$.

In the following, a description will be given of transformations of equations necessary for applying the above Equations (1) to (21) and Equations (36) to (53) to the present modification.

In the center point calculation process performed by the geomagnetic field measurement device according to Modification 12, a magnetic data $q_i$, a center of gravity $q_c$ of a magnetic data, and a center point $x_0$ used in Equation (19) representing an objective function $f_s(x)$ and in Equation (20) for obtaining the coordinates of a center point $x_0$ of a circumference S will be indicated by the following Equations (72) and (74) as a two-dimensional vector on the sensor coordinate system $\Sigma_{S2}$. A variable x of an objective function $f_s(x)$ is a two-dimensional vector represented by $x=(x, y)^T$.

$$q_i = [x_i y_i]^T \ (i=1, \ldots, N) \quad (72)$$

$$q_C = [q_{cx} q_{cy}]^T \quad (73)$$

$$x_0 = [x_0 y_0]^T \quad (74)$$

In the distortion determination process performed by the geomagnetic field measurement device according to this modification, a distortion estimation matrix E used in Equation (41) representing an objective function $f_{SD}(E,x)$ is the following Equation (75).

$$E = \begin{bmatrix} e_{11} & e_{12} \\ e_{12} & e_{22} \end{bmatrix} \quad (75)$$

A function ke(p), a vector $ke_2(i)$, a matrix $X_2$, and a vector e used in deriving a distortion estimation value $g_D(E)$ of Equation (43) and an objective function $g_{SD}(e)$ of Equation (50) are the following Equations (76) to (81) in this modification.

$$ke(p) = e_{11} p_x^2 + e_{22} p_y^2 + 2e_{12} p_x p_y \quad (76)$$

$$= \begin{bmatrix} p_x^2 \\ p_y^2 \\ 2 p_x p_y \end{bmatrix}^T e_E$$

where $p = [p_x \ p_y]^T$ (77)

$$e_E = [e_{11} \ e_{22} \ e_{12}]^T \quad (78)$$

$$ke_2(i) = \begin{bmatrix} (x_i - x_0)^2 \\ (y_i - y_0)^2 \\ 2(x_i - x_0)(y_i - y_0) \end{bmatrix} \ (i=1, \ldots, N) \quad (79)$$

$$X_2 = \begin{bmatrix} (x_1 - x_0)^2 & \ldots & (x_N - x_0)^2 \\ (y_1 - y_0)^2 & \ldots & (y_N - y_0)^2 \\ 2(x_1 - x_0)(y_1 - y_0) & \ldots & 2(x_N - x_0)(y_N - y_0) \\ (x_1 - x_C) & \ldots & (x_N - x_C) \\ (y_1 - y_C) & \ldots & (y_N - y_C) \end{bmatrix} \quad (80)$$

$$= \begin{bmatrix} ke_2(1)^T & (q_1 - q_C)^T \\ ke_2(2)^T & (q_2 - q_C)^T \\ \vdots & \vdots \\ ke_2(N)^T & (q_N - q_C)^T \end{bmatrix}$$

$$e = \begin{bmatrix} e_E \\ e_X \end{bmatrix} = \begin{bmatrix} e_{11} \\ e_{22} \\ e_{12} \\ x - q_{cx} \\ y - q_{cy} \end{bmatrix} \quad (81)$$

A simulation was performed to validate the effectiveness of the center point calculation process and the distortion determination process. In the following, a description is given of preconditions of the simulation and results thereof.

A description will be given of a method of generating pieces of magnetic data $q_1$ to $q_N$ used in the simulation and preconditions, with reference to FIGS. 15A to 15C.

Figure 15A:
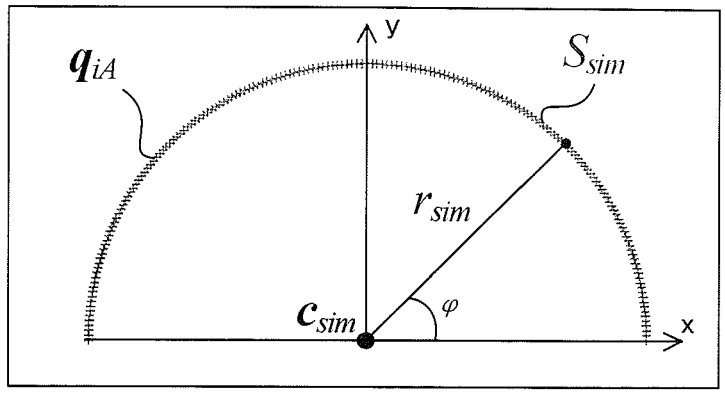
FIGS. 15A, 15B, and 15C are diagrams for explaining data used in a simulation of the present invention.

As shown in FIG. 15A, plural pieces of magnetic data $q_{1A}$ to $q_{NA}$ are prepared as Case A, assuming a case with no observational error and no non-uniformity of a magnetic field due to an external magnetic field Bx. Specifically, a case is assumed in which plural pieces of magnetic data $q_{1A}$ to $q_{NA}$ are observed in such a way that angles φ(phi) of the data pieces from x-axis will be degree by degree on a circumference $S_{sim}$ having a $c_{sim}=(0,0)^T$ as the center point and having a radius $r_{sim}$. It is further assumed that the number of data N is N=181 (i.e., angle φ is 0≤φ≤180), and the plural pieces of magnetic data $q_{1A}$ to $q_{NA}$ are distributed equally on the upper half of the circumference $S_{sim}$.

The center point $c_{sim}$ is a true offset, i.e., is a value given as a precondition for the simulation in which there is no measurement error of sensors, and in which there is no external magnetic field Bx or in which the externak magnetic field is completely uniform. It is impossible to calculate such center point $c_{sim}$ from pieces of magnetic data that can be obtained from actual observations, but the center point $c_{sim}$ is set as a precondition for simulation. The center point $c_{sim}$ indicates coordinate values of a vector representing an internal magnetic field Bi. In the simulation, the coordinates of the center point $c_{sim}$, is assumed to be $(0,0)^T$ for simplicity.

Figure 15B:
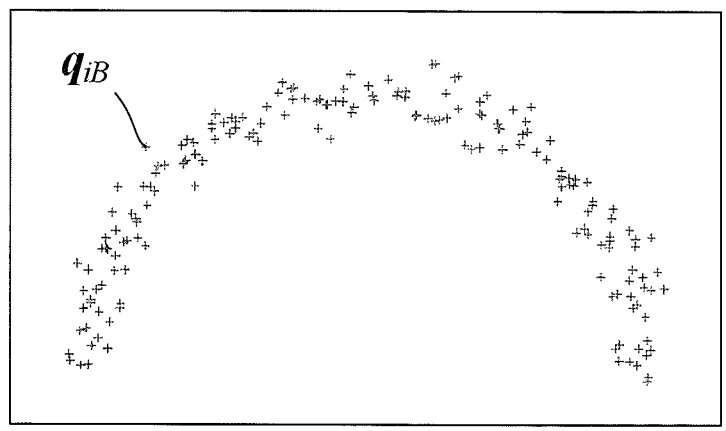

As Case B, as shown in FIG. 15B, plural pieces of magnetic data $q_{1B}$ to $q_{NB}$ are prepared by adding, in respective x-axis and y-axis directions, values of normal random numbers to each set of coordinates of each of the plural pieces of magnetic data $q_{1A}$ to $q_{NA}$ prepared in Case A. For these plural pieces of magnetic data $q_{1B}$ to $q_{NB}$, a case is assumed in which white noise, being an observational error, is added to each of the plural pieces of magnetic data $q_{1A}$ to $q_{NA}$.

Figure 15C:
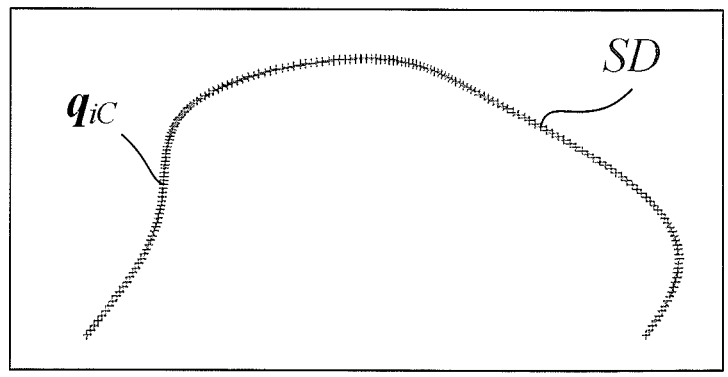

As Case C, as shown in FIG. 15C, plural pieces of magnetic data $q_{1c}$ to $q_{NC}$ are prepared such as forming a smoothly distorted curve SD different from the circumference $S_{sim}$ by suitably displacing, to a radius direction, each set of coordinates for each of the plural pieces of magnetic data $q_{1A}$ to $q_{NA}$ prepared in Case A. The plural pieces of magnetic data $q_{1c}$ to $q_{NC}$ are assumed to have been affected by an external magnetic field Bx.

The plural pieces of magnetic data set in Cases A to C were applied to the center point calculation process and the distortion determination process. Specifically, assuming that plural pieces of magnetic data are on a circumference S, a center point $x_0$ of the circumference S was calculated with Equation (20), and a value of a distortion estimation value $g_D(E)$ given in Equation (43) was calculated for each of Cases A to C.

For comparison, an estimation value $f_o$ represented in the following Equation (82) was calculated, which the same inventor disclosed as Equation (28) in Japanese Patent Laid-Open Publication 2007-107921 (corresponding to U.S. Pat. No. 7,418,359). An estimation value $f_0$ is for determining, for pieces of magnetic data $q_1$ to $q_N$, the degree of errors from a circumference (or a spherical surface) having an $x_0$ as the center point with a radius r. In this simulation, the radius r used in the estimation value $f_0$ was calculated based on the distance between the above-described center point $x_0$ and each piece of magnetic data $q_1$ to $q_N$, as shown in Equation (83).

$$f_0 = \frac{1}{Nr^2} \sum_{i=1}^{N} (\|q_i - x_0\|_2 - r)^2 \qquad (82)$$

$$\text{where } r = \sqrt{\frac{1}{N} \sum_{i=1}^{N} \|q_i - x_0\|_2^2} \qquad (83)$$

Furthermore, as shown in the following Equation (84), an error δx was calculated. The error δx shows the distance between a center point $x_0$ calculated by the center point calculation means (center point calculation section) and a center point $c_{sim}=(0,0)^T$ representing a true offset given as a precondition for the simulation.

This error δx is a value that can be calculated only in a simulation where the true offset, a center point $c_{sim}$, is known. It is possible, by using an error δx, to determine whether it is appropriate to employ, as an offset, a center point $x_0$ calculated by the center point calculation means. Specifically, in a case in which an error δx is a large value, the distance between a center point $x_0$ and the true offset, i.e., a center point $c_{sim}$, is large. In this case, because the coordinate of a center point $x_0$ does not accurately represent the true offset, it is not appropriate to use the center point $x_0$ as an offset.

In this simulation, for each of Cases A to C, a comparison was made between an error δx and each of values indicated respectively by a distortion estimation value $g_D(E)$ and an estimation value $f_0$. It was then tested whether each of the distortion estimation value $g_D(E)$ and the estimation value $f_0$ is valid as an estimation value for evaluating whether a center point $x_0$ is an inappropriate value.

$$\delta_x = \frac{\|x_0 - c_{sim}\|_2}{r_{sim}} \times 100 (\%) \qquad (84)$$

In the following, a description will be given of results of the simulation, with reference to a simulation result table shown in FIG. 16.

A description is first given of the errors δx for Cases A to C shown in the first column of the simulation result table. The error δx is 0.00% for Case A, and is 2.79% for Case B. In contrast, in Case C, the error δx is 7.78%, which is a value greater than that for Case B. This means that, for Case C, a center point $x_0$ calculated by the center point calculation means has a large error from the true offset, the center point $c_{sim}$. Therefore, for Case C, because the center point $x_0$ has a large error, employing the center point $x_0$ as an offset needs to be avoided, but for Case B, because a center point $x_0$ has a small error, employing the center point $x_0$ as an offset is permissible.

A description is next given of values of the distortion estimation values $g_D(E)$ for Cases A to C shown in the second column of the simulation result table. The distortion estimation value $g_D(E)$ takes a value of $4.36 \times 10^{-14}$ for Case A, and takes a value of $6.07 \times 10^{-2}$ for Case B. In contrast, the distortion estimation value $g_D(E)$ takes a value of $2.42 \times 10^{-1}$ for Case C, which is a large value compared to that for Case B. That is, for Case C in which the error δx is large, the distortion estimation value $g_D(E)$ also has a large value, and for Case B in which the error δx is small, the distortion estimation value $g_D(E)$ takes a small value. Thus, based on a distortion estimation value $g_D(E)$, it was possible to estimate an error δx between a center point $x_0$ and the true offset, the center point $c_{sim}$. In other words, by using a distortion estimation value $g_D(E)$, it is possible to evaluate whether the coordinates of a center point $x_0$ calculated by the center point calculation means is an inappropriate value calculated based on pieces of magnetic data affected by an external magnetic field Bx, and it is possible to prevent employing, as an offset, the coordinates (or a vector indicated by the coordinates) of an inappropriate center point $x_0$.

A description is then given of values of the estimation value $f_o$ for Cases A to C shown in the third column of the simulation result table. The estimation value $f_0$ takes a value of $7.25 \times 10^{-14}$ for Case A, and takes a value of $3.14 \times 10^{-3}$ for Case B, but takes a value of $3.01 \times 10^{-3}$ for Case C.

The estimation value $f_o$ takes a larger value for Case B in which the error δx has a small value than Case C in which the error δx has a large value. Therefore, some of estimation values $f_0$ cannot be used to estimate an error δx between a center point $x_0$ and the true offset, the center point $c_{sim}$. In other words, even with use of an estimation value $f_0$, which is a publicly known estimation value, it is not possible to evaluate whether the coordinates of a center point $x_0$ calculated by the center point calculation means is an inappropriate value calculated based on pieces of magnetic data affected by an external magnetic field Bx, and it is not possible to prevent employing, as an offset, the coordinates (or a vector indicated by the coordinates) of an inappropriate center point $x_0$.

Thus, for Case C in which the error δx has a large value, both distortion estimation value $g_D(E)$ and estimation value $f_0$ take large values. In contrast, for Case B in which the error δx has a small value, the distortion estimation value $g_D(E)$ takes a small value, whereas the estimation value $f_0$ takes a large value. Accordingly, the distortion estimation value $g_D(E)$ can be considered valid as an estimation value to be used for estimating an error δx between a center point $x_0$ and the true offset, the center point $c_{sim}$.

In other words, with estimation using the distortion estimation value $g_D(E)$, a case in which sets of coordinates respectively indicated by plural pieces of magnetic data $q_1$ to $q_N$ are distributed adjacent to a circumference (a circumference S or a circumference $S_2$) can be distinguished from a case in which the sets of coordinates are distributed adjacent to a curve SD different from the circumference, the curve SD having a distorted shape. Therefore, it is possible to prevent employing as an offset, the coordinates (or a vector indicated by the coordinates) of an inappropriate center point $x_o$.

Description of Reference Numerals

1 . . . device, 1A . . . geomagnetic field measurement device, 2 . . . object, 10 . . . CPU (distortion determination section (or distortion determination means), offset update section (or offset update means), center point calculation section (or center point calculation means), distribution indicator calculation section (or distribution indicator calculation means), 20 ... RAM (storage device), 50 ... display section, 60 ... three-dimensional magnetic sensor, Bg ... geomagnetic field, Bi ... internal magnetic field, Bx ... external magnetic field, $E(sigma)_G$ ... ground coordinate system, $\Sigma_S, \Sigma_{S2}$ ... sensor coordinate system, $q_1$ ... magnetic data, $x_0$ ... center point, $X_{0G}$ ... center point (geomagnetic field), c ... offset, $c_0$ ... old offset, $c_1$ ... new offset, E ... distortion estimation matrix, Ps ... position, θ(theta)s ... orientation, S ... spherical surface (second spherical surface), $S_2$ ... spherical surface (first spherical surface), $S_G$ ... spherical surface (spherical surface representing geomagnetic field), SX ... curved surface, SD ... three-dimensional figure, $g_{SD}(e), f_{SD}(E,x)$ ... objective function (three-dimensional figure distortion estimation function), $g_{SD2}(e)$ ... objective function (distortion estimation function), $\delta(delta)_{SD2}$ ... vector (distortion estimation vector), $g_D(E)$ ... distortion estimation value, A ... covariance matrix, $\delta_{SD}$ error (three-dimensional error), $\delta_S$ ... error (second spherical surface error), $\delta_{S2}$ ... error (first spherical surface error), k(E) ... component k(E) representing distortion, $\delta_U$ ... error (third error), $\delta_{U2}$ ... error (first error), α(alpha) ... coefficient (first coefficient), $\delta_E$ ... error (second error), β(beta) ... coefficient (second coefficient), λ(lambda)$_0$ ... threshold (predetermined magnitude), $\lambda_3$ ... minimum eigenvalue (distribution indicator), k ... renewal vector (renewal vector for center point calculation), $k_2$ ... renewal vector (renewal vector for distortion determination), $g_S(x)$ ... objective function (center point calculation function), $\delta_{SU}$ ... vector (center point calculation vector), w ... reference point.

What is claimed is:

1. A geomagnetic field measurement device comprising:
a three-dimensional magnetic sensor that measures respective magnetic components of three directions;
a storage device that stores, as pieces of vector data expressed in a three-axis coordinate system, plural pieces of magnetic data sequentially output from the three-dimensional magnetic sensor;
a computer having software that, when run on the computer, causes the computer to have a plurality of functional sections, comprising:
a distortion determination section that calculates, based on a three-dimensional error indicating errors between plural sets of coordinates indicated by the plural pieces of magnetic data stored in the storage device and a surface of a three-dimensional figure having a distorted shape different from a first spherical surface, a distortion estimation value indicating a degree of difference in shape between the three-dimensional figure and the first spherical surface, and that determines whether there is distortion in a shape of the three-dimensional figure based on the distortion estimation value, the three-dimensional figure being defined so that plural sets of coordinates indicated by the plural pieces of magnetic data are distributed adjacent to the surface of the three-dimensional figure; and
an offset update section that updates an offset for correcting each of the plural pieces of magnetic data in a case in which it is determined by the distortion determination section that there is no distortion,
wherein the three-dimensional error is a sum of a first spherical surface error and a component representing distortion that is obtained by substituting a first vector into a function, the first vector being expressed based on a set of coordinates indicated by a reference point and magnetic data and the function being expressed with a three variable quadratic form having a distortion estimation matrix as a coefficient matrix, and
wherein the first spherical surface error represents an error between a set of coordinates indicated by each of the plural pieces of magnetic data and the first spherical surface.

2. A geomagnetic field measurement device according to claim 1 wherein the functional sections further comprise:
a center point calculation section that calculates, based on the plural pieces of magnetic data, coordinates of a center point of a second spherical surface defined assuming that the plural sets of coordinates indicated by the plural pieces of magnetic data are distributed adjacent to the second spherical surface.

3. A geomagnetic field measurement device according to claim 2,
wherein the offset update section updates the offset from an old offset to a set of coordinates indicating the center point of the second spherical surface in a case in which it is determined by the distortion determination section that there is no distortion.

4. A geomagnetic field measurement device according to claim 1,
wherein the three-dimensional magnetic sensor is built in a device containing parts that generate a magnetic field; and
wherein the offset is a set of coordinates indicated by three-dimensional vector data representing a component of the magnetic field generated by the parts, the three-dimensional vector data being included in each of the plural pieces of magnetic data.

5. A geomagnetic field measurement device according to claim 4, wherein the functional sections further comprise a section that prompts a user to change an orientation of the device without changing a position of the device in a case in which it is determined by the distortion determination section that there is distortion.

6. A geomagnetic field measurement device according to claim 1,
wherein the distortion estimation value is an absolute value of a maximum eigenvalue of the distortion estimation matrix when an objective function expressed based on the three-dimensional error is minimized.

7. A geomagnetic field measurement device according to claim 6, wherein the functional sections further comprise:
a center point calculation section that calculates, based on the plural pieces of magnetic data, coordinates of a center point of a second spherical surface defined assuming that the plural sets of coordinates indicated by the plural pieces of magnetic data are distributed adjacent to the second spherical surface.

8. A geomagnetic field measurement device according to claim 7,
wherein the center point calculation section calculates the center point of the second spherical surface so as to minimize a second spherical surface error, the second spherical surface error corresponding to a vector having, as elements, errors between the plural sets of coordinates indicated by the plural pieces of magnetic data and the second spherical surface.

9. A geomagnetic field measurement device according to claim 8,
wherein the distortion determination section employs, as the reference point, the center point of the second spherical surface.

10. A geomagnetic field measurement device according to claim 9, wherein the functional sections further comprise:
   a distribution indicator calculation section that calculates a distribution indicator indicating a degree of a three-dimensional extent of a distribution of the plural sets of coordinates indicated by the plural pieces of magnetic data stored in the storage device.

11. A geomagnetic field measurement device according to claim 10,
   wherein the center point calculation section calculates the center point of the second spherical surface in a case in which the distribution indicator is equal to or greater than a predetermined magnitude.

12. A geomagnetic field measurement device according to claim 11,
   wherein the objective function represents a magnitude of the three-dimensional error, and has, as variables, each component of the distortion estimation matrix and each component of coordinates indicated by a center point of the first spherical surface.

13. A geomagnetic field measurement device according to claim 12,
   wherein the distribution indicator is a minimum eigenvalue of a covariance matrix representing a variance of the plural pieces of magnetic data.

14. A geomagnetic field measurement device according to claim 13,
   wherein the covariance matrix is expressed by the following A;
   wherein the center point calculation section calculates, as the center point of the second spherical surface, x that minimizes a value of the following center point calculation function $f_S(x)$, x being a three-dimensional vector having three variable as elements; and
   wherein, when the distortion estimation matrix is E, a center point of the second spherical surface is $x_0$, and the objective function is expressed with the following $f_{SD}$(E, x) having each element of x and each component of E as variables, the distortion determination section calculates, as the distortion estimation value, an absolute value of the maximum eigenvalue of E when, $f_{SD}$(E, x) is minimized, $$A = X^T X$$

$$f_S(x) = \|X(X - q_C) - j\|_2$$

$$f_{SD}(E, x) = \|X(x - q_C) + k(E) - j\|_2$$

where
X is the following N-by-3 matrix, where N is a natural number equal to or greater than 5,
$q_c$ is the following three-dimensional vector, where the coordinates indicated by the magnetic data is denoted by the following $q_i$,
j is an N-dimensional vector, where R is the following scalar,
the distortion estimation matrix E is the following 3-by-3 symmetric matrix, and
k(e) is the following N-dimensional vector $$X = \begin{bmatrix} (q_1 - q_C)^T \\ \vdots \\ (q_N - q_C)^T \end{bmatrix} \quad q_C = \frac{1}{N} \sum_{i=1}^{N} q_i$$

$$q_i = [x_i \ y_i \ z_i]^T \quad (i = 1, \ldots, N)$$

-continued $$j = \frac{1}{2} \begin{bmatrix} (q_1 - q_C)^T(q_1 - q_C) - R \\ \vdots \\ (q_N - q_C)^T(q_N - q_C) - R \end{bmatrix} \quad R = \frac{1}{N} \sum_{i=1}^{N} (q_i - q_C)^T(q_i - q_C)$$

$$E = \begin{bmatrix} e_{11} & e_{12} & e_{13} \\ e_{12} & e_{22} & e_{23} \\ e_{13} & e_{23} & e_{33} \end{bmatrix} \quad k(E) = \begin{bmatrix} (q_1 \ x_0)^T E(q_1 \ x_0) \\ \vdots \\ (q_N - x_0)^T E(q_N - x_0) \end{bmatrix}.$$

15. A geomagnetic field measurement device according to claim 1, wherein the functional sections further comprise:
   a distribution indicator calculation section that calculates a distribution indicator indicating a degree of a three-dimensional extent of a distribution of the plural sets of coordinates indicated by the plural pieces of magnetic data stored in the storage device.

16. A geomagnetic field measurement device according to claim 15,
   wherein the distortion determination section calculates the distortion estimation value based on the plural pieces of magnetic data and the distribution indicator.

17. A geomagnetic field measurement device according to claim 16, wherein the functional sections further comprise:
   a center point calculation section that calculates, based on the plural pieces of magnetic data and the distribution indicator, coordinates of a center point of a second spherical surface defined assuming that the plural sets of coordinates indicated by the plural pieces of magnetic data are distributed adjacent to the second spherical surface.

18. A geomagnetic field measurement device according to claim 17,
   wherein the offset update section updates the offset from an old offset to a set of coordinates indicating the center point of the second spherical surface in a case in which it is determined by the distortion determination section that there is no distortion.

19. A geomagnetic field measurement device according to claim 18,
   wherein the distortion estimation value is an absolute value of a maximum eigenvalue of the distortion estimation matrix when an objective function expressed based on the three-dimensional error is minimized.

20. A geomagnetic field measurement device according to claim 19,
   wherein the distribution indicator is a minimum eigenvalue of a covariance matrix representing a variance of the plural pieces of magnetic data.

21. A geomagnetic field measurement device according to claim 20,
   wherein the distortion determination section employs, as the reference point, the center point of the second spherical surface.

22. A geomagnetic field measurement device according to claim 21,
   wherein the objective function has, as variables, each component of the distortion estimation matrix and each component of coordinates indicated by a center point of the first spherical surface;
   wherein the objective function is a function representing a magnitude of a distortion estimation vector, the distortion estimation vector being a vector having, as elements, the three-dimensional error, a first error, and a second error, with the first error being a value obtained by multiplying a first coefficient with an inner product of a normalized eigenvector corresponding to the minimum eigenvalue of the covariance matrix and a renewal vector for distortion determination, with the renewal vector for distortion determination being a three-dimensional vector having the old offset as a starting point and the coordinates of the center point of the first spherical surface as an end point, and with the second error being a value obtained by multiplying a second coefficient with a product of the distortion estimation matrix and the eigenvector;

wherein the distortion determination section calculates, as the distortion estimation value, an absolute value of the maximum eigenvalue of the distortion estimation matrix as of when the objective function is minimized.

23. A geomagnetic field measurement device according to claim 22, wherein the center point calculation section calculates, as the coordinates of the center point of the second spherical surface, coordinates indicated by a three-dimensional vector that minimizes a value of a center point calculation function, the center point calculation function representing a magnitude of a center point calculation vector having the three-dimensional vector as a variable and having a second spherical surface error and a third error as elements, with the second spherical surface error representing errors between the plural sets of coordinates indicated respectively by the plural pieces of magnetic data and the second spherical surface, with the third error being a value obtained by multiplying the first coefficient with an inner product of the normalized eigenvector corresponding to the minimum eigenvalue of the covariance matrix and a renewal vector for center point calculation, and with the renewal vector for center point calculation being a vector having the old offset as a starting point and having the coordinates indicated by the center point of the second spherical surface as an end point.

24. A geomagnetic field measurement device according to claim 21, wherein the objective function is a function representing a magnitude of the three-dimensional error and having as variables each component of coordinates indicated by the center point of the first spherical surface and each component of the distortion estimation matrix; and wherein, in a case in which the minimum eigenvalue of the covariance matrix is a value less than a predetermined magnitude, the distortion estimation value is an absolute value of the maximum eigenvalue of the distortion estimation matrix that minimizes the objective function, given that a first constraint and a second constraint are satisfied, the first constraint requiring that a normalized eigenvector corresponding to the minimum eigenvalue of the covariance matrix and a renewal vector for distortion determination are orthogonal, with the renewal vector for distortion determination being a three-dimensional vector having the old offset as a starting point and having the coordinates indicated by the center point of the first spherical surface as an end point, and the second constraint requiring that an inner product of the distortion estimation matrix and the eigenvector be a zero vector.

25. An offset updating method for use in a geomagnetic field measurement device having a three-dimensional magnetic sensor that measures respective magnetic components of three directions and a storage device that stores, as pieces of vector data expressed in a three-axis coordinate system, pieces of magnetic data sequentially output from the three-dimensional magnetic sensor, the method comprising:

calculating, based on a three-dimensional error indicating errors between plural sets of coordinates indicated by the plural pieces of magnetic data stored in the storage device and a surface of a three-dimensional figure having a distorted shape different from a first spherical surface, a distortion estimation value indicating a degree of difference in shape between the three-dimensional figure and the first spherical surface, the three-dimensional figure being defined so that plural sets of coordinates indicated by the plural pieces of magnetic data are distributed adjacent to the surface of the three-dimensional figure;

determining whether there is distortion in a shape of the three-dimensional figure based on the distortion estimation value; and updating an offset for correcting each of the plural pieces of the magnetic data in a case in which it is determined that there is no distortion, wherein the three-dimensional error is a sum of a first spherical surface error and a component representing distortion that is obtained by substituting a first vector into a function, the first vector being expressed based on a set of coordinates indicated by a reference point and magnetic data and the function being expressed with a three variable quadratic form having a distortion estimation matrix as a coefficient matrix, and wherein the first spherical surface error represents an error between a set of coordinates indicated by each of the plural pieces of magnetic data and the first spherical surface.

26. A non-transitory computer-readable recording medium having recorded thereon a computer program that causes a processor in a geomagnetic field measurement device having a three-dimensional magnetic sensor that measures respective magnetic components of three directions and a storage device that stores, as pieces of vector data expressed in a three-axis coordinate system, pieces of magnetic data sequentially output from the three-dimensional magnetic sensor to execute:

a process of calculating, based on a three-dimensional error indicating errors between plural sets of coordinates indicated by the plural pieces of magnetic data stored in the storage device and a surface of a three-dimensional figure having a distorted shape different from a first spherical surface, a distortion estimation value indicating a degree of difference in shape between the three-dimensional figure and the first spherical surface, the three-dimensional figure being defined so that plural sets of coordinates indicated by the plural pieces of magnetic data are distributed adjacent to the surface of the three-dimensional figure;

a process of determining whether there is distortion in a shape of the three-dimensional figure based on the distortion estimation value; and a process of updating an offset for correcting each of the plural pieces of the magnetic data in a case in which it is determined that there is no distortion, wherein the three-dimensional error is a sum of a first spherical surface error and a component representing distortion that is obtained by substituting a first vector into a function, the first vector being expressed based on a set of coordinates indicated by a reference point and magnetic data and the function being expressed with a three variable quadratic form having a distortion estimation matrix as a coefficient matrix, and wherein the first spherical surface error represents an error between a set of coordinates indicated by each of the plural pieces of magnetic data and the first spherical surface.

* * * * *